(12) United States Patent
Matsuda

(10) Patent No.: US 8,494,320 B2
(45) Date of Patent: Jul. 23, 2013

(54) OPTICAL ELEMENT AND METHOD FOR MANUFACTURING THE SAME

(75) Inventor: Manabu Matsuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 133 days.

(21) Appl. No.: 13/230,504

(22) Filed: Sep. 12, 2011

(65) Prior Publication Data
US 2012/0002285 A1    Jan. 5, 2012

Related U.S. Application Data

(63) Continuation of application No. PCT/JP2009/056536, filed on Mar. 30, 2009.

(51) Int. Cl.
*G02B 6/00* (2006.01)
*G02B 6/34* (2006.01)

(52) U.S. Cl.
USPC ............................. 385/37; 385/147; 257/80

(58) Field of Classification Search
USPC .. 385/10, 31, 37, 39; 372/50.11, 102; 257/80, 257/184, 81, E31.002, E31.032, E33.005, 257/E33.006
See application file for complete search history.

(56) References Cited

U.S. PATENT DOCUMENTS

| | | | |
|---|---|---|---|
| 5,170,402 A | | 12/1992 | Ogita et al. |
| 5,459,747 A | * | 10/1995 | Takiguchi et al. ......... 372/50.11 |
| 5,659,562 A | | 8/1997 | Hisa et al. |
| 5,991,322 A | * | 11/1999 | Takiguchi et al. ......... 372/50.11 |
| 6,944,373 B2 | * | 9/2005 | Nesnidal et al. ................. 385/37 |
| 7,574,083 B2 | * | 8/2009 | Matsuda .......................... 385/37 |
| 7,852,897 B2 | * | 12/2010 | Kato .......................... 372/50.121 |
| 7,899,283 B2 | * | 3/2011 | Matsuda et al. ................. 385/37 |
| 8,319,229 B2 | * | 11/2012 | Yamamoto et al. ............. 257/80 |
| 2003/0152126 A1 | | 8/2003 | Okunuki |
| 2006/0050752 A1 | * | 3/2006 | Nunoya et al. ............. 372/43.01 |
| 2007/0133648 A1 | * | 6/2007 | Matsuda et al. ............... 372/102 |
| 2008/0199131 A1 | * | 8/2008 | Matsuda .......................... 385/37 |
| 2008/0291952 A1 | * | 11/2008 | Yamamoto et al. ............. 372/26 |

FOREIGN PATENT DOCUMENTS

| | | |
|---|---|---|
| JP | 2-069983 A | 3/1990 |
| JP | 5-082888 A | 4/1993 |
| JP | 8-255954 A | 10/1996 |
| JP | 2966485 B2 | 8/1999 |
| JP | 2000-269587 A | 9/2000 |
| JP | 2003-234540 A | 8/2003 |
| JP | 2004-063505 A | 2/2004 |
| JP | 2004-356571 A | 12/2004 |

OTHER PUBLICATIONS

International Search Report of PCT/JP2009/056536, mailing date Jun. 2, 2009.

(Continued)

*Primary Examiner* — Akm Enayet Ullah
(74) *Attorney, Agent, or Firm* — Westerman, Hattori, Daniels & Adrian, LLP

(57) ABSTRACT

An optical device includes: an optical waveguide; and a plurality of diffraction grating layers, provided along the optical waveguide, each including a diffraction grating defined by a discontinuous first semiconductor layer and a second semiconductor layer having a refractive index different from a refractive index of the first semiconductor layer and burying the first semiconductor layer, one diffraction grating layer of the plurality of diffraction grating layers including a third semiconductor layer being continuous with the diffraction grating and made from a material different from materials of the first and the second semiconductor layers.

20 Claims, 29 Drawing Sheets

OTHER PUBLICATIONS

Kotaki, Y. et al., "MQW-DFB Laser with Nonuniform-Depth Grating," Extended Abstracts of the 38th Spring Meeting of Japan Society of Applied Physics, 1991, p. 29p-D-7.

Matsusa, Manabu et al., "Reactively Ion Etched Nonuniform-Depth Grating for Advanced DFB Lasers," 3rd International Conference of Indium Phosphide and Related Materials, 1991, p. 256-259.

Morthier, G. et al., "A New DFB-Laser Diode With Reduced Spatial Hole Burning," IEEE Photonics Technology Letters, Jun. 1990, p. 388-390, vol. 2.

Ogita, S. et al., "FM Response of Narrow-Linewidth, Multielectrode I/4 Shift DFB Laser," IEEE Photonics Technology Letters, Mar. 1990, p. 165-166. vol. 2.

Ohashi, M. et al., "Mode Analysis of DFB Laser Diodes with Nonuniform Coupling Coefficients," Extended Abstracts of the 50th Fall Meeting of Japan Society of Applied Physics, 1989, p. 30p-ZG-13.

Shoji H. et al., "Theoretical Analysis of I/4-Shifted DFB Lasers with Nonuniform-Depth Grating," Extended Abstracts of the 52nd Fall Meeting of Japan Society of Applied Physics, 1991, p. 10p-ZM-17.

* cited by examiner

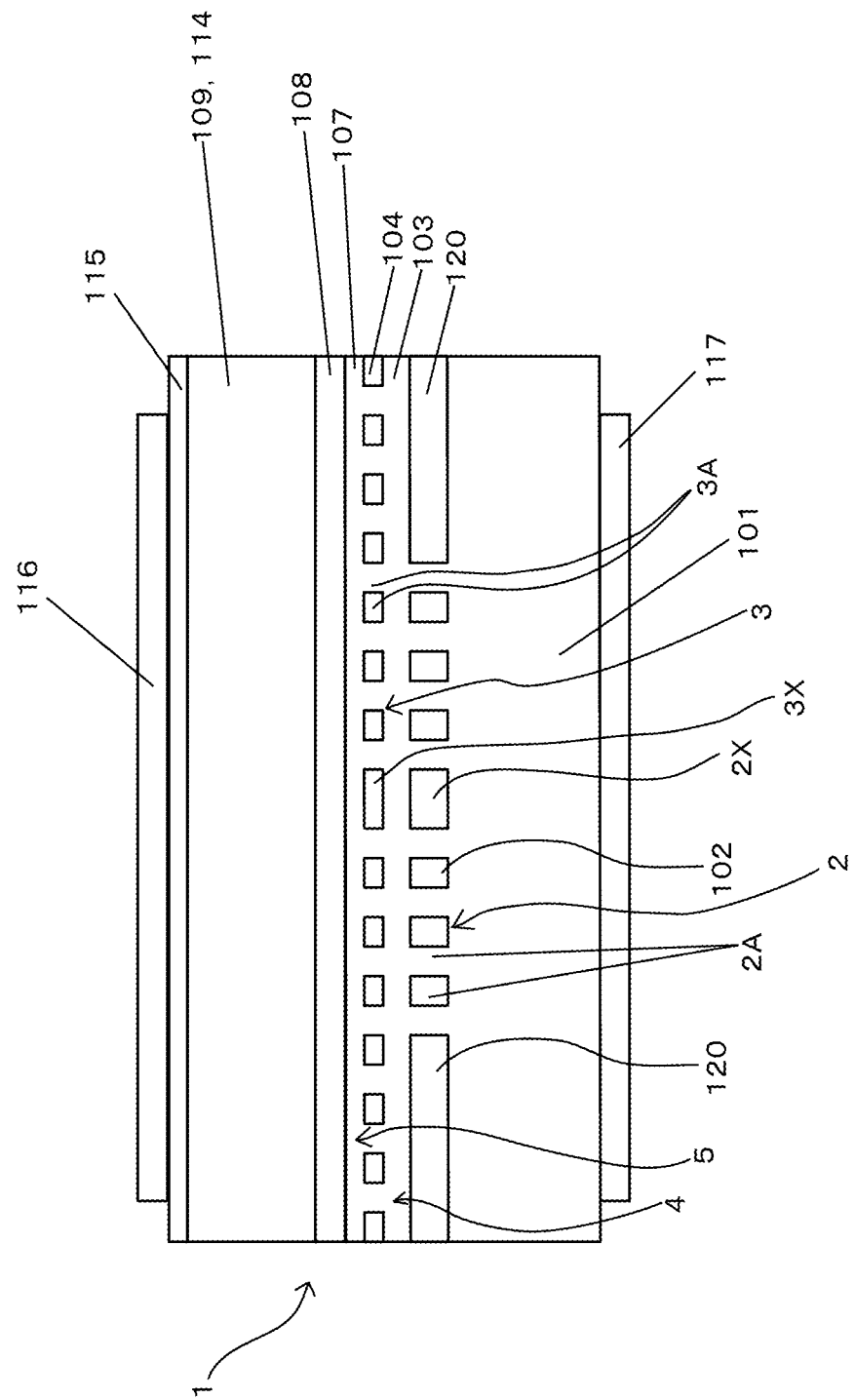

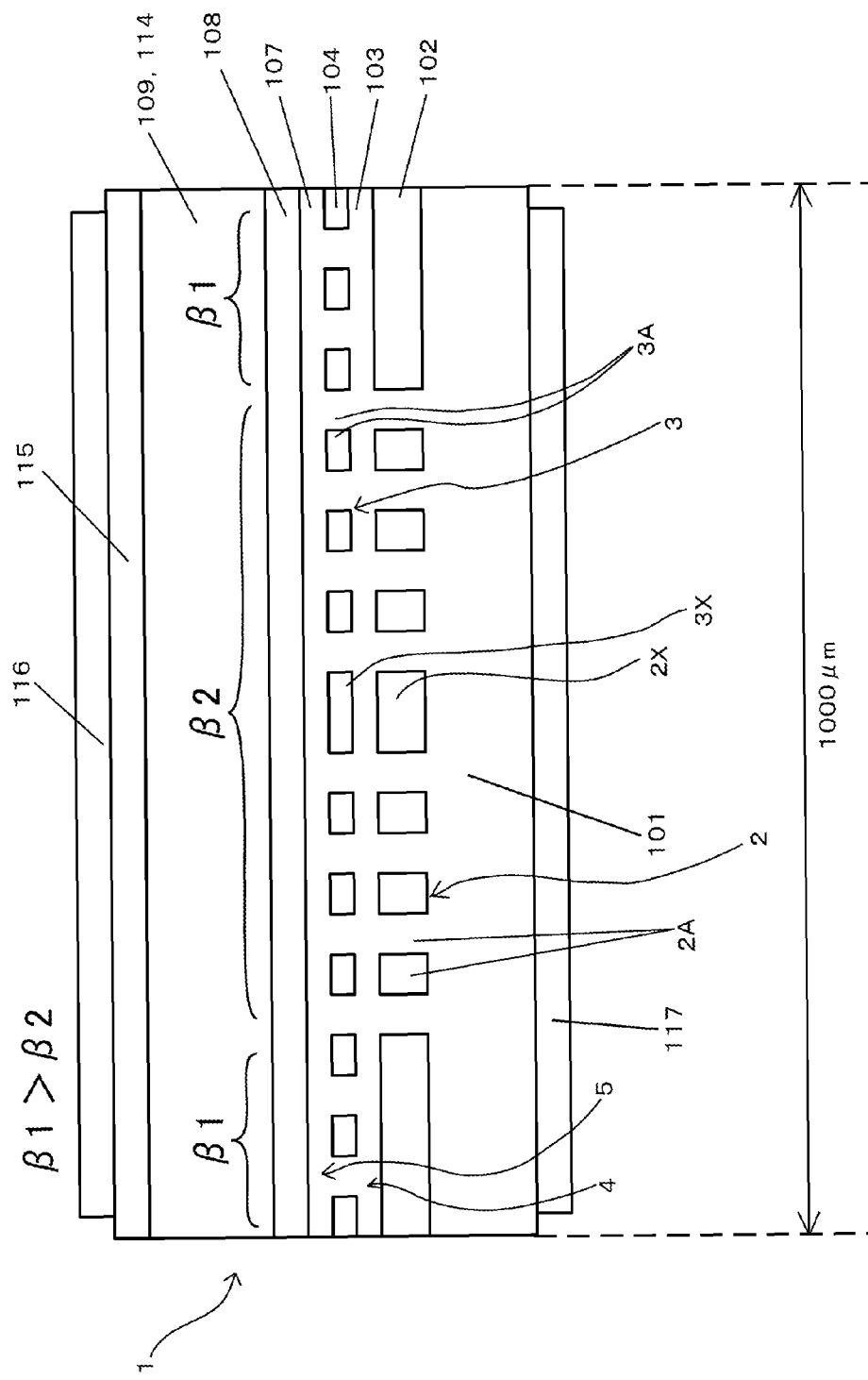

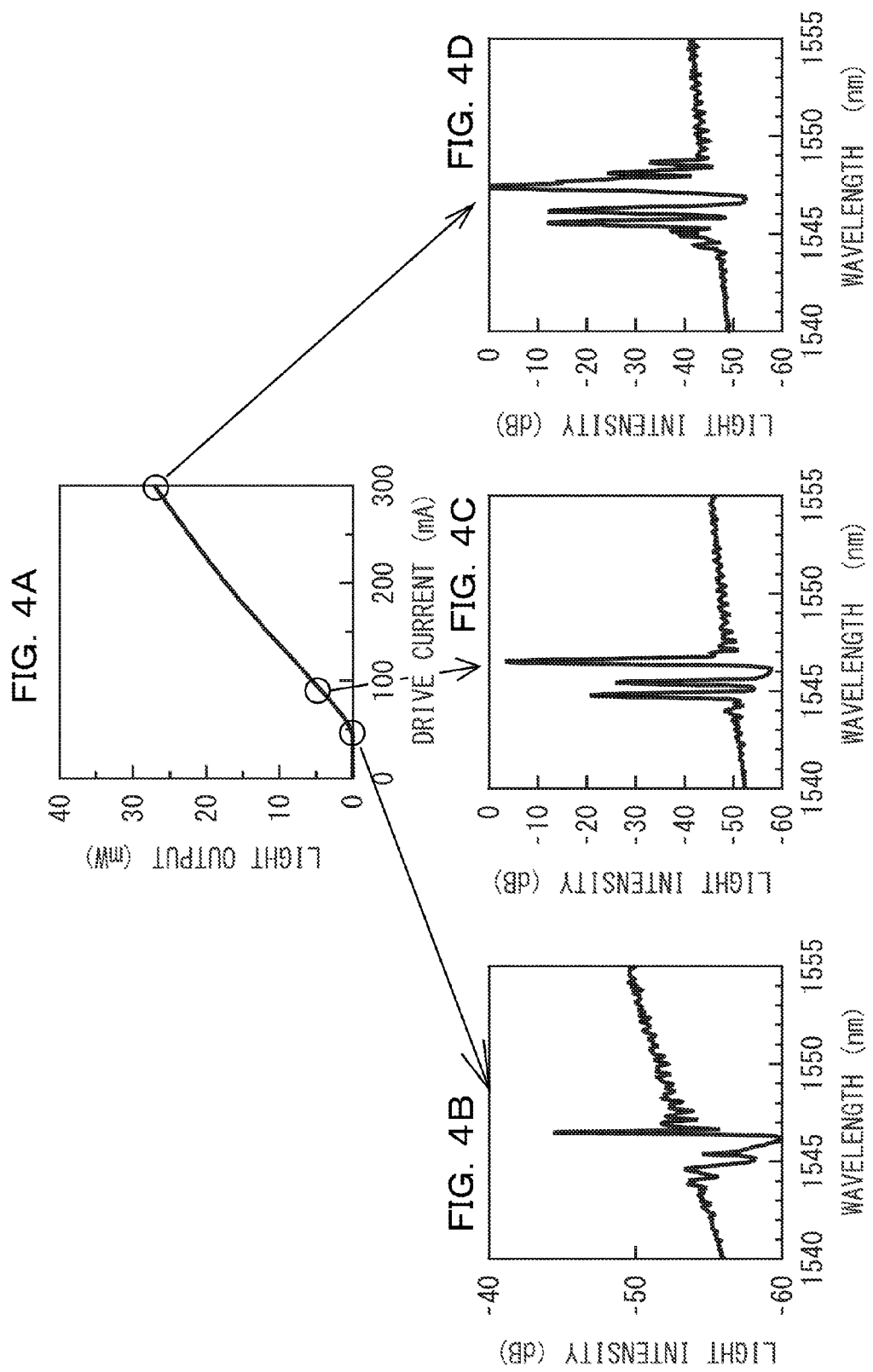

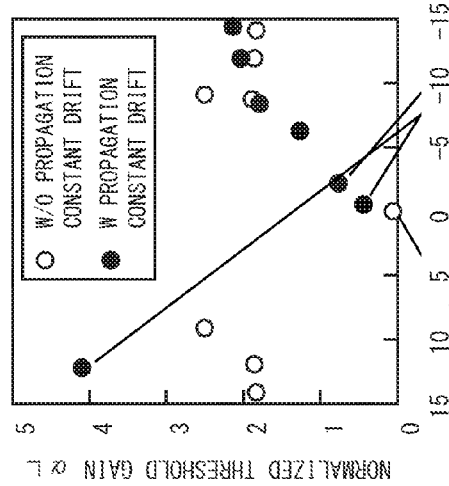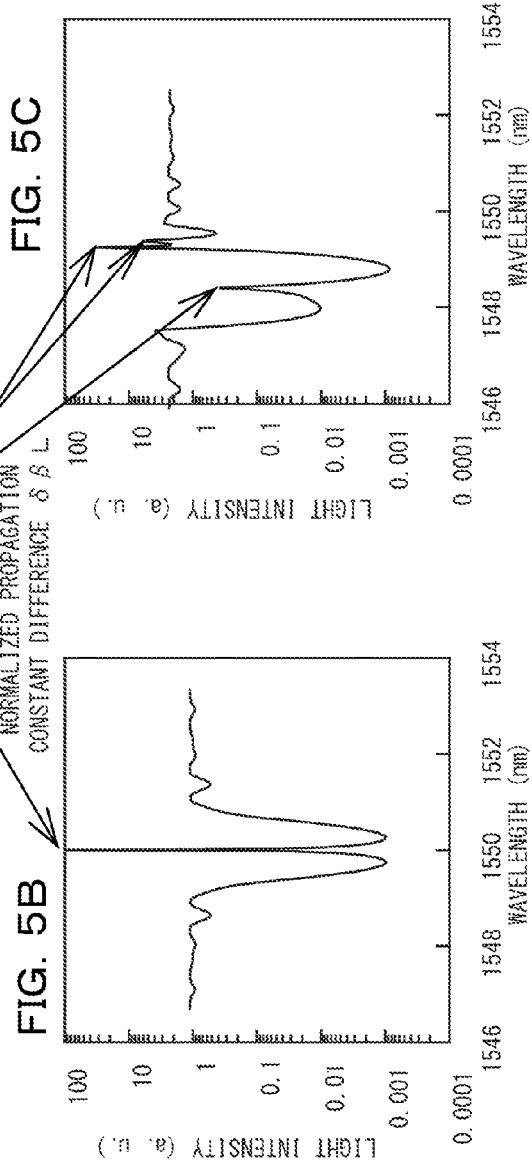

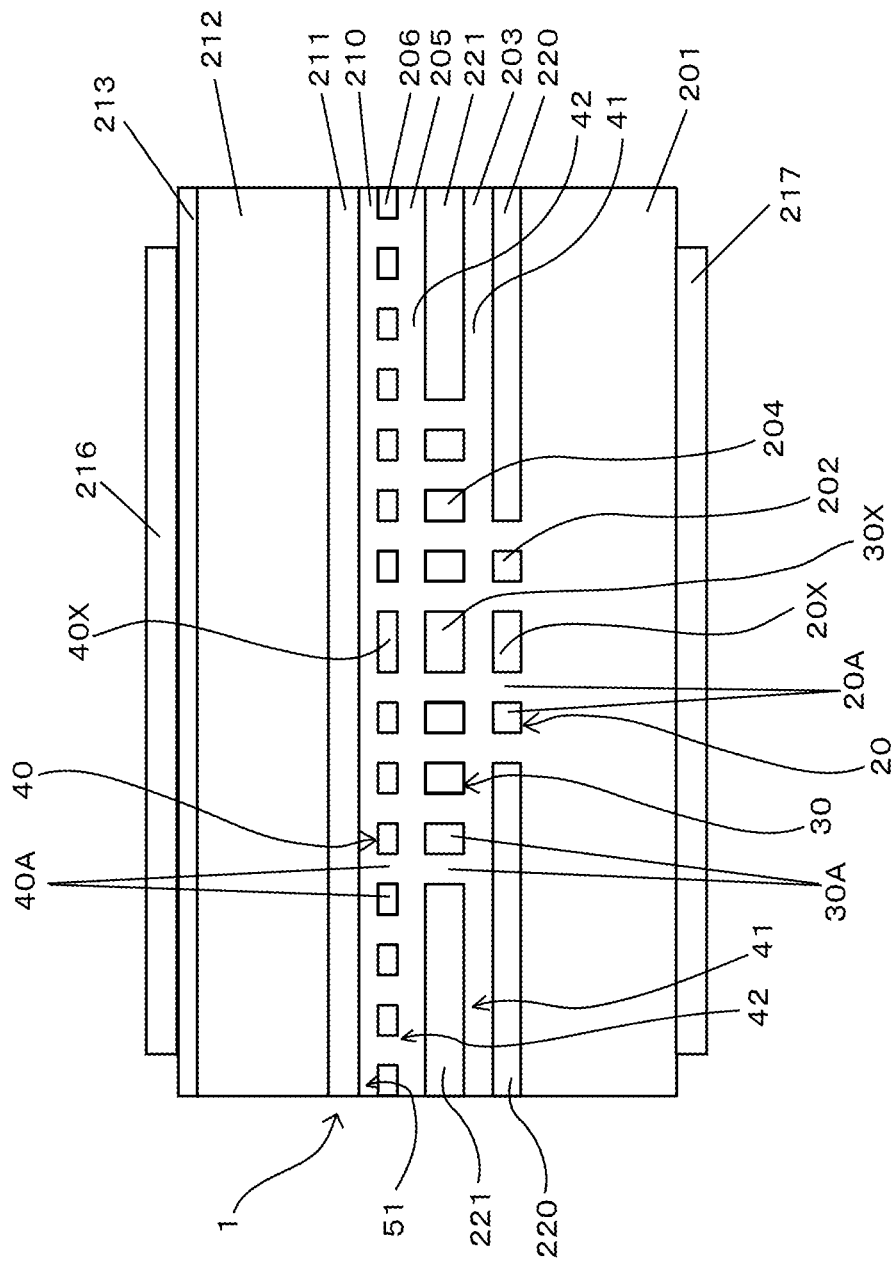

OPTICAL ELEMENT AND METHOD FOR MANUFACTURING THE SAME

CROSS-REFERENCE TO RELATED APPLICATION

This application is a continuation application of a PCT international application No. PCT/JP2009/056536, filed on Mar. 30, 2009 in Japan, the entire contents of which are incorporated by reference.

FIELD

The embodiments discussed herein are related to a waveguide optical device having a buried diffraction grating and a method for manufacturing the same.

BACKGROUND

One type of a waveguide optical device having a buried diffraction grating includes a DFB laser made from compound semiconductors, for example.

in recent years, there are techniques to improve the laser characteristics of a DFB laser by varying the coupling coefficient, which determines the amount of feedback of a diffraction grating, along the direction of a cavity.

For example, there is technique to improve the stability of the longitudinal mode upon a higher power optical output, by reducing the coupling coefficient toward the center of the cavity, thereby reducing the spatial hole burning along the cavity.

There are other techniques to prevent occurrence of the spatial hole burning. For example, there is a technique to gradually reduce the width of the buried diffraction grating toward the center of the cavity. Furthermore, there is a technique to gradually reduce the height of the buried diffraction grating toward the center of the cavity.

in addition, there is a technique to increase the threshold gain difference or the gain difference between the main and side modes, using a structure wherein the coupling coefficient is increased at the center of the cavity but is reduced at ends, as compared to the center.

Furthermore, there are a techniques to narrow the spectral line width by increasing the length of the cavity, when a DEB laser is used as an FM modulation light source, by dividing the drive electrode into three parts along the direction of the cavity, and modulating the injection current of the center electrode.

There is a technique to improve sensitivity of a DFB laser against a light backward to a laser. In a DFB laser having upper and lower buried diffraction gratings with an active layer sandwiched therebetween, one of the buried diffraction grating is provided in the vicinity of the front end face of the laser so as to reflect reflected returning light of the laser light from the outside. In the structure having the buried diffraction gratings above and below the active layer, a precise fabrication while synchronizing the phases of the upper and lower diffraction gratings is difficult.

SUMMARY

Accordingly, an optical device includes: an optical waveguide; and a plurality of diffraction grating layers, provided along the optical waveguide, each including a diffraction grating defined by a discontinuous first semiconductor layer and a second semiconductor layer having a refractive index different from a refractive index of the first semiconductor layer and burying the first semiconductor layer, one diffraction grating layer of the plurality of diffraction grating layers including a third semiconductor layer being continuous with the diffraction grating and made from a material different from materials of the first and the second semiconductor layers.

Furthermore, an optical device includes: an optical waveguide; a plurality of diffraction grating layers, provided along the optical waveguide, each including a diffraction grating defined by a discontinuous first semiconductor layer and a second semiconductor layer having a refractive index different from a refractive index of the first semiconductor layer and burying the first semiconductor layer, one diffraction grating layer of the plurality of diffraction grating layers including the first semiconductor layer extending being continuous with the diffraction grating; a first region including the optical waveguide and the diffraction grating included in the one diffraction grating layer; and a second region including the optical waveguide and the first semiconductor layer being continuous with the diffraction grating, wherein the first region and the second region have different widths.

Furthermore, a method for manufacturing an optical device, includes: stacking a first layer and a different layer, the different layer being continuous with the first layer and made from a material different from a material of the first layer, and a second layer, sequentially, over a substrate; forming one mask having a diffraction grating pattern over a surface; transferring the diffraction grating pattern to the second layer by etching using the one mask, forming another mask so as to cover a surface of a partial region of the one mask; transferring the diffraction grating pattern to the first layer by etching using the one and the other masks, removing the one and the other masks; and forming a plurality of diffraction grating layers by burying with a buried layer.

Furthermore, a method for manufacturing an optical device, includes: stacking a first layer and a second layer sequentially over a substrate; forming one mask having a diffraction grating pattern over a surface; transferring the diffraction grating pattern to the second layer by etching using the one mask, forming another mask so as to cover a surface of a partial region of the one mask; transferring the diffraction grating pattern to the first layer by etching using the one and the other masks, removing the one and the other masks; forming a plurality of diffraction grating layers by burying with a buried layer; and etching to form a mesa stripe shape such that a region of the first layer including a portion to which the diffraction grating pattern is transferred and a remaining region of the first layer including a portion to which the diffraction grating pattern is not transferred has different widths.

The objects and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 1 is a schematic cross-sectional view illustrating a structure of an optical device (DFB laser) according to a first embodiment;

FIG. 2 is a schematic cross-sectional view illustrating issues to be addressed by the present embodiment;

FIGS. 4A-4D are diagrams illustrating issues to be addressed by the present embodiment;

FIGS. 5A-5C are diagrams illustrating issues to be addressed by the present embodiment;

FIG. 18 is a schematic cross-sectional view illustrating another exemplary structure of an optical device (DFB laser) according to the second embodiment;

DESCRIPTION OF EMBODIMENTS

Figures 3A, 3B, 3C:
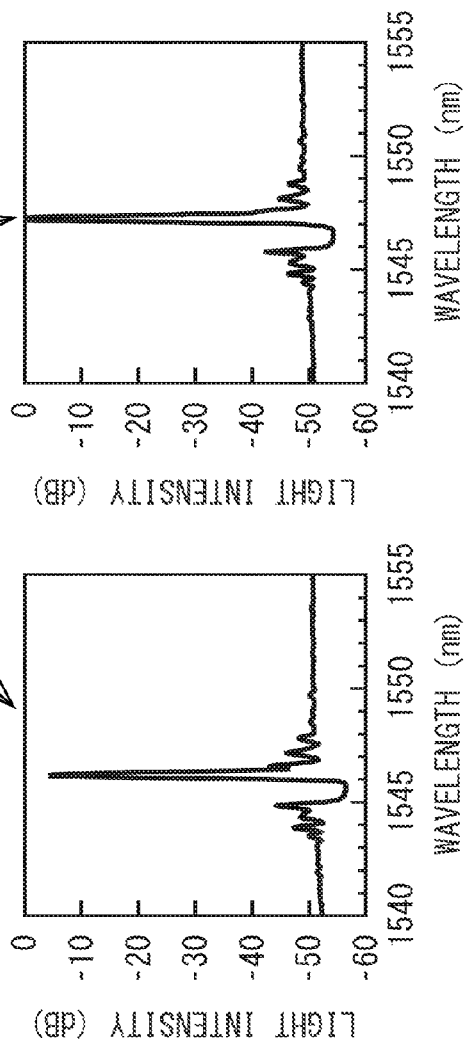
FIGS. 3A-3C are diagrams illustrating issues to be addressed by the present embodiment.

When varying the coupling coefficient of the diffraction grating with the cavity, in order to improve the device characteristics, it is required to increase the difference in the coupling coefficient between a region with an increased coupling coefficient and a region with a reduced coupling coefficient (the contrast of the coupling coefficient is required to be increased).

However, for increasing the coupling coefficient difference between the increased coupling coefficient region and the reduced coupling coefficient region, by using a corrugated diffraction grating that is fabricated by forming grooves on the surface of an InP substrate and burying them with a semiconductor layer, formation of quite shallow diffraction grating is necessary at the reduced coupling coefficient region.

Since precise fabrication of such very shallow diffraction grating is difficult, the variation in the coupling coefficient may occur, resulting in deviation in the device characteristics (i.e., the threshold current of the laser, in this case). Additionally, the yield is low.

In addition, if the width of the buried diffraction grating is varied, the width of the diffraction grating in the region with the largest coupling coefficient is set to the half of the period of the diffraction grating (a duty ratio of 50%), and the diffraction grating in the reduced coupling coefficient region is formed by widening (greater than a duty ratio of 50%) or narrowing (smaller than a duty ratio of 50%) the width of the diffraction grating.

However, for increasing the coupling coefficient difference between the increased and reduced coupling coefficient regions, the width of diffraction grating in the reduced coupling coefficient region is required to be widened or narrowed significantly.

For significantly increasing the width of the diffraction grating, the size of openings forming in a mask for forming the diffraction grating is reduced significantly, and formation of the diffraction grating by etching becomes difficult. On the other hand, for significantly reducing the width of the diffraction grating, the width of an etching mask should also be reduced significantly, making stable and precise formation of a mask with a very narrow width [the duty ratio of several percents (%)] difficult. Supposing formation of the diffraction grating with a very narrow width would be possible, oftentimes, the diffraction grating with the very narrow width may disappear after buried, making stable fabrication of a buried diffraction grating difficult. Naturally, the yield is low.

in view of the above issues, in an optical device having a structure wherein the coupling coefficient of the diffraction grating is varied within the cavity, it is desirable to fabricate the diffraction gratings precisely and stably, thereby improving the yield, as well as improving the device characteristics.

Hereinafter, an optical device and a method for manufacturing the same according to embodiments will be described with reference to the drawings.

[First Embodiment]

An optical device and a method for manufacturing the same according to a first embodiment will be described with reference to FIGS. 1-10B.

The optical device according to this embodiment is a distributed feed-back (DFB) laser (laser device; waveguide optical device; active optical device; light emitting device) having a structure wherein the coupling coefficient of diffraction grating is varied (distributed) within the cavity, for example, and includes an optical waveguide 1 and a plurality of (two, in this example) diffraction grating layers 2 and 3 provided along the optical waveguide 1, as depicted in FIG. 1.

As depicted in FIG. 1, the first diffraction grating layer 2 and the second diffraction grating layer 3 are provided as a plurality of diffraction grating layers, and the diffraction grating layers 2 and 3 are provided under the optical waveguide 1 (the substrate side with respect to the optical waveguide 1; one side of the optical waveguide 1). Note that the diffraction grating layers 2 and 3 are disposed in the vicinity of the optical waveguide 1.

The diffraction grating layers 2 and 3 include diffraction gratings (buried diffraction gratings; buried-type diffraction grating) 2A and 3A having discontinuous semiconductor layers (first semiconductor layers) 102 and 104, and other semiconductor layers (second semiconductor layers) 103 and 107 burying the first semiconductor layers 102 and 104, respectively, as depicted in FIG. 1. Here, the first semiconductor layers 102 and 104 have a refractive index different from that of the second semiconductor layers 103 and 107. Here, the diffraction gratings 2A and 3A are respectively configured to include phase shifts 2X and 3X (here, $\lambda/4$ phase shift).

The diffraction gratings 2A and 3A in the diffraction grating layers 2 and 3 are provided to overlap each other, and the diffraction gratings 2A and 3A at an overlap region (a corresponding region) have substantially the same (including the same) phase, period, and duty ratio. Here, the term "duty ratio" means the ratio of the remained portion after etching with respect to the period of the diffraction grating. Note that, in this embodiment, the duty ratio of each of the diffraction gratings 2A and 3A provided in the diffraction grating layers 2 and 3 constant.

In this embodiment, as depicted in FIG. 1, the diffraction grating 2A in the first diffraction grating layer 2 is provided only at the center region in the direction along the optical waveguide 1 (the direction of the length of the cavity). In other words, the region of the first diffraction grating layer 2 where the diffraction grating 2A is provided, is the center region in the direction along the optical waveguide 1.

in addition, as depicted in FIG. 1, the diffraction grating 3A in the second diffraction grating layer 3 is formed along the entire length of the direction along the optical waveguide 1. In other words, the region where the diffraction grating 3A in the second diffraction grating layer 3 is provided, is the entire region of the direction along the optical waveguide 1.

Thus, in this embodiment, the length of the region of the first diffraction grating layer 2 where the diffraction grating 2A is provided in the direction along the optical waveguide 1, is shorter than the length of the region of the second diffraction grating layer 3 where the diffraction grating 3A provided in the direction along the optical waveguide 1. The lengths of the regions where the diffraction gratings 2A and 3A are provided, are different between the first diffraction grating layer 2 and the second diffraction grating layer 3. In this case, the overlap region of the diffraction grating layers 2 and 3 is the center region in the direction along the optical waveguide 1.

Note that, although two diffraction grating layers 2 and 3 are provided as a plurality of diffraction grating layers and the lengths of the regions of the diffraction grating layers 2 and 3 where the diffraction gratings 2A and 3A are provided, are different from each other, these are not limiting. For example, a third diffraction grating layer may be added for increasing the coupling coefficient at the center region in the direction along the optical waveguide 1. Here, the length of the region of the third diffraction grating layer where the diffraction grating is provided in the direction along the optical waveguide 1 is the same as that of the first diffraction grating layer 2. Thus, it is suffice that the plurality of diffraction grating layers include at least two diffraction grating layers being different from each other in terms of the length of the region where the diffraction grating is provided.

As described above, in this embodiment, using buried diffraction gratings, a plurality of diffraction grating layers including region where a buried diffraction grating is provided, are stacked. At the region where maximizing the coupling coefficient is desired, a buried diffraction grating is provided in all of the stacked diffraction grating layers (two layers, i.e., the first diffraction grating layer 2 and the second diffraction grating layer 3, in this example). At the region where a reduced coupling coefficient is desired, a diffraction grating is provided only in a part of the stacked diffraction grating layers (the second diffraction grating layer 3, in this example).

More specifically, as depicted in FIG. 1, the second diffraction grating layer 3 is stacked over the first diffraction grating layer 2, and the diffraction gratings 2A and 3A in the diffraction grating layers 2 and 3 are stacked at the center region in the direction along the optical waveguide 1. In other words, the number of stacked diffraction gratings is varied in the direction along the optical waveguide 1. As a result, the coupling coefficient at the center region in the direction along the optical waveguide 1 is increased, whereas the coupling coefficient is decreased at the remaining region (closer end regions) as compared to the center region.

The DFB laser (optical semiconductor device) in accordance with the specific exemplary configuration of this embodiment is a DFB laser oscillating at the 1.55 μm wavelength band. As depicted in FIG. 1, this DFB laser includes, over an n-doped InP substrate 101, the first diffraction grating layer 2, the second diffraction grating layer 3, and the optical waveguide 1 including a quantum well active layer 108 as the waveguide core layer. The first diffraction grating layer 2 includes the buried diffraction grating 2A, which is formed by burying an n-doped GaInAsP layer [e.g., with a composition wavelength of about 1.25 μm ($Ga_{0.251}In_{0.749}As_{0.543}P_{0.457}$ layer) and a thickness of about 25 nm] 102, which is discontinuous at the center region, with an n-doped InP layer (e.g., with a thickness of about 15 nm; burying layer) 103, wherein the n-doped GaInAsP layer 102 and the n-doped InP layer 103 have different refractive indices. The second diffraction grating layer 3 includes the buried diffraction grating 3A, which is formed by burying an n-doped GaInAsP layer [e.g., with a composition wavelength of about 1.15 μm ($Ga_{0.182}In_{0.818}As_{0.397}P_{0.603}$ layer) and a thickness of about 20 nm] 104, which is discontinuous at the entire region, with an n-doped InP layer 107, wherein the n-doped GaInAsP layer 104 and the n-doped InP layer 107 have different refractive indices.

As described above, in the specific exemplary configuration of this embodiment, the diffraction grating 2A in the first diffraction grating layer 2 is defined by the n-doped GaInAsP layer 102 having a composition wavelength of about 1.25 μm and the n-doped InP layer 103, and then the diffraction grating 3A in the second diffraction grating layer 3 is defined by the n-doped GaInAsP layer 104 having a composition wavelength of about 1.15 μm and the n-doped InP layer 107, so that the refractive index difference between the semiconductor layers 102 and 103 constituting the diffraction grating 2A in the first diffraction grating layer 2 becomes greater than the refractive index difference between the semiconductor layers 104 and 107 constituting the diffraction grating 3A in the second diffraction grating layer 3. In other words, the coupling coefficient difference between the increased and reduced coupling coefficient regions is increased by increasing the coupling coefficient without increasing the thickness of the first diffraction grating layer 2.

More specifically, the portions of the n-type InP burying layer 103 burying between the discontinuous n-type GaInAsP layer 102 constitute the diffraction grating 2A, and the portions of the n-type InP burying layer 107 burying between the discontinuous n-type GaInAsP layer 104 constitute the diffraction grating 3A.

Note that the portion of the n-type InP burying layer 103 formed over the n-type GaInAsP layer 102 constitutes a spacer layer (intermediate layer) 4 between the first diffraction grating layer 2 and the second diffraction grating layer 3, and the portion of the n-type InP burying layer 107 formed over the n-type GaInAsP layer 104 constitutes a spacer layer (cladding layer) 5 between the second diffraction grating layer 3 and the active layer 108. Note that minimizing the thickness of the spacer layer 4 is preferred, as long as the variation of an etching depth can be permissible.

In addition, in the specific exemplary configuration of this embodiment, the thickness of the n-doped GaInAsP layer 102 constituting the diffraction grating 2A in the first diffraction grating layer 2 is about 25 nm, and the thickness of the n-doped GaInAsP layer 104 constituting the diffraction grating 3A in the second diffraction grating layer 3 is about 20 nm, so that the first diffraction grating layer 2 and the second diffraction grating layer 3 have different thicknesses.

Furthermore, the refractive index difference between the semiconductor layers 102 and 103 constituting the diffraction grating 2A in the first diffraction grating layer 2 is made greater than the refractive index difference between the semiconductor layers 104 and 107 constituting the diffraction grating 3A in the second diffraction grating layer 3, so that the first diffraction grating layer 2 and the second diffraction grating layer 3 have different refractive index differences.

Therefore, in the first diffraction grating layer 2 and the second diffraction grating layer 3, although the diffraction gratings 2A and 3A have substantially the same duty ratio, the coupling coefficients of the diffraction gratings 2A and 3A are different from each other.

In this manner, according to the configuration of this embodiment, since the contrast of the coupling coefficient can be increased by stacking the plurality of diffraction grating layers 2 and 3, devices satisfying desired needs can be achieved, with improved the device characteristics.

Unlike this embodiment, one may attempt to increase the contrast of the coupling coefficient simply by using a surface diffraction grating (i.e., a diffraction grating that is made by forming grooves on a substrate surface and then burying a semiconductor layer therebetween, or a diffraction grating which is formed by forming grooves on a surface of one semiconductor layer and then burying another semiconductor layer therebetween), without using a stack of the diffraction grating layers, for example. In such a case, since, a depth of a diffraction grating in the increased coupling coefficient region should be made to a depth of about 17 nm while a depth of a diffraction grating in the reduced coupling coefficient region should be made to a depth of about 7 nm. In such a case, the coupling coefficient value may deviate by about 4 $cm^{-1}$ even when the depth of the diffraction grating in each of the increased and reduced coupling coefficient regions deviates only by about 1 nm.

That is to say, if one attempts to form such a diffraction grating by a reactive ion etching using a mixed gas of ethane and hydrogen, for example, the time duration for etching about 7 nm becomes quite short, about 7.6 seconds, according to an etch rate of about 55 nm/min, reported by M. Matsuda et al., "Reactively Ion Etched Nonuniform-Depth Grating for Advanced DFB Lasers", 3rd international Conference on Indium Phosphide and Related Materials, Apr. 8-11, 1991, TuF.4, the entire content of which is incorporated herein by reference. However, controlling the variation of the time duration for generating the etching plasma, and the off timing of the high-frequency switch in the order of 0.1 second are almost impossible.

Thus, the deviation of an approximately ±1 second of the etch duration may be assumed, which causes the variation of the etching depth of about ±1 nm, in this case, resulting in the variation of the coupling coefficient of about ±4 $cm^{-1}$.

Assuming this processing precision in this hypothetical example, if the coupling coefficient within the entire cavity varies deviates to become smaller, the threshold gain is increased to about 1.4 times of the threshold gain without any deviation, causing an increase in the threshold current of the laser.

in contrast, according to this embodiment, since the contrast of the coupling coefficient can be increased by stacking the plurality of diffraction grating layers 2 and 3, any significant reduction in the depth (thickness) of the diffraction gratings is not required for increasing the contrast of the coupling coefficient. Thus, an increase in the threshold current of the laser can be reduced by setting the thicknesses of the diffraction gratings so that the variation of the coupling coefficient falls within the allowable range.

Furthermore, if one attempts to increase the contrast of the coupling coefficient solely with a surface diffraction grating, for example, since very deep grooves and very shallow grooves are buried with a burying layer, a flat surface cannot be obtained without increasing the thickness of the burying layer. However, a thicker burying layer cannot provide a desired coupling coefficient.

In contrast, according to this embodiment, since the contrast of the coupling coefficient can be increased by stacking the plurality of diffraction grating layers 2 and 3, an increased contrast of the coupling coefficient is obtained without burying very deep grooves and very shallow grooves with a burying layer. Accordingly, a flat surface can be obtained with a thinner burying layer, and thus a desired coupling coefficient can be achieved.

In addition, since this embodiment employs the buried diffraction gratings 2 and 3 formed by burying the discontinuous GaInAsP layers 102 and 104 with the InP layers 103 and 107, respectively, the diffraction grating can be precisely and stably fabricated and the yield can be improved.

Firstly, with regard to a surface diffraction grating, a precise control of the coupling coefficient is difficult since the depth of the diffraction grating is determined by the timing to stop the etching at some midpoint of the substrate or the semiconductor layer.

In contrast, with regard to a buried diffraction grating formed by burying a discontinuous first semiconductor layer with a second semiconductor layer, it is only necessary that the etching to divide the first semiconductor layer is stopped at the timing when the entire first semiconductor layer is removed and an underlying semiconductor layer is removed to some midpoint thereof. Any variation in the etching depth is compensated by burying with a second semiconductor layer made from the same semiconductor material as the underlying semiconductor layer. Since, in this case, the depth of the diffraction grating is determined by the thickness of the first semiconductor layer, the coupling coefficient can be precisely controlled and the yield can be improved.

Secondly, typically, in case of a surface diffraction grating, since grooves are formed on the surface of the InP substrate and then the GaInAsP layer which is quaternary mixed crystal is grown thereon, compositional modulation and a crystal defect tend to be increased as the depth of the diffraction grating increases. Furthermore, the grooves formed on the InP substrate may deform due to mass transport when exposed to an elevated temperature during the crystal growth. As a result of those, it becomes difficult to obtain a coupling coefficient according to the design.

Furthermore, since a deeper diffraction grating is unrealistic, for obtaining a higher coupling coefficient, a quaternary mixed crystal semiconductor layer is required which provide a refractive index difference between InP as great as possible. In such a case, when a semiconductor material having a composition longer than a composition wavelength of about 1.3 µm is used, light absorption is increased, resulting in deterioration of the laser characteristics.

In contrast, with regard to the buried diffraction gratings 2 and 3 formed by burying the discontinuous GaInAsP layers 102 and 104 with the InP layer (burying layer) 103 and 107, since the GaInAsP quaternary mixed crystal layer is buried with the InP buried layer, substantially no deformation of the discontinuous GaInAsP layers 102 and 104 occurs.

Furthermore, unlike a surface diffraction grating, no compositional modulation (refractive index modulation) occurs even if the grooves formed in the GaInAsP layers 102 and 104 are deep since they are buried with the InP buried layers 103 and 107.

For the above reasons, the designed coupling coefficient can be obtained, and the yield can be improved. In addition, since the contrast of the coupling coefficient can be increased by stacking the plurality of diffraction grating layers 2 and 3, no significant increase in the depth of the grooves formed in the GaInAsP layer is required for increasing the contrast of the coupling coefficient. Therefore, a crystal defect is unlikely to occur. Furthermore, no deterioration of the laser characteristics occurs since no a material having a significantly greater refractive index difference between InP is required.

In addition, since diffraction grating can be formed without any deformation of the diffraction grating, compositional modulation, crystal defect, or the like, a desired coupling coefficient can be obtained even with a thicker buried layer of about 50 nm or greater, and the surface of the burying layer 107 can be flat so as to have a satisfactorily crystallinity when growing the active layer 108 on the surface of the InP burying layer 107.

Furthermore, the value of the overall coupling coefficient can be fine-tuned by modifying the thickness of the InP burying layer 107 (the thickness of the spacer layer 5; the spacing between the active layer 108 and the second diffraction grating layer 3).

In the mean time, a semiconductor laser including a first semiconductor layer 102 being continuous with the diffraction grating 2A of the first diffraction grating layer 2 and extending to the closer end regions, and having a cavity length of about 1000 µm, as depicted in FIG. 2, was fabricated as an optical device having a diffraction grating structure as described above. That laser exhibited the characteristic of stably oscillating in a single mode up to a drive current of 300 mA, as depicted in FIGS. 3A-3C, confirming the effectiveness of the above-described structure.

However, it has been found that a device having a cavity length longer than about 1000 µm (e.g., a device having a cavity length of about 1200 µm or about 1400 µm), for the purpose of narrowing the spectral line width, oscillates in a multimode immediately after the oscillation is initiated, as depicted in FIGS. 4A-4D.

Considerations on the cause have led to the conclusion that this phenomenon is attributable to the different propagation constants between the center region of the cavity (having a propagation constant of β2) and the closer end regions of the cavity (having a propagation constant of β1), as depicted in FIG. 2, which shifts the oscillation mode toward the longer wavelength side within the stop band, inducing the multimode oscillation.

More specifically, in the center region of the cavity, the first semiconductor layer (semiconductor layer having a higher refractive index) 102 and 104 defining the first and second diffraction grating layers 2 and 3 are entirely etched, which is buried with the second semiconductor layer (semiconductor layers having a lower refractive index) 103 and 107. In other words, in the center region of the cavity, the diffraction gratings 2A and 3A are formed both in the first and second diffraction grating layers 2 and 3.

In contrast, in the closer end regions of the cavity, the diffraction grating 3A is formed only in the second diffraction grating layer 3. In other words, in the closer end regions of the cavity, the first semiconductor layer (semiconductor layer having a higher refractive index) 104 defining the second diffraction grating layer 3 is divided by etching, which is buried with the second semiconductor layer (semiconductor layer having a lower refractive index) 107. In contrast, the first semiconductor layer (semiconductor layer having a higher refractive index) 102 defining the first diffraction grating layer 2 remains without being etched.

As a result, the propagation constant at the center region of the cavity is made smaller than the propagation constant β1 at the closer end regions of the cavity.

Here, when increasing the cavity length, in order to assure the mode stability, the cavity length is increased while keeping a constant ratio of the length of the center region of the cavity wherein the diffraction gratings 2A and 3A are formed both in the first and second diffraction grating layers 2 and 3 to the length of the closer end regions of the cavity wherein the diffraction grating 3A is formed only in the second diffraction grating layer 3.

For this reason, when increasing the cavity length, the length of the center region of the cavity wherein the diffraction gratings 2A and 3A are formed both in the first and second diffraction grating layers 2 and 3, i.e., the length of the region having a smaller propagation constant, is increased.

The longer the region having the smaller propagation constant becomes (i.e., the longer the region having a greater propagation constant becomes), the greater the accumulated phase deviation of propagating light increase, which shifts the oscillation mode toward a longer wavelength side within the stop band, inducing multi-mode oscillation.

Here, FIGS. 5A-5C indicate calculation results of analyses on the shifts of the oscillation mode, and calculation results of the oscillation spectrum at the threshold current.

Note that, in FIG. 5A, the white circles indicate the relationship of the normalized propagation constant difference $\delta\beta L$ (L is the cavity length of the laser) when the propagation constant does not deviate with respect to the propagation constant based on the theoretical Bragg wavelength (here a wavelength of 1550 nm), which is dependent on by the period of the diffraction grating and the equivalent refractive index of the optical waveguide, versus the normalized threshold gain $\alpha L$. On the other hand, the black circles indicate the relationship of the normalized propagation constant difference $\delta\beta L$ (L is the cavity length of the laser) when a propagation constant difference estimated from the refractive index difference with respect to the propagation constant based on the theoretical Bragg wavelength is introduced (when the propagation constant deviates) versus the normalized threshold gain $\alpha L$.

When the propagation constant does not deviate, as indicated by the white circles in FIG. 5A, the value of the normalized threshold gain $\alpha L$ is minimized at a normalized propagation constant difference $\delta\beta L$ of zero, i.e., at the mode of Bragg wavelength. Therefore, as depicted in FIG. 5B, the mode of the Bragg wavelength becomes the oscillation mode, which provides stable single mode oscillation.

In contrast, when the propagation constant deviates, as depicted in FIG. 5C, the mode of the theoretical Bragg wavelength (main mode) shifts toward a shorter wavelength side within the stop band, which increases the value of the normalized threshold gain $\alpha L$, as depicted in FIG. 5A. On the other hand, the value of the normalized threshold gains $\alpha L$ is reduced in multiple modes (side modes) at a longer wavelength side within the stop band, making the values of normalized threshold gain $\alpha L$ in these modes very close, inducing multi-mode oscillation, as depicted in FIG. 5C. The corresponding spectrum profile reflects the spectrum profile in the vicinity of the threshold current depicted in FIG. 4B.

Thus, in the present embodiment, in order to achieve stable single mode oscillation in a device having an increased cavity length, thereby improving the device characteristics, the regions (closer end regions) wherein the diffraction grating 2A of the first diffraction grating layer 2 is not formed are formed from a third semiconductor layer 120 made from a material different from the materials of the first and second semiconductor layers 102 and 103 defining the diffraction grating 2A, as depicted in FIG. 1. Note that the different material may include any materials having the common constituent elements but with different compositions.

More specifically, the first diffraction grating layer 2 includes the diffraction grating 2A defined by the first and second semiconductor layers 102 and 103, and a third semiconductor layer 120 continuous with the diffraction grating 2A and made from a material different from the materials of the first and second semiconductor layers 102 and 103.

Here, in the first diffraction grating layer 2, the center region includes the diffraction grating 2A defined by the first and second semiconductor layers 102 and 103, while the closer end regions wherein the diffraction grating 2A is not formed includes the third semiconductor layer 120 made from a material different from the materials of the first and second semiconductor layers 102 and 103.

Here, the third semiconductor layer 120 has a refractive index lower than that of the first semiconductor layer 102 but higher than that of the second semiconductor layer 103.

Specifically, the third semiconductor layer 120 is made from a material with a composition different from that of the first semiconductor layer 102.

More specifically, in the present embodiment, the first semiconductor layer 102 is formed as an n-doped GaInAsP layer [e.g., with a composition wavelength of about 1.25 μm ($Ga_{0.251}In_{0.749}As_{0.543}P_{0.457}$ layer) and a thickness of about 25 nm], as described above. In contrast, the third semiconductor layer 120 is formed as an n-doped GaInAsP layer [e.g., with a composition wavelength of about 1.075 μm ($Ga_{0.127}In_{0.873}As_{0.277}P_{0.723}$ layer) and a thickness of about 25 nm].

As described above, in the present embodiment, although the first semiconductor layer 102 and the third semiconductor layer 120 are both n-doped GaInAsP layers, the composition of the third semiconductor layer 120 is modified to include less As, as compared to the first semiconductor layer 102, so as to reduce the refractive index and so as to be lattice matched to InP.

More specifically, the n-doped $Ga_{0.251}In_{0.749}As_{0.543}P_{0.457}$ layer as the first semiconductor layer 102 has a refractive index of about 3.36 at a wavelength of about 1550 nm. In contrast, the n-doped $Ga_{0.127}In_{0.873}As_{0.277}P_{0.723}$ layer as the third semiconductor layer 120 has a refractive index of about 3.2637 at a wavelength of about 1550 nm. In this manner, the third semiconductor layer 120 has a refractive index lower than that of the first semiconductor layer 102.

in addition, the third semiconductor layer 120 is made from a material different from that of the second semiconductor layer 103.

More specifically, in the present embodiment, the second semiconductor layer 103 is formed as an n-doped InP layer (e.g., with a thickness of about 15 nm), as described above. In contrast, the third semiconductor layer 120 is formed as an n-doped GaInAsP layer [e.g., with a composition wavelength of about 1.075 μm ($Ga_{0.127}In_{0.873}As_{0.277}P_{0.723}$ layer) and a thickness of about 25 nm], as described previously.

in such a case, the n-doped InP layer as the second semiconductor layer 103 has a refractive index of about 3.167 at a wavelength of about 1550 nm. In contrast, the n-doped $Ga_{0.127}In_{0.873}As_{0.277}P_{0.723}$ layer as the third semiconductor layer 120 has a refractive index of about 3.2637 at a wavelength of about 1550 nm. In this manner, the third semiconductor layer 120 has a refractive index higher than that of the second semiconductor layer 103.

Furthermore, in the present embodiment, the refractive indices of the first and second semiconductor layers 102 and 103 defining the diffraction grating 2A of the first diffraction grating layer 2 are about 3.36 and about 3.167, respectively, and their average refractive index is about 3.264, when the duty ratio of the diffraction grating 2A is about 50%. In contrast, the refractive index of the third semiconductor layer 120 continuous with the diffraction grating 2A of the first diffraction grating layer 2 is about 3.2637. In this manner, the first diffraction grating layer 2 has a substantially constant average refractive index across the cavity length. In this case, the first region (center region) including the optical waveguide 1 and the diffraction grating 2A provided in the first diffraction grating layer 2, and the second region (closer end regions) including the optical waveguide 1 and the third semiconductor layer 120 have substantially the same equivalent refractive index, and accordingly have substantially the same propagation constant. That is, a substantially constant equivalent refractive index is provided across the cavity length, and accordingly a substantially constant propagation constant is also provided. This can enable a stable single mode oscillation in a device having an increased cavity length, thereby improving the device characteristics.

Now, a method for manufacturing the DFB laser according to the specific exemplary configuration of this embodiment will be described with reference to FIGS. 6A-10B.

Figure 6A:
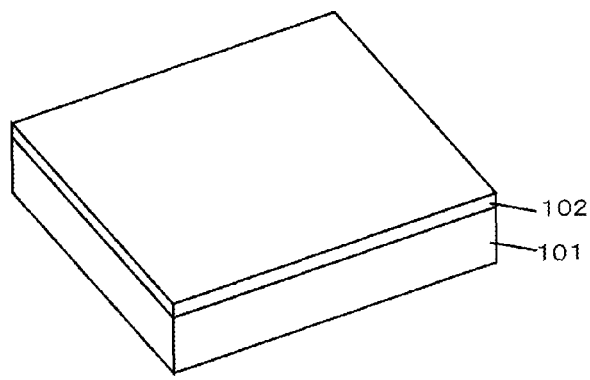
FIGS. 6A-6D are schematic perspective views illustrating a method for manufacturing one exemplary configuration of the optical device (DFB laser) according to the first embodiment.

Firstly, as depicted in FIG. 6A, an n-doped GaInAsP layer [e.g., with a composition wavelength of about 1.25 μm ($Ga_{0.251}In_{0.749}As_{0.543}P_{0.457}$ layer) and a thickness of about 25 nm; a layer with a refractive index different from that of the substrate 101; first semiconductor layer] 102 is formed over an n-doped InP substrate 101, using metal-organic vapor phase epitaxy (MOVPE), for example. Note that an n-doped InP cladding layer may be formed between the n-doped InP substrate 101 and the n-doped GaInAsP layer 102.

Figure 6B:
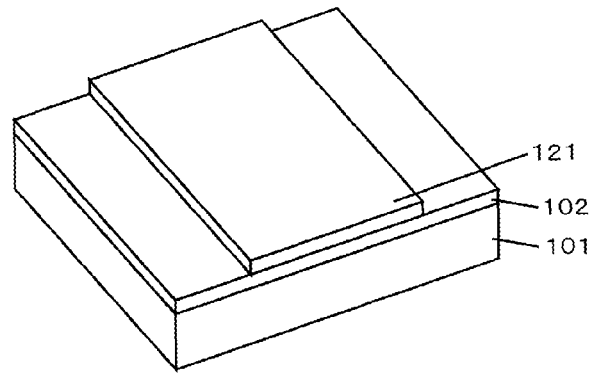

Subsequently, as depicted in FIG. 6B, an $SiO_2$ mask 121 is formed with chemical vapor deposition (CVD) and photolithography, for example.

Figure 6C:
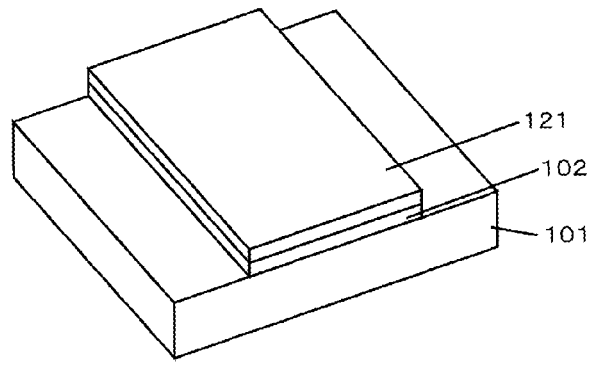

Subsequently, as depicted in FIG. 6C, using this $SiO_2$ mask 121, a portion of the n-doped GaInAsP layer 102 is etched by means of selective wet etching, for example.

Figure 6D:
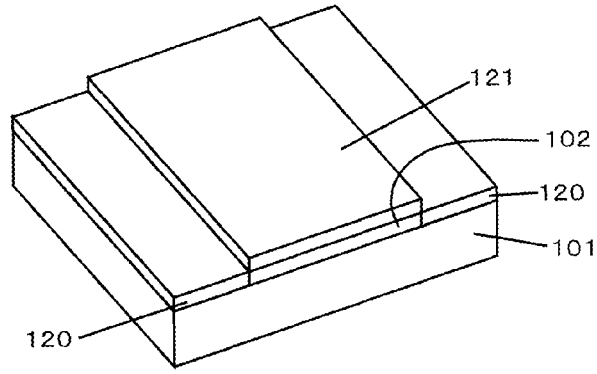

Thereafter, as depicted in FIG. 6D, with the $SiO_2$ mask 121 being remained, an n-doped GaInAsP layer 120 (e.g., with a composition wavelength of about 1.075 μm ($Ga_{0.127}In_{0.873}As_{0.277}P_{0.723}$ layer) and a thickness of about 25 nm; third semiconductor layer) that has a composition different from that of the n-doped GaInAsP layer 102 (i.e., made from a different material) is buried in the regions (openings) defined by removing the n-doped GaInAsP layer 102, by means of selective growth using MOVPE, for example, such that the n-doped GaInAsP layer 120 is continuous with the n-doped GaInAsP layer 102.

Figure 7A:
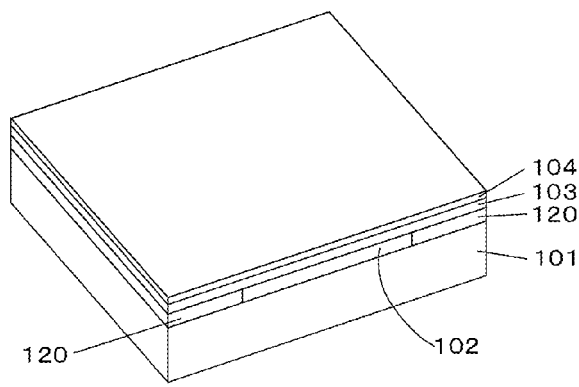
FIGS. 7A-7D are schematic perspective views illustrating the method for manufacturing one exemplary configuration of the optical device (DFB laser) according to the first embodiment.

Subsequently, as depicted in FIG. 7A, after removing the $SiO_2$ mask 121 with buffered hydrofluoric acid, an n-doped InP layer (e.g., with a thickness of about 15 nm; a layer having substantially the same refractive index as that of the substrate 101; second semiconductor layer) 103 and an n-doped GaInAsP layer [e.g., with a composition wavelength of about 1.15 μm ($Ga_{0.182}In_{0.818}As_{0.397}P_{0.603}$ layer) and a thickness of about 20 nm; a layer having a refractive index different from that of the substrate 101; first semiconductor layer] 104 are sequentially stacked over the entire surface, using MOVPE, for example.

Figure 7B:
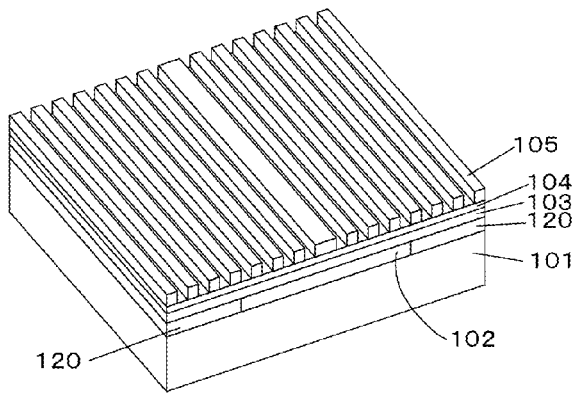

Next, as depicted in FIG. 7B, a mask 105 having a diffraction grating pattern and made from an electron beam resist (ZEP520 available from Zeon Corporation) is formed on the surface of the n-type GaInAsP layer 104 by electron beam exposure technique, for example.

Note that the diffraction grating pattern formed in the mask 105 includes a pattern for forming phase shifts 2X and 3X having a phase of a radian (λ/4 phase shift) at the center of the cavity for each device.

Figure 7C:
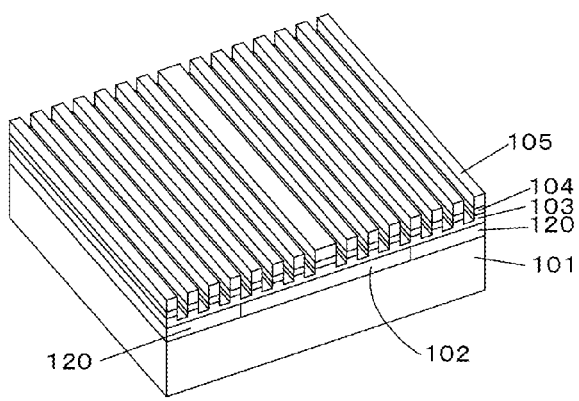

Subsequently, as depicted in FIG. 7C, the n-type GaInAsP layer 104 and a portion of n-type InP layer 103 are removed using the mask 105 by a reactive ion etching (RIE) using a mixed gas of ethane and hydrogen, for example.

In this example, the etching is stopped at some midpoint of the n-type InP layer 103 after the n-type GaInAsP layer 104 is divided. As a result, the diffraction grating pattern is transferred to the entire surface of the n-type GaInAsP layer 104, and the n-type GaInAsP layer 104 is divided.

Next, a positive photoresist (OFPR8600 available from Tokyo Ohka Kogyo., Ltd.; e.g., with a thickness of about 300 nm, for example) is applied on the surface, for example. Note that no deformation of the mask 105 occurs since the electron beam resist forming the mask 105 and the positive photoresist are immiscible.

Figure 7D:
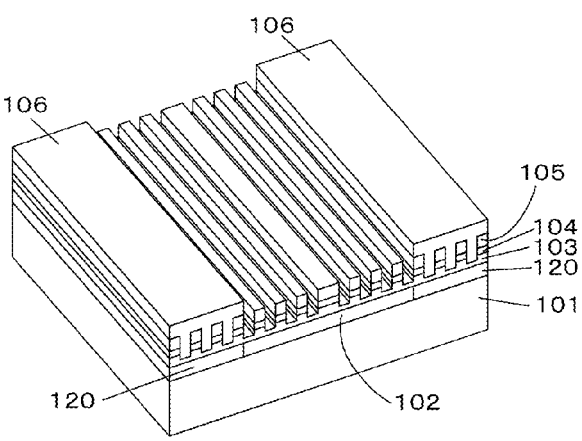

Next, as depicted in FIG. 7D, a portion of the positive photoresist (the center portion of the cavity; the center region in the direction along the optical waveguide, in this example) is removed using a conventional photolithographic technique to form a positive photoresist mask 106, covering the end portions in the direction along the optical waveguide (covering the surface of a partial region of the mask 105; covering the surface of the regions corresponding to the end regions of the optical waveguide).

Figure 8A:
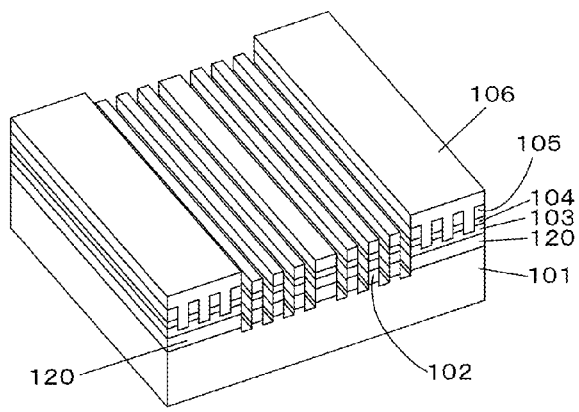
FIGS. 8A-8D are schematic perspective views illustrating the method for manufacturing one exemplary configuration of the optical device (DFB laser) according to the first embodiment.

Thereafter, as depicted in FIG. 8A, using the electron beam resist mask 105, which is exposed to the surface again, and the positive photoresist mask 106, the remained portion of the n-type InP layer 103, the n-type GaInAsP layer 102, and a portion of the n-type InP substrate 101 are removed by a reactive ion etching (RIE) using a mixed gas of ethane and hydrogen, for example.

In this example, the etching is stopped at some midpoint of the n-type InP substrate 101 (at an etching depth of about 10 nm, in this example) after the n-type InP layer 103 and the n-type GaInAsP layer 102 are divided.

As a result, the diffraction grating pattern is transferred to a portion of the n-type GaInAsP layer 102 (the center portion of the cavity; the center region in the direction along the optical waveguide, in this example), and the n-type GaInAsP layer 102 is divided.

in this case, since the diffraction grating pattern provided in the n-type GaInAsP layer 104 and the diffraction grating pattern provided in the n-type GaInAsP layer 102 are formed using the same mask 105, the diffraction gratings 2A and 3A in the overlap region of a first diffraction grating layer 2 and a second diffraction grating layer 3, which are to be formed as will be described later, will have substantially the same phase, period, and duty ratio.

Note that, in this example, the thickness and the refractive index of the n-type GaInAsP layer 102 (the thickness of and the refractive index difference in the first diffraction grating layer 2) are different from the thickness and the refractive index of the n-type GaInAsP layer 104 (the thickness of and the refractive index difference in the second diffraction grating layer 3). As a result, the coupling coefficient of the diffraction grating 2A provided in the first diffraction grating layer 2 is different from the coupling coefficient of the diffraction grating 3A provided in the second diffraction grating layer 3.

Each of the diffraction grating layers 2 and 3 has a constant duty ratio within the layer. In this case, since the width of the diffraction grating pattern of the etching mask (mask pattern) does not require any modification, the processing precision of the diffraction grating is stabilized. Since each of the diffraction grating layers 2 and 3 has a constant thickness and constant refractive index difference within the layer, the coupling coefficient of the diffraction grating within the layer is constant.

Figure 8B:
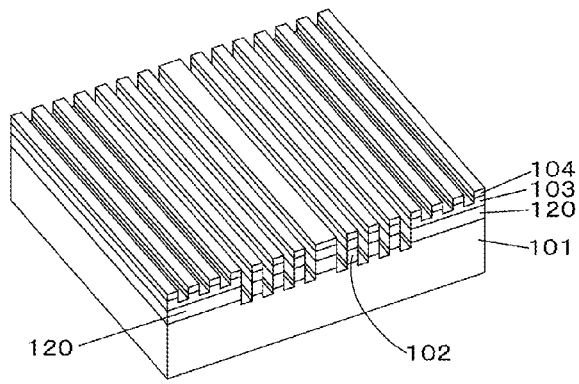

As depicted in FIG. 8B, the mask 105 and the mask 106 are removed from the surface using a conventional resist removal technique.

Figure 8C:
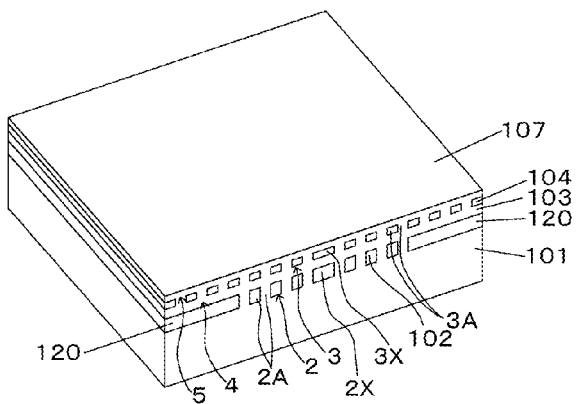

Subsequently, as depicted in FIG. 8C, an n-doped InP layer (a layer having substantially the same refractive index as that of the substrate 101; second semiconductor layer) 107 is grown over the entire surface, using MOVPE, for example. The grooves formed by stopping the etching at some midpoint of the n-type InP layer 103 and the grooves formed by stopping the etching at some midpoint of the n-type InP substrate 101 are buried with the n-type InP layer (burying layer) 107.

As a result, the discontinuous n-type GaInAsP layer 102 is buried with the n-type InP layer 107, thereby the first diffraction grating layer 2 is formed, a portion (the center portion of the cavity; the center region in the direction along the optical waveguide, in this example) of which is provided with the diffraction grating 2A (including the phase shift 2X). In addition, the discontinuous n-type GaInAsP layer 104 is buried with the n-type InP layer 107, thereby the second diffraction grating layer 3 is formed, the entirety (the entire length along the optical waveguide) of which is provided with the diffraction grating 3A (including the phase shift 3X).

Furthermore, the spacer layer 4 is formed between the first diffraction grating layer 2 and the second diffraction grating layer 3 by the n-type InP layer 103 and the a portion of n-type InP layer 107. In addition, the spacer layer 5 is formed over the second diffraction grating layer 3 by a portion of the n-type InP layer 107.

Figure 8D:
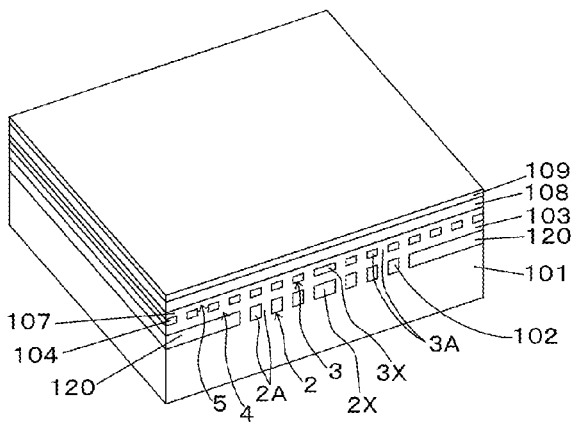

Next, as depicted in FIG. 8D, a quantum well active layer 108 and a p-type doped InP cladding layer (e.g., with a thickness of about 250 nm) 109 are stacked sequentially by MOVPE, for example.

In this example, the quantum well active layer 108 is made using a GaInAsP-based compound semiconductor material. In other words, the quantum well active layer 108 includes an undoped GaInAsP quantum well layer [e.g., with a thickness of about 5.1 nm, a compressive strain amount of about 1.0%, and a composition wavelength of about 1.55 μm ($Ga_{0.266}In_{0.734}As_{0.882}P_{0.118}$ layer)], and an undoped GaInAsP barrier layer (e.g., with a composition wavelength of about 1.2 μm ($Ga_{0.217}In_{0.783}As_{0.472}P_{0.528}$ layer) and a thickness of about 10 nm], the layer number of the quantum well layer being six, and the light emission wavelength thereof being about 1550 nm.

Note that undoped GaInAsP-separate confinement heterostructure (SCH) layers (light guide layers; e.g., with a wavelength of about 1.15 μm and a thickness of about 20 nm) may be provided over and under the quantum well active layer 108, sandwiching the quantum well active layer 108.

Figure 9A:
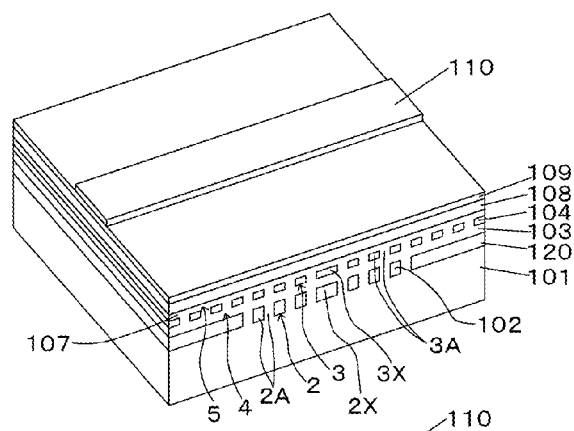
FIGS. 9A-9D are schematic perspective views illustrating the method for manufacturing one exemplary configuration of the optical device (DFB laser) according to the first embodiment.

Thereafter, as depicted in FIG. 9A, a mask (e.g., a stripe shape etching mask having a thickness of about 400 nm and a width of about 1.6 μm) 110 made from $SiO_2$ is formed over the semiconductor surface using a conventional chemical vapor deposition (CVD) and photolithography technique.

Figure 9B:
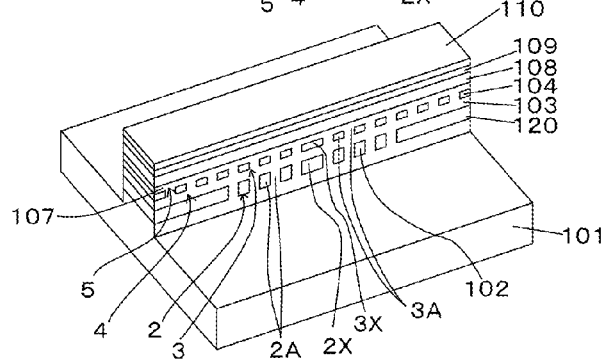

As depicted in FIG. 9B, the resultant semiconductor stack structure is etched such that the n-type InP substrate 101 is etched by about 0.7 μm, for example, using dry etching, for example, to form a stripe shape mesa structure (mesa stripes).

Figure 9C:
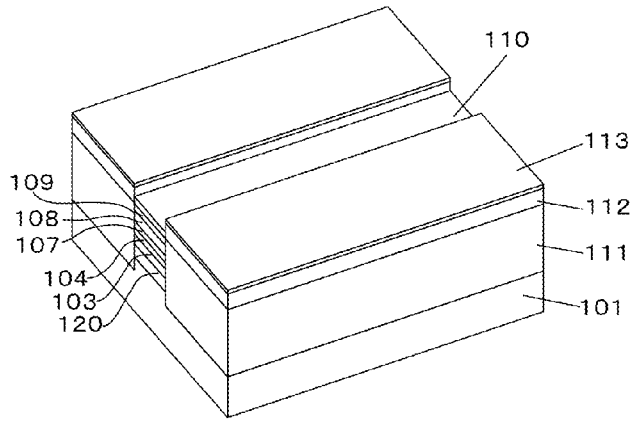
Figure 9D:
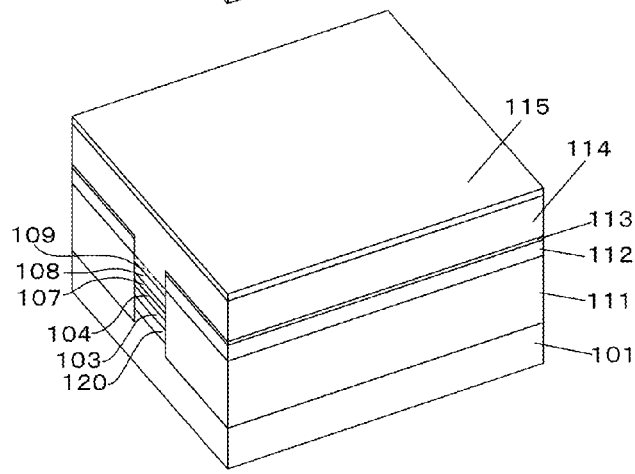

Next, as depicted in FIG. 9C, current blocking layers, made from a p-type InP layer 111, an n-type InP layer 112, and a p-type InP layer 113, are grown on opposite sides of the mesa structure using MOVPE, for example, and the etching mask 110 is removed with hydrofluoric acid, for example. Thereafter, as depicted in FIG. 9D, a p-type InP cladding layer (e.g., with a thickness of about 2.2 μm) 114 and a p-type GaInAs contact layer (e.g., with a thickness of about 300 nm) 115 are sequentially grown using MOVPE, for example.

Figure 10A:
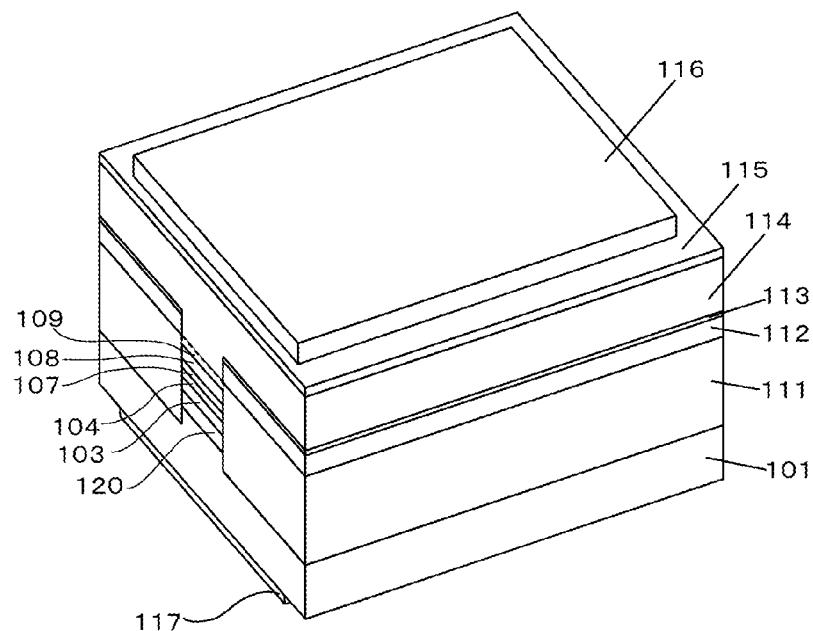
FIGS. 10A and 10B are schematic perspective views illustrating the method for manufacturing one exemplary configuration of the optical device (DFB laser) according to the first embodiment.
Figure 10B:
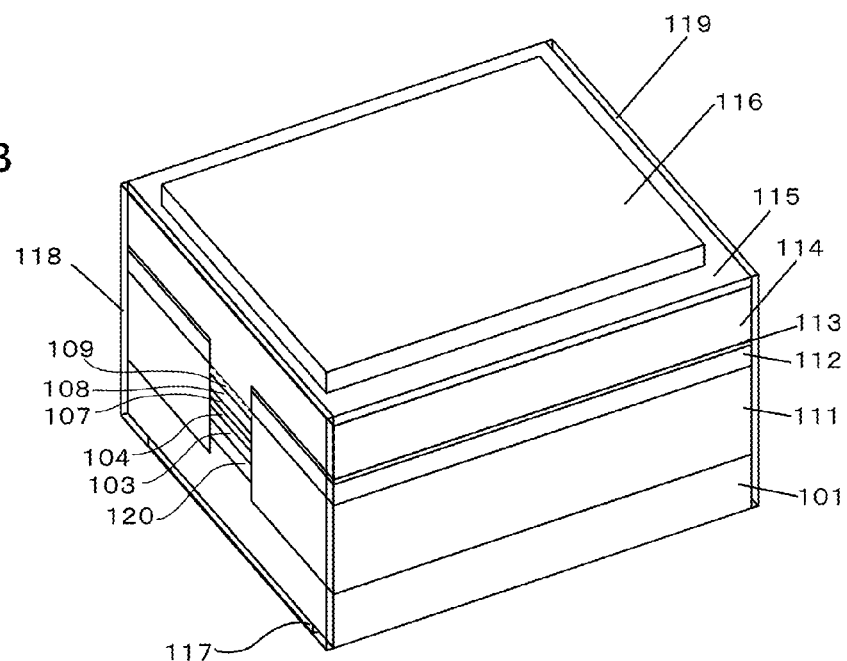

As depicted in FIG. 10A, after forming a p-side electrode 116 and an n-side electrode 117, as depicted in FIG. 10B, anti-reflection coatings 118 and 119 are formed on the both end face sides of the device, thereby obtaining a completed device.

Thus, according to the optical device (DFB laser) and the method for manufacturing the same of this embodiment, in the optical device having a structure wherein the coupling coefficient of the diffraction grating is varied within the cavity, the diffraction grating can be precisely and stably fabricated, thereby improving the yield. In addition, the difference in the coupling coefficient can be increased between the increased and reduced coupling coefficient regions (the contrast of the coupling coefficient can be increased), thereby improving the device characteristics.

Furthermore, since the diffraction grating can be precisely and stably fabricated, any variation in the device characteristics can be minimized, thereby improving the device characteristics. The controllability of the coupling coefficient and flexibility in designing the coupling coefficient are also improved.

Especially, according to the configuration of the above-described embodiment, since any of the refractive index difference between the two semiconductor layers constituting each diffraction grating layer, the thickness of each diffraction grating layer, and each spacing between respective diffraction grating layers (thickness of the spacer layer) can be desirably set, a diffraction grating having coupling coefficient of a significantly wider range, ranging from several $cm^{-1}$ to several hundreds of $cm^{-1}$, for example, can be fabricated precisely. In this case, the range of coupling coefficient that can be designed is widened as the layer number of the diffraction grating layers is increased.

In addition, in the manufacturing method of the above-described embodiment, the lower diffraction grating layer of the plurality of diffraction grating layers have a region where the diffraction grating is not provided. The range of coupling coefficient that can be designed is increased as more diffraction grating layers are disposed on the substrate side with respect to the optical waveguide.

Note that the DFB laser that are constructed as described above can also be used as an FM modulated light source, for example, by dividing the drive electrode into three parts along the direction of the cavity and modulating the injection current into the center electrode, as disclosed in S. Ogita et al., "FM Response of Narrow-Linewidth, Multielectrode λ/4 Shift DFB Laser", IEEE Photonics Technology Letters, vol. 2, no. 3, March 1990, pp. 165-166, the entire content of which is incorporated herein by reference, or Japanese Patent No. 2966485, the entire content of which is incorporated herein by reference.

Such a laser light source can be used, for example, for coherent optical transmission. Although improvement in the modulation efficiency requires increasing the range of the modulation current into the center electrode, excessive increase in the range of the modulation current may amplify the influence of the spatial hole burning along the cavity, impairing the stability of the single mode. Accordingly, for improving the efficiency in the FM modulation, the structure as described above, namely, the structure wherein the coupling coefficient is increased at the center of the cavity and the coupling coefficient is reduced at the ends as compared to the center can be used, as a structure to suppress any reduction in the gain difference between the main and side modes even when the spatial hole burning along the cavity is increased (see M. Ohashi et al., "Mode Analysis of DFB Laser Diode with Nonuniform Coupling Coefficients", Fall 1989, the Annual Meeting of the Japan Society of Applied Physics, 30p-ZG-13, the entire content of which is incorporated herein by reference).

According to this structure, the difference in the normalized threshold gain between the main and side modes in the longitudinal mode becomes about 1.7, which is about 2.4 times with respect to about 0.72 of a conventional λ/4 shifted DFB laser. Thus, unlike conventional laser, since the minimal normalized threshold gain difference of about 0.2, which is required for maintaining single mode operation, can be maintained even when the normalized threshold gain difference is reduced due to the influence of the spatial hole burning along the cavity during a high current injection (see H. Shoji et al., "Theoretical Analysis of λ/4 shifted DFB Lasers with Nonuniform-Depth Grating", Fall 1991, the Annual Meeting of the Japan Society of Applied Physics, 10p-ZM-17, the entire content of which is incorporated herein by reference), the efficiency in the FM modulation can be improved while maintaining a stable single longitudinal mode operation (see Y. Kotaki et al., "MQW-DFB Laser with Nonuniform-Depth Grating, Spring 1991, the Annual Meeting of the Japan Society of Applied Physics, 29p-D-7, the entire content of which is incorporated herein by reference).

In the DFB laser of the above-described embodiment, the difference in the normalized threshold gain between the main and side modes in the longitudinal mode of about 1.7 is obtained, which is about 2.4 times with respect to about 0.72 of a conventional λ/4 shifted DFB laser, by designing such that the normalized coupling coefficient KL at the center region, where the diffraction grating is two layers, becomes about 5, the normalized coupling coefficient KL at the end regions, where the diffraction grating is a single layer, becomes about 2, the ratio of the length of the end regions, where the diffraction grating is a single layer, to the entire cavity length becomes about 0.18. Accordingly, a further stable single longitudinal mode operation can be achieved.

In addition, according to the structure of the above-described embodiment, the average refractive index becomes substantially constant across the cavity length, and the first region (center region) including the optical waveguide 1 and the diffraction grating 2A provided in the first diffraction grating layer 2, and the second region (closer end regions) including the optical waveguide 1 and the third semiconductor layer 120 have substantially the same equivalent refractive index, and accordingly have substantially the same propagation constant. That is, a substantially constant equivalent refractive index is provided across the cavity length, and accordingly a substantially constant propagation constant is also provided. Thereby, a stable single longitudinal mode operation can be achieved in a device having an increased cavity length (e.g., a device having a cavity length of about 1200 μm or more), thereby improving the device characteristics.

[Second Embodiment]

Now, an optical device and a method for manufacturing the same according to a second embodiment will be described with reference to FIGS. 11-17B.

Figure 11:
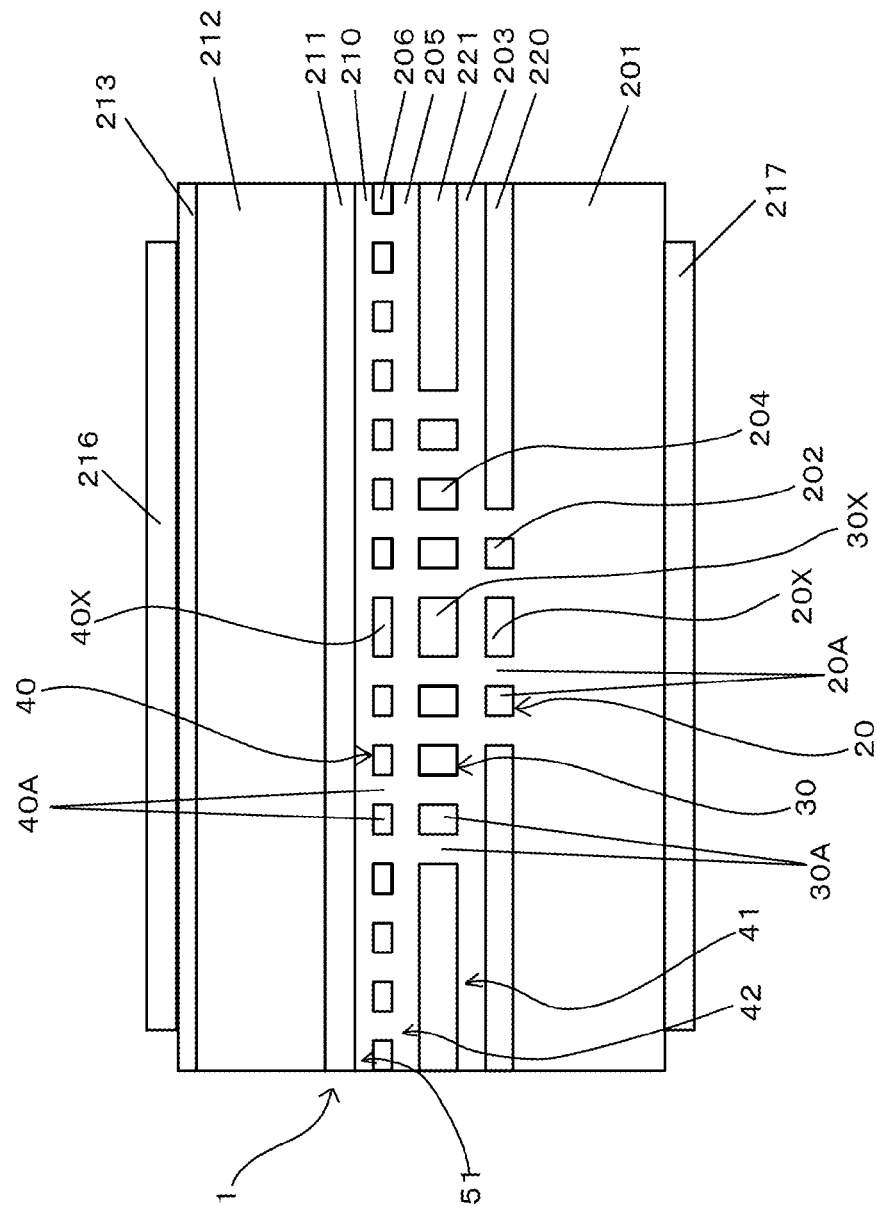
FIG. 11 is a schematic cross-sectional view illustrating a structure of an optical device (DFB laser) according to a second embodiment.
Figure 17A:
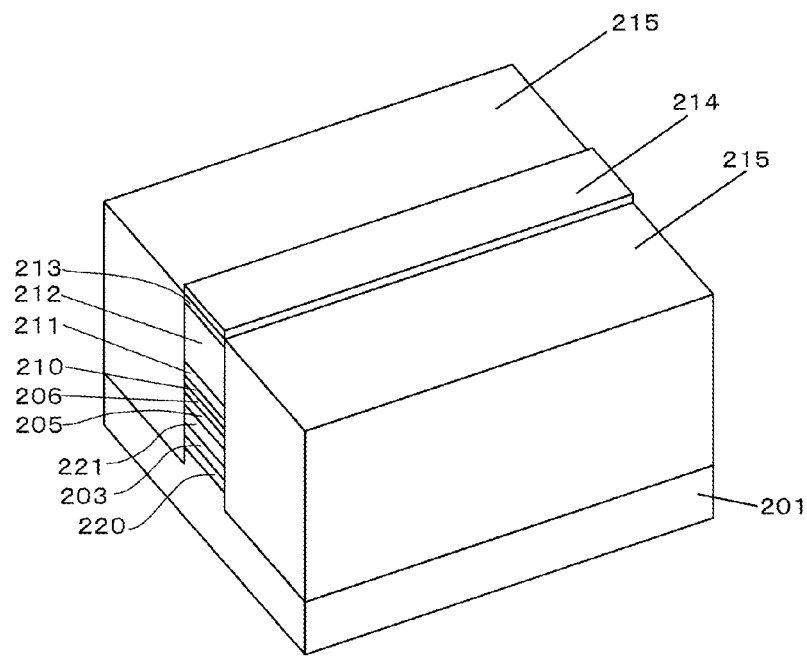
FIGS. 17A and 17B are schematic perspective views illustrating the method for manufacturing one exemplary configuration of the optical device (DFB laser) according to the second embodiment.
Figure 17B:
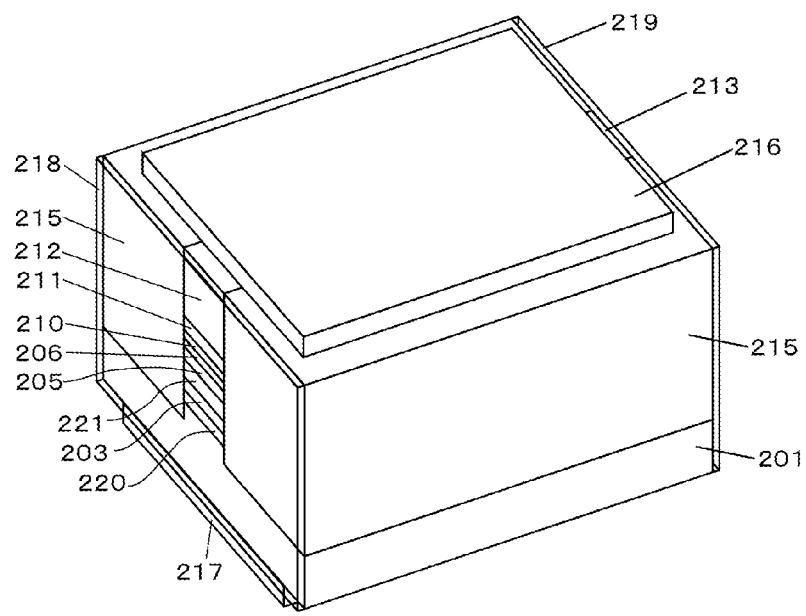

The optical device (DFB laser) and the method for manufacturing the same according to this embodiment are different from the above-described first embodiment in that three diffraction grating layers 20, 30, and 40 are provided, that a quantum well active layer 211 is formed using an AlGaInAs-based compound semiconductor material, and that a semi-insulating buried heterostructure (SI-BH structure; high-resistance buried structure) is used, as depicted in FIGS. 11 and 17B.

In other words, the optical device according to this embodiment is a distributed feed-back (DFB) laser (laser device; waveguide optical device; active optical device; light emitting device; device for code division multiplexing communication) having a structure wherein the coupling coefficient of diffraction grating is varied (distributed) within the cavity, for example, and includes an optical waveguide 1 and a plurality of (three, in this example) diffraction grating layers 20, 30, and 40 provided along the optical waveguide 1, as depicted in FIG. 11.

As depicted in FIG. 11, the first diffraction grating layer 20, the second diffraction grating layer 30, and the third diffraction grating layer 40 are provided as a plurality of diffraction grating layers, and the diffraction grating layers 20, 30, and 40 are provided under the optical waveguide 1 (the substrate side with respect to the optical waveguide 1; one side of the optical waveguide 1).

The diffraction grating layers 20, 30, and 40 include diffraction gratings (buried diffraction gratings; buried-type diffraction grating) 20A, 30A, and 40A having discontinuous semiconductor layers (first semiconductor layers) 202, 204, and 206, and other semiconductor layers (second semiconductor layers) 203, 205, and 210 burying the first semiconductor layers 202, 204, and 206, respectively, as depicted in FIG. 11. Here, the first semiconductor layers 202, 204, and 206 have a refractive index different from that of the second semiconductor layers 203, 205, and 210. Here, the diffraction gratings 20A, 30A, and 40A are respectively configured to include phase shifts 20X, 30X, and 40X (here, λ/4 phase shift).

The diffraction gratings 20A, 30A, and 40A in the diffraction grating layers 20, 30, and 40 are provided to overlap each other, and the diffraction gratings 20A, 30A, and 40A at an overlap region (a corresponding region) have substantially the same phase, period, and duty ratio. Here, the term "duty ratio" means the ratio of the remained portion after etching with respect to the period of the diffraction grating. Note that, in this embodiment, the duty ratio of each of the diffraction gratings 20A, 30A, and 40A provided in the diffraction grating layers 20, 30, and 40 is constant.

In this embodiment, as depicted in FIG. 11, the diffraction grating 20A in the first diffraction grating layer 20 is provided only at the closer center region in the direction along the optical waveguide 1 (the direction of the length of the cavity). In other words, the region where the diffraction grating 20A in the first diffraction grating layer 20 is provided, is the closer center region in the direction along the optical waveguide 1.

In addition, as depicted in FIG. 11, the diffraction grating 30A in the second diffraction grating layer 30 is provided only at the center region in the direction along the optical waveguide 1 (the direction of the length of the cavity). In other words, the region where the diffraction grating 30A in the second diffraction grating layer 30 is provided, is the center region in the direction along the optical waveguide 1.

Furthermore, as depicted in FIG. 11, the diffraction grating 40A in the third diffraction grating layer 40 is formed along the entire length of the direction along the optical waveguide 1. In other words, the region where the diffraction grating 40A in the third diffraction grating layer 40 is provided, is the entire region of the direction along the optical waveguide 1.

As described above, in this embodiment, as depicted in FIG. 11, the length of the region where the diffraction grating 20A in the first diffraction grating layer 20 is provided in the direction along the optical waveguide 1, is shorter than the length of the region of the second diffraction grating layer 30 where the diffraction grating 30A is provided in the direction along the optical waveguide 1. In addition, the length of the region where the diffraction grating 30A in the second diffraction grating layer 30 is provided in the direction along the optical waveguide 1 is shorter than the length of the region of the third diffraction grating layer 40 where the diffraction grating 40A is provided in the direction along the optical waveguide 1. In other words, the lengths of the regions where the diffraction gratings 20A, 30A, and 40A are provided, are different among the first diffraction grating layer 20, the second diffraction grating layer 30, and the third diffraction grating layer 40. In this case, the overlap region of the diffraction grating layers 20, 30, and 40 is the closer center region in the direction along the optical waveguide 1.

Note that, although three diffraction grating layers 20, 30, and 40 are provided as a plurality of diffraction grating layers and the lengths of the regions of the diffraction grating layers 20, 30, and 40 where the diffraction gratings 20A, 30A, and 40A are provided, are different from each other, these are not limiting. For example, a forth diffraction grating layer may be add for increasing the coupling coefficient at the center region or the closer center region in the direction along the optical waveguide 1. Here, the length of the region of the forth diffraction grating layer where the diffraction grating is provided in the direction along the optical waveguide 1 is the same as that of the first diffraction grating layer 20 or the second diffraction grating layer 30. Thus, it is suffice that the plurality of diffraction grating layers include at least two diffraction grating layers being different from each other in terms of the length of the region where the diffraction grating is provided.

As described above, in this embodiment, using buried diffraction gratings, a plurality of diffraction grating layers including region where a buried diffraction grating is provided, are stacked. At the region where maximizing the coupling coefficient is desired, a buried diffraction grating is provided in all of the stacked diffraction grating layers (three layers, i.e., the first diffraction grating layer 20, the second diffraction grating layer 30, and the third diffraction grating layer 40, in this example). At the region where a reduced coupling coefficient is desired, a diffraction grating is provided in a step-wise manner only in part of the stacked diffraction grating layers (the second diffraction grating layer 30, or the second diffraction grating layer 30 and the third diffraction grating layer 40, in this example).

In this embodiment, as depicted in FIG. 11, the second diffraction grating layer 20 and the third diffraction grating layer 30 are stacked over the first diffraction grating layer 20, and the diffraction gratings 20A, 30A, and 40A in the diffraction grating layers 20, 30, and 40 are stacked at the closer center region in the direction along the optical waveguide 1, and the diffraction gratings 30A and 40A in the diffraction grating layers 30 and 40 are stacked at the center region in the direction along the optical waveguide 1. In other words, the number of stacked diffraction gratings is varied in the direction along the optical waveguide 1. As a result, the coupling coefficient at the closer center region in the direction along the optical waveguide 1 is increased, whereas the coupling coefficient is reduced in a step-wise manner toward the center region and the closer end regions.

The DFB laser (optical semiconductor device) according to this specific example configuration is a DFB laser oscillating at the 1.3 μm wavelength band. As depicted in FIG. 11, the DFB laser includes, over an n-doped InP substrate 201, the first diffraction grating layer 20, the second diffraction grating layer 30, the third diffraction grating layer 40, and the optical waveguide 1 including a quantum well active layer 211 as the waveguide core layer. The first diffraction grating layer 20 includes the buried diffraction grating 20A, which is formed by burying an n-doped GaInAsP layer [e.g., with a composition wavelength of about 1.15 μm ($Ga_{0.182}In_{0.818}As_{0.397}P_{0.603}$ layer) and a thickness of about 15 nm] 202, which is discontinuous at the closer center region, with an n-doped InP layer (e.g., with a thickness of about 15 nm; burying layer) 203, wherein the n-doped GaInAsP layer 202 and the n-doped InP layer 203 have different refractive indices. The second diffraction grating layer 30 includes the buried diffraction grating 30A, which is formed by burying an n-doped GaInAsP layer [e.g., with a composition wavelength of about 1.15 μm ($Ga_{0.182}In_{0.818}As_{0.397}P_{0.603}$ layer) and a thickness of about 20 nm] 204 that is discontinuous at the centre region, with an n-doped InP layer 205 (e.g., with a thickness of about 15 nm; burying layer), wherein the n-doped GaInAsP layer 204 and the n-doped InP layer 205 have different refractive indices. The third diffraction grating layer 40 includes the buried diffraction grating 40A, which is formed by burying an n-doped GaInAsP layer [e.g., a composition wavelength of 1.15 μm ($Ga_{0.182}In_{0.818}As_{0.397}P_{0.603}$ layer) and a thickness of about 15 nm] 206 that is discontinuous at the entire region, with an n-doped InP layer 210, wherein the n-doped GaInAsP layer 206 and the n-doped InP layer 210 have different refractive indices.

In addition, the portions of the n-type InP burying layer 203 burying between the discontinuous n-type GaInAsP layer 202 define the diffraction grating 20A, the portions of the n-type InP burying layer 205 burying between the discontinuous n-type GaInAsP layer 204 define the diffraction grating 30A, and the portions of the n-type InP burying layer 210 burying between the discontinuous n-type GaInAsP layer 206 define the diffraction grating 40A. Additionally, the portion of the n-type InP burying layer 203 formed over the n-type GaInAsP layer 202 constitutes a spacer layer (intermediate layer) 41 between the first diffraction grating layer 20 and the second diffraction grating layer 30, the portion of the n-type InP burying layer 205 formed over the n-type GaInAsP layer 204 constitutes a spacer layer (intermediate layer) 42 between the second diffraction grating layer 30 and the third diffraction grating layer 40, and the portion of the n-type InP burying layer 210 formed over the n-type GaInAsP layer 206 constitutes a spacer layer (cladding layer) 51 between the third diffraction grating layer 40 and the active layer 211. Note that minimizing the thickness of the spacer layers 41 and 42 is preferred, as long as the variation of an etching depth can be permissible.

In the specific exemplary configuration of this embodiment, the thickness of the n-doped InP layer 203 is about 15 nm; the thickness of the n-doped InP layer 205 is about 15 nm; the thicknesses of the spacer layer 41 and the spacer layer 42 are substantially equal; and the first diffraction grating layer 20, the second diffraction grating layer 30, and the third diffraction grating layer 40 are spaced apart with substantially the same distance.

In addition, in the specific exemplary configuration of this embodiment, the thickness of the n-doped GaInAsP layer 202 constituting the diffraction grating 20A in the first diffraction grating layer 20 is about 15 nm, the thickness of the n-doped GaInAsP layer 204 constituting the diffraction grating 30A in the second diffraction grating layer 30 is about 20 nm, and the thickness of the n-doped GaInAsP layer 206 constituting the diffraction grating 40A in the third diffraction grating layer 40 is about 15 nm, so that the first diffraction grating layer 20 or the third diffraction grating layer 40, and the second diffraction grating layer 30 have different thicknesses. In other words, the plurality of diffraction grating layers include diffraction grating layers having different thicknesses, a part of the diffraction grating layers have different thicknesses.

Furthermore, in the specific exemplary configuration of this embodiment, the refractive index difference between the semiconductor layers 202 and 203 constituting the diffraction grating 20A in the first diffraction grating layer 20, the refractive index difference between the semiconductor layers 204 and 205 constituting the diffraction grating 30A in the second diffraction grating layer 30, and the refractive index difference between the semiconductor layers 206 and 210 constituting the diffraction grating 40A in the third diffraction grating layer 40 are substantially the same, so that the first diffraction grating layer 20, the second diffraction grating layer 30, and the third diffraction grating layer 40 have substantially the same refractive index difference.

Therefore, in the first diffraction grating layer 20, the second diffraction grating layer 30, and the third diffraction grating layer 40, although the diffraction gratings 20A, 30A, and 40A have substantially the same duty ratio, the diffraction gratings 20A or 40A, and the diffraction grating 30A have different coupling coefficients.

As described above, similar to the above-described first embodiment, according to the configuration of this embodiment, since the contrast of the coupling coefficient can be increased by stacking the plurality of diffraction grating layers 20, 30, and 40, devices satisfying desired needs can be achieved, with improved the device characteristics.

In addition, in the present embodiment, similar to the above-described first embodiment, in order to achieve stable single mode oscillation in a device having an increased cavity length, thereby improving the device characteristics, the regions wherein the diffraction gratings 20A and 30A of the first and second diffraction grating layers 20 and 30 are not formed are formed from third semiconductor layers 220 and 221 made from a material different from the materials of the first semiconductor layers 202 and 204 and the second semiconductor layers 203 and 205 defining the diffraction gratings 20A and 30A. Note that the different material may include any materials having the common constituent elements but with different compositions.

More specifically, the first and second diffraction grating layers 20 and 30 include the diffraction gratings 20A and 30A defined by the first semiconductor layers 202 and 204 and the second semiconductor layers 203 and 205, and the third semiconductor layers 220 and 221 continuous with the diffraction gratings 20A and 30A and made from a material different from the materials of the first semiconductor layers 202 and 204 and the second semiconductor layers 203 and 205.

Here, in the first diffraction grating layer 20, the closer center region includes the diffraction grating 20A defined by the first and second semiconductor layers 202 and 203, while the end regions wherein the diffraction grating 20A is not formed include the third semiconductor layer 220 made from a material different from the materials of the first and second semiconductor layers 202 and 203. In addition, in the second diffraction grating layer 30, the center region includes the diffraction grating 30A defined by the first and second semiconductor layers 204 and 205, while the closer end regions wherein the diffraction grating 30A is not formed includes the third semiconductor layer 221 made from a material different from the materials of the first and second semiconductor layers 204 and 205.

Here, the third semiconductor layers 220 and 221 have a refractive index lower than that of the first semiconductor layers 202 and 204 but higher than that of the second semiconductor layers 203 and 205.

Specifically, the third semiconductor layers 220 and 221 are made from a material with a composition different from that of the first semiconductor layers 202 and 204.

More specifically, in the present embodiment, in the first diffraction grating layer 20, the first semiconductor layer 202 is an n-doped GaInAsP layer [e.g., with a composition wavelength of about 1.15 μm ($Ga_{0.182}In_{0.818}As_{0.397}P_{0.603}$ layer) and a thickness of about 15 nm], as described above. In contrast, the third semiconductor layer 220 is an n-doped GaInAsP layer [e.g., with a composition wavelength of about 1.03 μm ($Ga_{0.092}In_{0.908}As_{0.201}P_{0.799}$ layer) and a thickness of about 15 nm].

As described above, in the first diffraction grating layer 20, although the first semiconductor layer 202 and the third semiconductor layer 220 are both n-doped GaInAsP layers, the composition of the third semiconductor layer 220 is modified to include less As, as compared to the first semiconductor layer 202, so as to reduce the refractive index and so as to be lattice matched to InP.

More specifically, the n-doped $Ga_{0.182}In_{0.818}As_{0.397}P_{0.603}$ layer as the first semiconductor layer 202 has a refractive index of about 3.37 at a wavelength of about 1310 nm. In contrast, the n-doped $Ga_{0.092}In_{0.908}As_{0.201}P_{0.799}$ layer as the third semiconductor layer 220 has a refractive index of about 3.286 at a wavelength of about 1310 nm. In this manner, the third semiconductor layer 220 has a refractive index lower than that of the first semiconductor layer 202.

Similarly, in the second diffraction grating layer 30, the first semiconductor layer 204 is an n-doped GaInAsP layer [e.g., with a composition wavelength of about 1.15 μm ($Ga_{0.182}In_{0.818}As_{0.397}P_{0.603}$ layer) and a thickness of about 20 nm], as described above. In contrast, the third semiconductor layer 221 is an n-doped GaInAsP layer [e.g., with a composition wavelength of about 1.03 μm ($Ga_{0.092}In_{0.908}As_{0.201}P_{0.799}$ layer) and a thickness of about 20 nm].

As described above, in the second diffraction grating layer 30, although the first semiconductor layer 204 and the third semiconductor layer 221 are both n-doped GaInAsP layers, the composition of the third semiconductor layer 221 is modified to include less As, as compared to the first semiconductor layer 204, so as to reduce the refractive index and so as to be lattice matched to InP.

More specifically, the n-doped $Ga_{0.182}In_{0.818}As_{0.397}P_{0.603}$ layer as the first semiconductor layer 204 has a refractive index of about 3.37 at a wavelength of about 1310 nm. In contrast, the n-doped $Ga_{0.092}In_{0.908}As_{0.201}P_{0.799}$ layer as the third semiconductor layer 221 has a refractive index of about 3.286 at a wavelength of about 1310 nm. In this manner, the third semiconductor layer 221 has a refractive index lower than that of the first semiconductor layer 204.

In addition, in the first and second diffraction grating layers 20 and 30, the third semiconductor layers 220 and 221 are made from a material different from the material of the second semiconductor layers 203 and 205.

More specifically, in the present embodiment, in the first and second diffraction grating layers 20 and 30, the second semiconductor layers 203 and 205 are n-doped InP layers (e.g., with a thickness of about 15 nm), as described above. In contrast, the third semiconductor layers 220 and 221 are n-doped GaInAsP layers (e.g., with a composition wavelength of about 1.03 μm ($Ga_{0.092}In_{0.908}As_{0.201}P_{0.799}$ layer) and a thickness of about 20 nm], as described above.

in such a case, the n-doped InP layers, as the second semiconductor layers 203 and 205, have a refractive index of about 3.207 at a wavelength of about 1310 nm. In contrast, the n-doped $Ga_{0.092}In_{0.908}As_{0.201}P_{0.799}$ layers, as the third semiconductor layers 220 and 221, have a refractive index of about 3.286 at a wavelength of about 1310 nm. In this manner, the third semiconductor layers 220 and 221 have a refractive index higher than that of the second semiconductor layers 203 and 205.

Furthermore, in the present embodiment, the refractive indices of the first semiconductor layers 202 and 204 and the second semiconductor layers 203 and 205 defining the diffraction gratings 20A and 30A of the first and second diffraction grating layers 20 and 30 are about 3.37 and about 3.207, respectively, and their average refractive index is about 3.288, when the duty ratio of the diffraction gratings is about 50%.

In contrast, the refractive index of the third semiconductor layers 220 and 221 continuous with the diffraction gratings 20A and 30A of the first and second diffraction grating layers 20 and 30 is about 3.286. In this manner, the first and second diffraction grating layers 20 and 30 have a substantially constant average refractive index across the cavity length.

In this case, the first region (closer center region) including the optical waveguide 1 and the diffraction grating 20A provided in the first diffraction grating layer 20, and the second region (end regions) including the optical waveguide 1 and the third semiconductor layer 220 provided in the first diffraction grating layer 20 have substantially the same equivalent refractive index, and accordingly have substantially the same propagation constant. That is, a substantially constant equivalent refractive index is provided across the cavity length, and accordingly a substantially constant propagation constant is also provided.

In addition, the first region (center region) including the optical waveguide 1 and the diffraction grating 30A provided in the second diffraction grating layer 30, and the second region (closer end regions) including the optical waveguide 1 and the third semiconductor layer 221 provided in the second diffraction grating layer 30 have substantially the same equivalent refractive index, and accordingly have substantially the same propagation constant. That is, a substantially constant equivalent refractive index is provided across the cavity length, and accordingly a substantially constant propagation constant is also provided.

This can enable a stable single mode oscillation in a device having an increased cavity length, thereby improving the device characteristics.

The details of other elements are similar to the configuration and the specific exemplary configuration of the above-described first embodiment, and descriptions thereof will be omitted.

Now, a method for manufacturing the DFB laser according to the specific exemplary configuration of this embodiment will be described with reference to FIGS. 12A-17B.

Figure 12A:
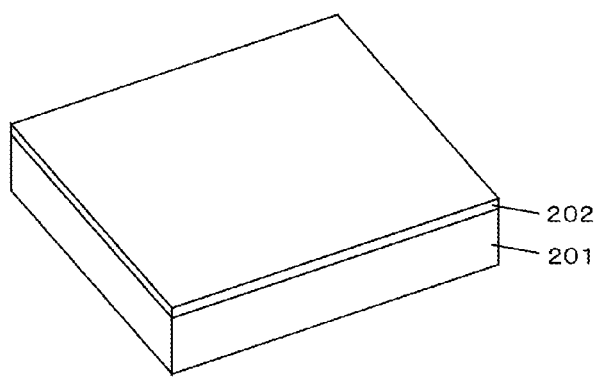
FIGS. 12A-12D are schematic perspective views illustrating a method for manufacturing one exemplary configuration of the optical device (DFB laser) according to the second embodiment.

Firstly, as depicted in FIG. 12A, an n-doped GaInAsP layer [e.g., with a composition wavelength of about 1.15 μm ($Ga_{0.182}In_{0.818}As_{0.397}P_{0.603}$) and a thickness of about 15 nm; a layer with a refractive index different from that of the substrate 201; first semiconductor layer] 202 is formed over an n-doped InP substrate 201, using metal-organic vapor phase epitaxy (MOVPE), for example. Note that an n-type InP cladding layer may be formed between the n-type InP substrate 201 and the n-type GaInAsP layer 202.

Figure 12B:
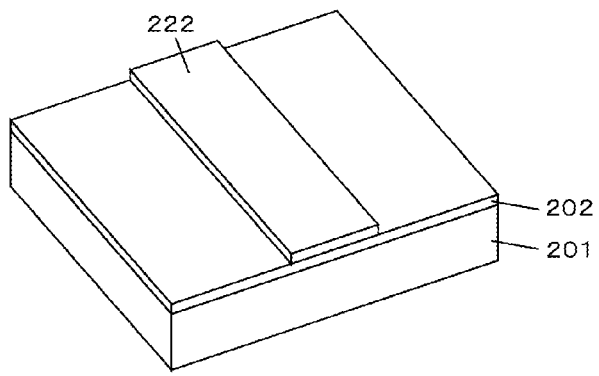

Subsequently, as depicted in FIG. 12B, an $SiO_2$ mask 222 is formed with chemical vapor deposition (CVD) and photolithography, for example.

Figure 12C:
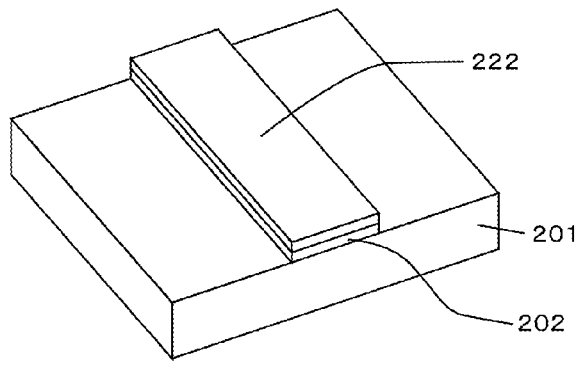

Subsequently, as depicted in FIG. 12C, using this $SiO_2$ mask 222, a portion of the n-doped GaInAsP layer 202 is etched by means of selective wet etching, for example.

Figure 12D:
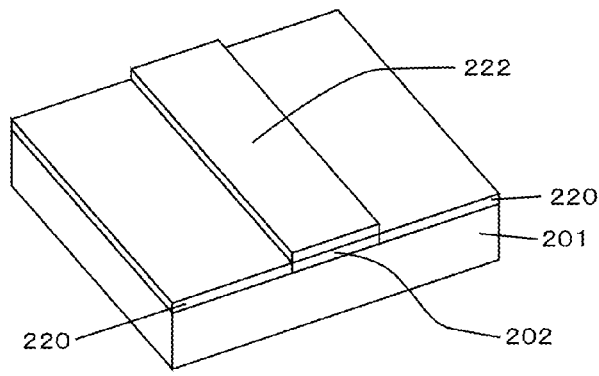

Thereafter, as depicted in FIG. 12D, with the $SiO_2$ mask 222 being remained, an n-doped GaInAsP layer [e.g., with a composition wavelength of about 1.03 μm ($Ga_{0.092}In_{0.908}As_{0.201}P_{0.799}$ layer) and a thickness of about 15 nm; third semiconductor layer] 220 that has a composition different from that of the n-doped GaInAsP layer 202 (i.e., made from a different material) is buried in the regions (openings) defined by removing the n-doped GaInAsP layer 202, by means of selective growth using MOVPE, for example, such that the n-doped GaInAsP layer 220 is continuous with the n-doped GaInAsP layer 202.

Figure 13A:
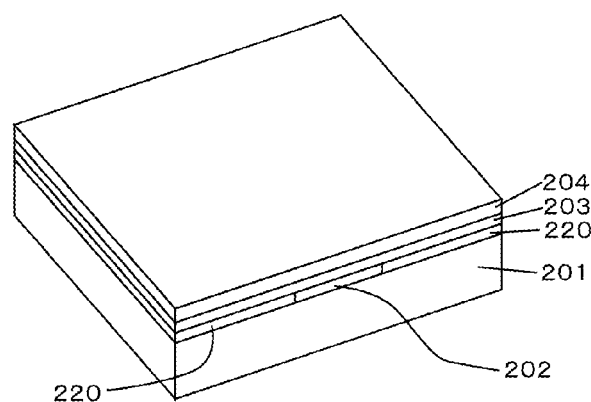
FIGS. 13A-13D are schematic perspective views illustrating the method for manufacturing one exemplary configuration of the optical device (DFB laser) according to the second embodiment.

Subsequently, as depicted in FIG. 13A, after removing the $SiO_2$ mask 222 with buffered hydrofluoric acid, an n-doped InP layer (e.g., with a thickness of about 15 nm; a layer having substantially the same refractive index as that of the substrate 201; second semiconductor layer) 203 and an n-doped GaInAsP layer [e.g., with a composition wavelength of about 1.15 μm ($Ga_{0.182}In_{0.818}As_{0.397}P_{0.603}$ layer) and a thickness of about 20 nm; a layer having a refractive index different from that of the substrate 201; first semiconductor layer] 204 are sequentially stacked over the entire surface, using metal-organic vapor phase epitaxy (MOVPE), for example.

Figure 13B:
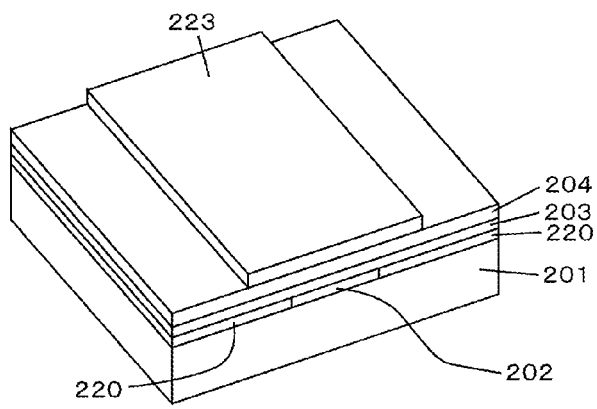

Subsequently, as depicted in FIG. 13B, an $SiO_2$ mask 223 is formed with chemical vapor deposition (CVD) and photolithography, for example.

Figure 13C:
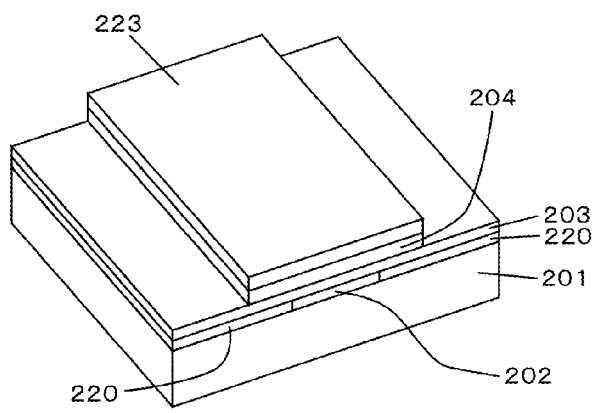

Subsequently, as depicted in FIG. 13C, using this $SiO_2$ mask 223, a portion of the n-doped GaInAsP layer 204 is etched by means of selective wet etching, for example.

Figure 13D:
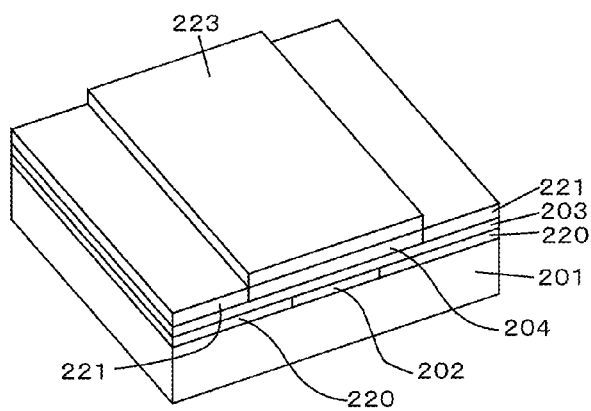

Thereafter, as depicted in FIG. 13D, with the $SiO_2$ mask 223 being remained, an n-doped GaInAsP layer [e.g., with a composition wavelength of about 1.03 μm ($Ga_{0.092}In_{0.908}As_{0.201}P_{0.799}$ layer) and a thickness of about 20 nm; third semiconductor layer] 221 that has a composition different from that of the n-doped GaInAsP layer 204 (i.e., made from a different material) is buried in the regions (openings) defined by removing the n-doped GaInAsP layer 204, by means of selective growth using MOVPE, for example, such that the n-doped GaInAsP layer 221 is continuous with the n-doped GaInAsP layer 204.

Figure 14A:
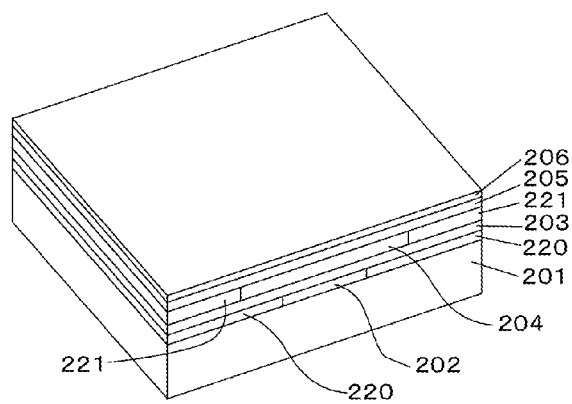
FIGS. 14A-14D are schematic perspective views illustrating the method for manufacturing one exemplary configuration of the optical device (DFB laser) according to the second embodiment.

Subsequently, as depicted in FIG. 14A, after removing the $SiO_2$ mask 223 with buffered hydrofluoric acid, an n-doped InP layer (e.g., with a thickness of about 15 nm; a layer having substantially the same refractive index as that of the substrate 201; second semiconductor layer) 205 and an n-doped GaInAsP layer [e.g., with a composition wavelength of about 1.15 μm ($Ga_{0.182}In_{0.818}As_{0.397}P_{0.603}$ layer), a thickness of about 15 nm, and a refractive index different from that of the substrate 201; first semiconductor layer] 206 are sequentially stacked over the entire surface, using metal-organic vapor phase epitaxy (MOVPE), for example.

Figure 14B:
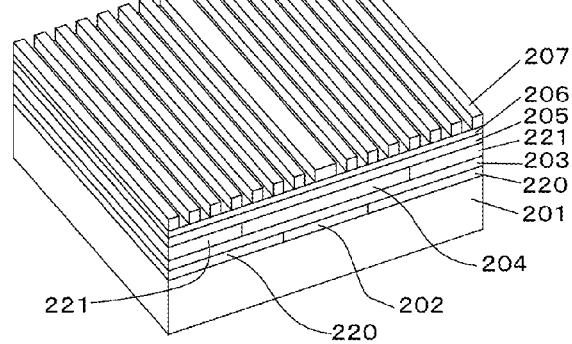

Next, as depicted in FIG. 14B, a mask 207 having a diffraction grating pattern and made from an electron beam resist (ZEP520 available from Zeon Corporation) is formed on the surface of the n-type GaInAsP layer 206 by electron beam exposure technique, for example.

Note that the diffraction grating pattern formed in the mask 207 includes a pattern for forming phase shifts 20X, 30X, and 40X having a phase of π radian (λ/4 phase shift) at the center of the cavity for each device.

Figure 14C:
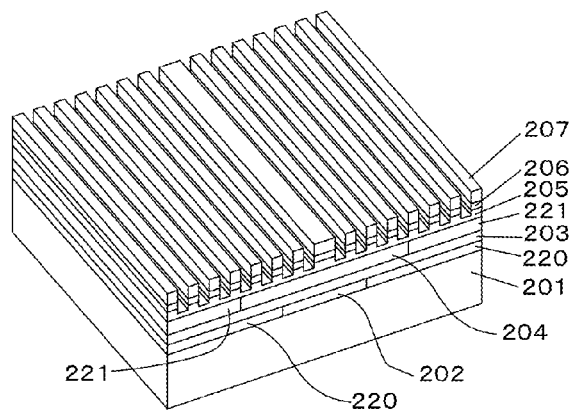

Subsequently, as depicted in FIG. 14C, the n-type GaInAsP layer 206 and a portion of the n-doped InP layer 205 are removed using the mask 207 by a reactive ion etching (RIE) using a mixed gas of ethane and hydrogen, for example. In this example, the etching is stopped at some midpoint of the n-type InP layer 205 after the n-type GaInAsP layer 206 is divided. As a result, the diffraction grating pattern is transferred to the entire surface of the n-type GaInAsP layer 206, and the n-type GaInAsP layer 206 is divided.

Next, a positive photoresist (OFR8600 available from Tokyo Ohka Kogyo., Ltd.; having a thickness of about 300 nm) applied on the surface, for example. Note that no deformation of the mask 207 occurs since the electron beam resist forming the mask 207 and the positive photoresist are immiscible.

Figure 14D:
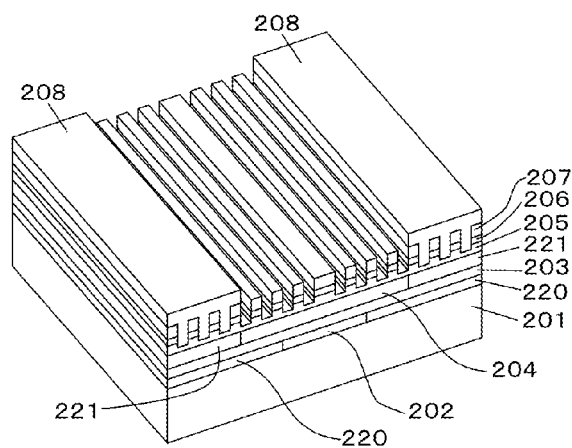

Next, as depicted in FIG. 14D, a portion of the positive photoresist (the center portion of the cavity; the center region in the direction along the optical waveguide, in this example) is removed using a conventional photolithographic technique to form a positive photoresist mask 208, covering the regions at the closer end portions in the direction along the optical waveguide (covering the surface of a partial region of the mask 207; covering the surface of the regions corresponding to the end regions of the optical waveguide).

Figure 15A:
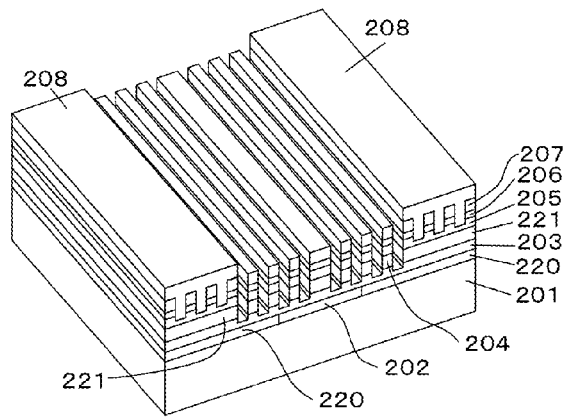
FIGS. 15A-15D are schematic perspective views illustrating the method for manufacturing one exemplary configuration of the optical device (DFB laser) according to the second embodiment.

Thereafter, as depicted in FIG. 15A, using the electron beam resist mask 207, which is exposed to the surface again, and the positive photoresist mask 208, the remained portion of the n-type InP layer 205, the n-type GaInAsP layer 204, and a portion of the n-type InP layer 203 are removed by a reactive ion etching (RIE) using a mixed gas of ethane and hydrogen, for example.

In this example, the etching is stopped at some midpoint of the n-type InP layer 203 after the n-type InP layer 205 and the n-type GaInAsP layer 204 are divided.

As a result, the diffraction grating pattern is transferred to a portion of the n-type GaInAsP layer 204 (the center portion of the cavity; the center region in the direction along the optical waveguide, in this example), and the n-type GaInAsP layer 204 is divided.

Next, a negative photoresist (OMR85 available from Tokyo Ohka Kogyo., Ltd.; having a thickness of about 300 nm) is applied on the surface, for example. Note that no deformation of the mask 207 occurs since the electron beam resist forming the mask 207, the positive photoresist forming the mask 208, and the negative photoresist are immiscible.

Figure 15B:
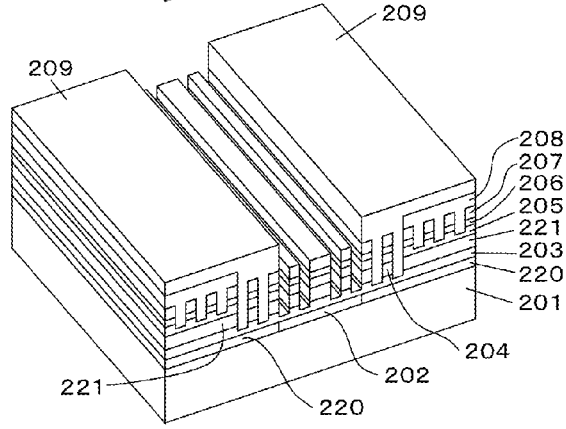

Next, as depicted in FIG. 15B, a portion of the negative photoresist (the closer center portion of the cavity included in the center portion of the cavity; the closer center region included at the center region in the direction along the optical waveguide, in this example) is removed using a conventional photolithographic technique to form a negative photoresist mask 209, covering the end portions in the direction along the optical waveguide (covering the surface of a partial region of the positive photoresist 208; covering the surface of the regions corresponding to the end regions of the optical waveguide).

Figure 15C:
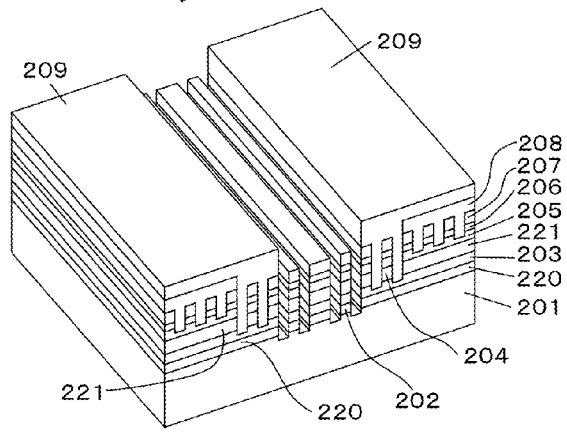

Thereafter, as depicted in FIG. 15C, using the electron beam resist mask 207, which is exposed to the surface again, the positive photoresist mask 208, and the negative photoresist mask 209, the n-type InP layer 203, the n-type GaInAsP layer 202, and a portion of the n-type InP substrate 201 are removed by a reactive ion etching (RIE) using a mixed gas of ethane and hydrogen, for example.

In this example, the etching is stopped at some midpoint of the n-type InP substrate 201 (at an etch depth of about 10 nm, in this example) after the n-type InP layer 203 and the n-type GaInAsP layer 202 are divided.

As a result, the diffraction grating pattern is transferred to a portion of the n-type GaInAsP layer 202 (the closer center portion of the cavity; the closer center region in the direction along the optical waveguide, in this example), and the n-type GaInAsP layer 202 is divided.

In this case, since the diffraction grating pattern provided in the n-type GaInAsP layer 202, the diffraction grating pattern provided in the n-type GaInAsP layer 204, and the diffraction grating pattern provided in the n-type GaInAsP layer 206 are formed using the same mask 207, a first diffraction grating layer 20, a second diffraction grating layer 30, and a third diffraction grating layer 40, which are to be formed as will be described later, will have substantially the same phase, period, and duty ratio of diffraction gratings 20A, 30A, and 40A, which are to be provided in the overlap region.

Note that, in this example, although the thickness of the n-type GaInAsP layer 202 (the thickness of the first diffraction grating layer 20) and the thickness of the n-type GaInAsP layer 206 (the thickness of the third diffraction grating layer 40) are substantially the same, the refractive index of the n-type GaInAsP layer 202 (the refractive index difference in the first diffraction grating layer 20) and the refractive index of the n-type GaInAsP layer 206 (the refractive index difference in the third diffraction grating layer 40) are different. As a result, the coupling coefficient of the diffraction grating 20A provided in the first diffraction grating layer 20 is made different from the coupling coefficient of the diffraction grating 40A provided in the third diffraction grating layer 40.

in addition, although the refractive index of the n-type GaInAsP layer 202 (the refractive index difference in the first diffraction grating layer 20) and the refractive index of the n-type GaInAsP layer 204 (the refractive index difference in the second diffraction grating layer 30) are substantially the same, the thickness of the n-type GaInAsP layer 202 (the thickness of the first diffraction grating layer 20) and the thickness of the n-type GaInAsP layer 204 (the thickness of the second diffraction grating layer 30) are different. As a result, the coupling coefficient of the diffraction grating 20A provided in the first diffraction grating layer 20 is made different from the coupling coefficient of the diffraction grating 30A provided in the second diffraction grating layer 30.

in addition, the thickness and the refractive index of the n-type GaInAsP layer 204 (the thickness of and the refractive index difference in the second diffraction grating layer 30) and the thickness and the refractive index of the n-type GaInAsP layer 206 (the thickness of and the refractive index difference in the third diffraction grating layer 40) are different. As a result, the coupling coefficient of the diffraction grating 30A provided in the second diffraction grating layer 30 is made different from the coupling coefficient of the diffraction grating 40A provided in the third diffraction grating layer 40.

Each of the diffraction grating layers 20, 30, and 40 has a constant duty ratio within the layer. In this case, since the width of the diffraction grating pattern of the etching mask (mask pattern) does not require any modification, the processing precision of the diffraction grating is stabilized. Since each of the diffraction grating layers 20, 30, and 40 has a constant thickness and refractive index difference within the layer, the coupling coefficient of the diffraction grating within the layer is constant.

Figure 15D:
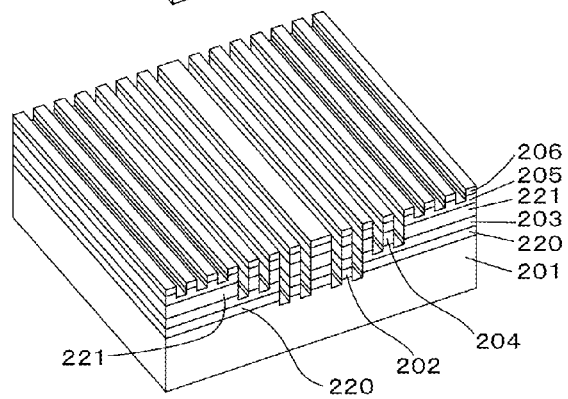

As depicted in FIG. 15D, the mask 207, the mask 208, and the mask 209 are removed from the surface using a conventional resist removal technique.

Figure 16A:
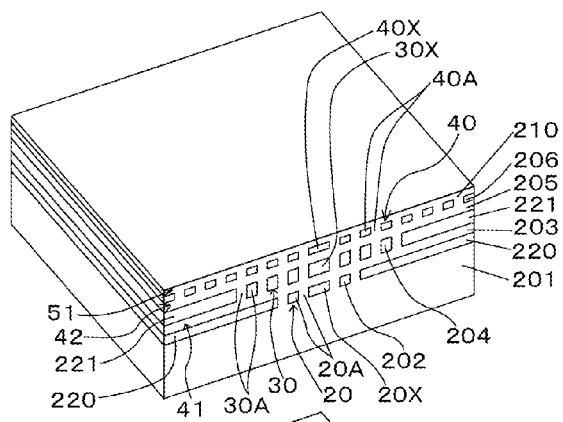
FIGS. 16A-16D are schematic perspective views illustrating the method for manufacturing one exemplary configuration of the optical device (DFB laser) according to the second embodiment.

Subsequently, as depicted in FIG. 16A, an n-doped InP layer (a layer having substantially the same refractive index as that of the substrate 201; second semiconductor layer) 210 is grown over the entire surface, using MOVPE, for example. The grooves formed by stopping the etching at some midpoint of the n-type InP layer 205, the grooves formed by stopping the etching at some midpoint of the n-type InP layer 203, and the grooves formed by stopping the etching at some midpoint of the n-type InP substrate 201 are buried with the n-type InP layer (burying layer) 210.

As a result, the discontinuous n-type GaInAsP layer 202 is buried with the n-type InP layer 210, thereby the first diffraction grating layer 20 is formed, a portion (the closer center portion of the cavity; the closer center region in the direction along the optical waveguide, in this example) of which is provided with the diffraction grating 20A (including the phase shift 20X). In addition, the discontinuous n-type GaInAsP layer 204 is buried with the n-type InP layer 210, thereby the second diffraction grating layer 30 is formed, a portion (the center portion of the cavity; the center region in the direction along the optical waveguide, in this example) of which is provided with the diffraction grating 30A (including the phase shift 30X). Furthermore, the discontinuous n-type GaInAsP layer 206 is buried with the n-type InP layer 210, thereby the third diffraction grating layer 40 is formed, the entirety (the entire length along the optical waveguide) of which is provided with the diffraction grating 40A (including the phase shift 40X).

Furthermore, the spacer layer 41 is formed between the first diffraction grating layer 20 and the second diffraction grating layer 30 by portions of the n-type InP layer 203 and the n-type InP layer 210. In addition, the spacer layer 42 is formed between the second diffraction grating layer 30 and the third diffraction grating layer 40 by portions of the n-type InP layer 205 and the n-type InP layer 210. Furthermore, the spacer layer 51 is formed over the third diffraction grating layer 40 by a portion of the n-type InP layer 210.

In this example, the thickness of the spacer layer 41 between the first diffraction grating layer 20 and the second diffraction grating layer 30 is determined by the thickness of the n-type InP layer 203 (the thickness of a portion formed over the n-type GaInAsP layer 202), and the thickness of the spacer layer 42 between the second diffraction grating layer 30 and the third diffraction grating layer 40 is determined by the thickness of the n-type InP layer 205 (the thickness of a portion formed over the n-type GaInAsP layer 204), both of which are about 15 nm. Accordingly, the diffraction grating layer 20, 30, 40 are spaced apart with the same distance.

Figure 16B:
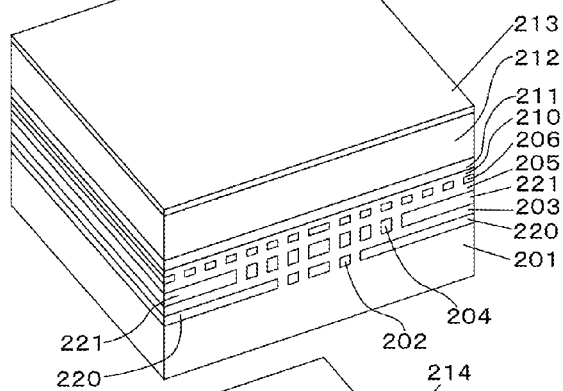

Next, as depicted in FIG. 16B, a quantum well active layer 211, a p-type doped InP cladding layer (e.g., with a thickness of about 2.5 μm) 212, and a p-type GaInAs contact layer 213 (e.g., with a thickness of about 300 nm) are staked sequentially by MOVPE, for example.

Here, the quantum well active layer 211 includes an undoped AlGaInAs quantum well layer [e.g., with a thickness of about 6.0 nm, a compressive strain amount of about 1.0%, and a composition wavelength of about 1.31 μm ($Al_{0.155}Ga_{0.17}In_{0.675}As$ layer)], and an undoped AlGaInAs barrier layer [e.g., with a composition wavelength of about 1.05 μm ($Al_{0.29}Ga_{0.184}In_{0.526}As$ layer) and a thickness of about 10 nm], the layer number of the quantum well layer being ten, and the light emission wavelength thereof being about 1310 nm.

Note that undoped AlGaInAs—SCH layers [e.g., with a composition wavelength of about 1.0 μm ($Al_{0.327}Ga_{0.147}In_{0.526}As$ layer) and a thickness of about 20 nm] may be provided over and under the quantum well active layer 211, sandwiching the quantum well active layer 211.

Figure 16C:
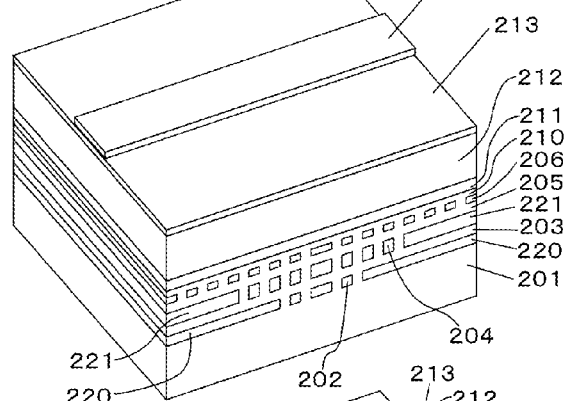

Thereafter, as depicted in FIG. 16C, a mask (e.g., a stripe shape etching mask having a thickness of about 400 nm and a width of about 1.3 μm) 214 made from $SiO_2$ may be formed over the semiconductor surface using a conventional chemical vapor deposition (CVD) and photolithography.

Figure 16D:
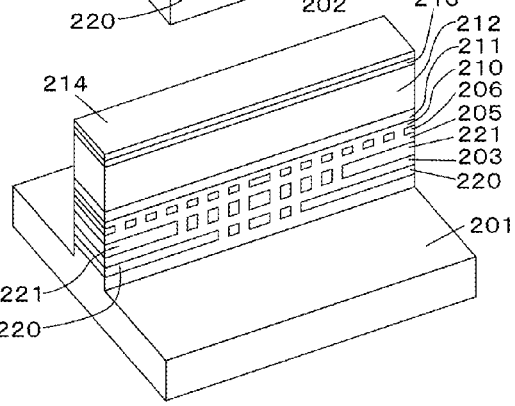

As depicted in FIG. 16D, the resultant semiconductor stack structure is etched such that the n-type InP substrate 201 is etched by about 0.7 μm, for example, using dry etch, for example, to form a stripe shape mesa structure (mesa stripes).

Next, as depicted in FIG. 17A, current blocking layers 215 made from an Fe-doped InP are grown on opposite sides of the mesa structure using MOVPE, for example, and the etching mask 214 is removed with hydrofluoric acid, for example. Thereafter, as depicted in FIG. 17B, after forming a p-side electrode 216 and an n-side electrode 217, anti-reflection coating 218 and 219 are formed on the both end face sides of the device, thereby obtaining a completed device.

Thus, according to the optical device (DFB laser) and the method for manufacturing the same of this embodiment, similar to the above-described first embodiment, in the optical device having a structure wherein the coupling coefficient of the diffraction grating is varied within the cavity, the diffraction grating can be precisely and stably fabricated, thereby improving the yield. In addition, the difference in the coupling coefficient can be increased between the increased and reduced coupling coefficient regions (the contrast of the coupling coefficient can be increased), thereby improving the device characteristics.

Furthermore, since diffraction gratings can be precisely and stably fabricated, any deviation in the device characteristics can be minimized, thereby improving the device characteristics. The controllability of the coupling coefficient and flexibility in designing the coupling coefficient are also improved.

Especially, the device of this embodiment has an advantage in that a even higher efficiency in the FM modulation is obtained and the single mode ocsillation is stabilized since the coupling coefficient is made even higher at the center, as compared to the first embodiment set forth above.

In addition, like above-described first embodiment, a substantially constant average refractive index is provided across the cavity length.

More specifically, the first region (closer center region) including the optical waveguide 1 and the diffraction grating 20A provided in the first diffraction grating layer 20, and the second region (end regions) including the optical waveguide 1 and the third semiconductor layer 220 provided in the first diffraction grating layer 20 have substantially the same equivalent refractive index, and accordingly have substantially the same propagation constant. That is, a substantially constant equivalent refractive index is provided across the cavity length, and accordingly a substantially constant propagation constant is also provided.

In addition, the first region (center region) including the optical waveguide 1 and the diffraction grating 30A provided in the second diffraction grating layer 30, and the second region (closer end regions) including the optical waveguide 1 and the third semiconductor layer 221 provided in the second diffraction grating layer 30 have substantially the same equivalent refractive index, and accordingly have substantially the same propagation constant. That is, a substantially constant equivalent refractive index is provided across the cavity length, and accordingly a substantially constant propagation constant is also provided.

Thereby, a stable single longitudinal mode operation can be achieved in a device having an increased cavity length (e.g., a device having a cavity length of about 1200 μm or more), thereby improving the device characteristics.

Note that although the diffraction grating layer 20, 30, 40 are spaced apart with the same distance in the above-described embodiment, this is not limiting. For example, in the configuration of the above-described embodiment (see FIG. 11), as depicted in FIG. 18, the spacing between the first diffraction grating layer 20 and the second diffraction grating layer 30 (the thickness of the spacer layer 41; the thickness of a portion of the n-type InP layer 203 formed over the n-type GaInAsP layer 202) may be set to about 25 nm, for example, and the spacing between the second diffraction grating layer 30 and the third diffraction grating layer 40 (the thickness of the spacer layer 42; the thickness of a portion of the n-type InP layer 205 formed over the n-type GaInAsP layer 204) may be set to about 10 nm, for example, such that the diffraction grating layer 20, 30, 40 may be spaced apart with different distances. In addition, when more than three diffraction grating layers are provided, the diffraction grating layers may be spaced apart with substantially the same distance, may be spaced apart with different distances, or a part of the diffraction grating layers may be spaced apart with different distances.

In addition, while the first diffraction grating layer 20, the second diffraction grating layer 30, and the third diffraction grating layer 40 have substantially the same refractive index difference in the above-described embodiment, this is not limiting.

For example, in the specific exemplary configuration of this embodiment, the diffraction grating 20A in the first diffraction grating layer 20 may be formed from the n-doped GaInAsP layer 202 having a composition wavelength of about 1.25 μm and the n-doped InP layer 203, and then the diffraction grating 40A in the third diffraction grating layer 40 may be formed from the n-doped GaInAsP layer 206 having a composition wavelength of about 1.15 μm and the n-doped InP layer 210, so that the refractive index difference between the semiconductor layers 202 and 203 defining the diffraction grating 20A in the first diffraction grating layer 20 becomes greater than the refractive index difference between the semiconductor layers 206 and 210 defining the diffraction grating 40A in the third diffraction grating layer 40. Thereby, the coupling coefficient difference between the increased and reduced coupling coefficient regions may be increased by increasing the coupling coefficient without increasing the thickness of the first diffraction grating layer 20.

Furthermore, for example, the refractive index difference between the semiconductor layers 202 and 203 defining the diffraction grating 20A in the first diffraction grating layer 20, or the refractive index difference between the semiconductor layers 204 and 205 defining the diffraction grating 30A in the second diffraction grating layer 30 may be made greater than the refractive index difference between the semiconductor layers 206 and 210 defining the diffraction grating 40A in the third diffraction grating layer 40, so that the first diffraction grating layer 20 or the second diffraction grating layer 30, and the third diffraction grating layer 40 have different refractive index differences. In other words, the multiple diffraction grating layers may include diffraction grating layers having different refractive index differences, and semiconductor layers defining diffraction gratings in a part of the diffraction grating layers may have different refractive index differences.

[Third Embodiment]

Now, an optical device and a method for manufacturing the same according to a third embodiment will be described with reference to FIGS. 19-24B.

Figure 19:
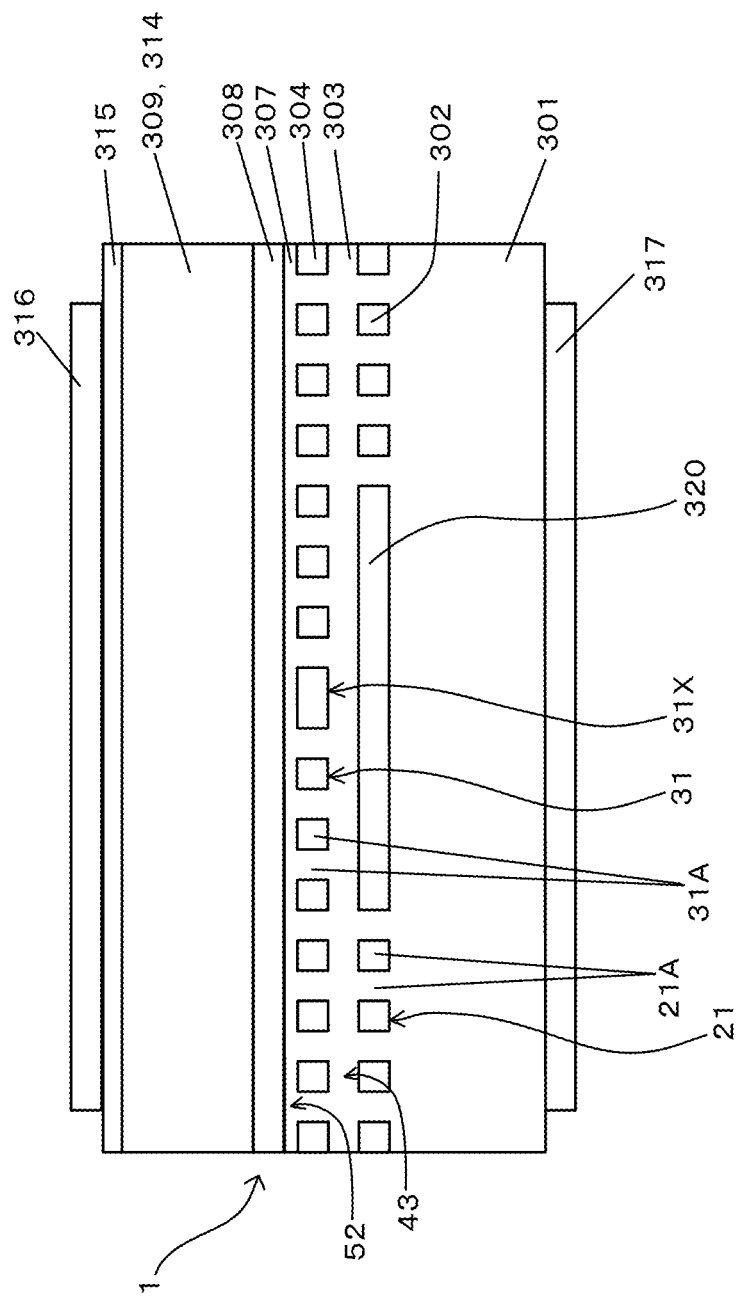
FIG. 19 is a schematic cross-sectional view illustrating a structure of an optical device (DFB laser) according to a third embodiment.

The optical device (DFB laser) and the method for manufacturing the same according to this embodiment are different from the above-described first embodiment in that the regions, where diffraction gratings 21A and 31A included in a plurality of diffraction grating layers 21 and 31 are stacked, are end regions of the direction along the optical waveguide 1, that the thicknesses of the plurality of diffraction grating layers 21 and 31 are substantially the same, and that the spacings between the plurality of diffraction grating layers 21 and 31 are different, as depicted in FIG. 19.

In other words, the optical device according to this embodiment is a distributed feed-back (DFB) laser (laser device; waveguide optical device; active optical device; light emitting device; device for code division multiplexing communication) having a structure wherein the coupling coefficient of diffraction grating is varied (distributed) within the cavity, for example, and includes an optical waveguide 1 and a plurality of (two, in this example) diffraction grating layers 21 and 31 provided along the optical waveguide 1, as depicted in FIG. 19.

As depicted in FIG. 19, the first diffraction grating layer 21 and the second diffraction grating layer 31 are provided as a plurality of diffraction grating layers, and the diffraction grating layers 21 and 31 are provided under the optical waveguide 1 (the substrate side with respect to the optical waveguide 1; one side of the optical waveguide 1).

The diffraction grating layers 21 and 31 include diffraction gratings (buried diffraction gratings; buried-type diffraction grating) 21A and 31A having discontinuous semiconductor layers (first semiconductor layers) 302 and 304, and other semiconductor layers 303 and 307 (second semiconductor layers) burying the first semiconductor layers 302 and 304, respectively, as depicted in FIG. 19. Here, the first semiconductor layers 302 and 304 have a refractive index different from that of the second semiconductor layers 303 and 307. Here, the diffraction grating 31A is configured to include a phase shift 30X (here, λ/4 phase shift).

The diffraction gratings 21A and 31A in the diffraction grating layers 21 and 31 are provided to overlap each other, and the diffraction gratings 21A and 31A at an overlap region (a corresponding region) have substantially the same phase, period, and duty ratio. Here, the term "duty ratio" refers to the ratio of the remained area after etching with respect to the period of the diffraction grating. Note that, in this embodiment, the duty ratio of each of the diffraction gratings 21A and 31A provided in the diffraction grating layers 21 and 31 is constant.

In this embodiment, as depicted in FIG. 19, the diffraction grating 21A in the first diffraction grating layer 21 is provided only at the end regions of the direction along the optical waveguide 1 (the direction of the length of the cavity). In other words, the region where the diffraction grating 21A in the first diffraction grating layer 21 is provided, is the end regions of the direction along the optical waveguide 1.

In addition, as depicted in FIG. 19, the diffraction grating 31A in the second diffraction grating layer 31 is formed along the entire length of the direction along the optical waveguide 1. In other words, the region where the diffraction grating 31A in the second diffraction grating layer 31 is provided, is the entire region of the direction along the optical waveguide 1.

Thus, in this embodiment, the length of the region where the diffraction grating 21A in the first diffraction grating layer 21 is provided in the direction along the optical waveguide 1, is shorter than the length of the region of the second diffraction grating layer 31 where the diffraction grating 31A is provided in the direction along the optical waveguide 1. The lengths of the regions where the diffraction gratings 21A and 31A are provided, are different between the first diffraction grating layer 21 and the second diffraction grating layer 31. In this case, the overlap region of the diffraction grating layers 21 and 31 is the end regions of the direction along the optical waveguide 1.

Note that, although two diffraction grating layers 21 and 31 are provided as a plurality of diffraction grating layers and the lengths of the regions of the diffraction grating layers 21 and 31 where the diffraction gratings 21A and 31A are provided, are different from each other, these are not limiting. For example, a third diffraction grating layer may be added for increasing the coupling coefficient at the end regions of the direction along the optical waveguide 1. Here, the length of the region of the third diffraction grating layer where the diffraction grating is provided in the direction along the optical waveguide 1 is the same as that of the first diffraction grating layer 21. Thus, it is suffice that the plurality of diffraction grating layers include at least two diffraction grating layers being different from each other in terms of the length of the region where the diffraction grating is provided.

As described above, in this embodiment, using buried diffraction gratings, a plurality of diffraction grating layers including region where a buried diffraction grating is provided, are stacked. At the region where maximizing the coupling coefficient is desired, a buried diffraction grating is provided in all of the stacked diffraction grating layers (two layers, i.e., the first diffraction grating layer 21 and the second diffraction grating layer 31, in this example). At the region where a reduced coupling coefficient is desired, a diffraction grating is provided only in a part of the stacked diffraction grating layers (the second diffraction grating layer 31, in this example).

More specifically, as depicted in FIG. 19, the second diffraction grating layer 31 is stacked over the first diffraction grating layer 21, and the diffraction gratings 21A and 31A in the diffraction grating layers 21 and 31 are stacked at the end regions in the direction along the optical waveguide 1. In other words, the number of stacked diffraction gratings is varied in the direction along the optical waveguide 1. As a result, the coupling coefficient at the end regions of the direction along the optical waveguide 1 is increased, whereas the coupling coefficient is decreased at the remaining region (center region) as compared to the end regions.

The DFB laser (optical semiconductor device) in accordance with the specific exemplary configuration of this embodiment is a DFB laser oscillating at the 1.56 μm wavelength band. As depicted in FIG. 19, this DFB laser includes, over an n-doped InP substrate 301, the first diffraction grating layer 21, the second diffraction grating layer 31, and the optical waveguide 1 including a quantum well active layer 308 as the waveguide core layer. The first diffraction grating layer 21 includes the buried diffraction grating 21A, which is formed by burying an n-doped GaInAsP layer [e.g., with a composition wavelength of about 1.15 μm ($Ga_{0.182}In_{0.818}As_{0.397}P_{0.603}$ layer) and a thickness of about 20 nm] 302, which is discontinuous at the end regions, with an n-doped InP layer (e.g., with a thickness of about 20 nm; burying layer) 303, wherein the n-doped GaInAsP layer 302 and the n-doped InP layer 303 have different refractive indices. The second diffraction grating layer 31 includes the buried diffraction grating 31A, which is formed by burying an n-doped GaInAsP layer [e.g., with a composition wavelength of about 1.15 μm ($Ga_{0.182}In_{0.818}As_{0.397}P_{0.603}$ layer) and a thickness of about 20 nm] 304 that is discontinuous at the entire region, with an n-doped InP layer 307, wherein the n-doped GaInAsP layer 304 and the n-doped InP layer 307 have different refractive indices.

In addition, in the specific exemplary configuration of this embodiment, as depicted in FIG. 19, the portions of the n-type InP burying layer 303 burying between the discontinuous n-type GaInAsP layer 302 constitute the diffraction grating 21A, and the portions of the n-type InP burying layer 307 burying between the discontinuous n-type GaInAsP layer 304 constitute the diffraction grating 31A.

Note that the portion of the n-type InP burying layer 303 formed over the n-type GaInAsP layer 302 constitutes a spacer layer (intermediate layer) 43 between the first diffraction grating layer 21 and the second diffraction grating layer 31, and the portion of the n-type InP burying layer 307 formed over the n-type GaInAsP layer 304 constitutes a spacer layer (cladding layer) 52 between the second diffraction grating layer 31 and the active layer 308. In addition, minimizing the thickness of the spacer layer 43 is preferred, as long as the variation of an etching depth can be permissible.

In addition, in the specific exemplary configuration of this embodiment, the thickness of the n-doped GaInAsP layer 302 constituting the diffraction grating 21A in the first diffraction grating layer 21 is about 20 nm, and the thickness of the n-doped GaInAsP layer 304 constituting the diffraction grating 31A in the second diffraction grating layer 31 is about 20 nm, so that the first diffraction grating layer 21 and the second diffraction grating layer 31 have substantially the same thickness.

Furthermore, the refractive index difference between the semiconductor layers 302 and 303 constituting the diffraction grating 21A in the first diffraction grating layer 21 is made the same as the refractive index difference between the semiconductor layers 304 and 307 constituting the diffraction grating 31A in the second diffraction grating layer 31, so that the first diffraction grating layer 21 and the second diffraction grating layer 31 have substantially the same refractive index difference.

Therefore, in the first diffraction grating layer 21 and the second diffraction grating layer 31, since the diffraction gratings 21A and 31A also have substantially the same duty ratio, the coupling coefficients of the diffraction gratings 2A and 3A are substantially the same.

In this manner, according to the configuration of this embodiment, since the contrast of the coupling coefficient can be increased by stacking the plurality of diffraction grating layers 21 and 31, devices satisfying desired needs can be achieved, with improved the device characteristics.

In addition, in the present embodiment, similar to the above-described first embodiment, in order to achieve stable single mode oscillation in a device having an increased cavity length, thereby improving the device characteristics, the region wherein the diffraction grating 21A of the first diffraction grating layer 21 is not formed (center region) is formed from a third semiconductor layer 320 made from a material different from the materials of the first and second semiconductor layers 302 and 303 constituting the diffraction grating 2A. Note that the different material may include any materials having the common constituent elements but with different compositions.

More specifically, the first diffraction grating layer 21 includes the diffraction grating 21A defined by the first and second semiconductor layers 302 and 303, and a third semiconductor layer 320 continuous with the diffraction grating 21A and made from a material different from the materials of the first and second semiconductor layers 302 and 303.

Here, in the first diffraction grating layer 21, the closer end regions include the diffraction grating 21A defined by the first and second semiconductor layers 302 and 303, while the center region wherein the diffraction grating 21A is not formed includes the third semiconductor layer 320 made from a material different from the materials of the first and second semiconductor layers 302 and 303.

Here, the third semiconductor layer 320 has a refractive index lower than that of the first semiconductor layer 302 but higher than that of the second semiconductor layer 303.

Specifically, the third semiconductor layer 320 is made from a material with a composition different from that of the first semiconductor layer 302.

More specifically, in the present embodiment, the first semiconductor layer 302 is an n-doped GaInAsP layer [e.g., with a composition wavelength of about 1.15 μm ($Ga_{0.182}In_{0.818}As_{0.397}P_{0.603}$ layer) and a thickness of about 20 nm], as described above. In contrast, the third semiconductor layer 320 is an n-doped GaInAsP layer [e.g., with a composition wavelength of about 1.03 μm ($Ga_{0.092}In_{0.908}As_{0.201}P_{0.799}$ layer) and a thickness of about 20 nm].

As described above, in the present embodiment, although the first semiconductor layer 302 and the third semiconductor layer 320 are both n-doped GaInAsP layers, the composition of the third semiconductor layer 320 is modified to include less As, as compared to the first semiconductor layer 302, so as to reduce the refractive index and so as to be lattice matched to InP.

More specifically, the n-doped $Ga_{0.182}In_{0.818}As_{0.397}P_{0.603}$ layer as the first semiconductor layer 302 has a refractive index of about 3.307 at a wavelength of about 1550 nm. In contrast, the n-doped $Ga_{0.092}In_{0.908}As_{0.201}P_{0.799}$ layer as the third semiconductor layer 320 has a refractive index of about 3.237 at a wavelength of about 1550 nm. In this manner, the third semiconductor layer 320 has a refractive index lower than that of the first semiconductor layer 302.

In addition, the third semiconductor layer 320 is made from a material different from that of the second semiconductor layer 303.

More specifically, in the present embodiment, the second semiconductor layer 303 is an n-doped InP layer (e.g., with a thickness of about 20 nm), as described above. In contrast, the third semiconductor layer 320 is an n-doped GaInAsP layer [e.g., with a composition wavelength of about 1.03 μm ($Ga_{0.092}In_{0.908}As_{0.201}P_{0.799}$ layer) and a thickness of about 20 nm].

In such a case, the n-doped InP layer as the second semiconductor layer 303 has a refractive index of about 3.167 at a wavelength of about 1550 nm. In contrast, the n-doped $Ga_{0.092}In_{0.908}As_{0.201}P_{0.799}$ layer as the third semiconductor layer 320 has a refractive index of about 3.237 at a wavelength of about 1550 nm. In this manner, the third semiconductor layer 320 has a refractive index higher than that of the second semiconductor layer 303.

Furthermore, in the present embodiment, the refractive indices of the first and second semiconductor layers 302 and 303 defining the diffraction grating 21A of the first diffraction grating layer 21 are about 3.307 and about 3.167, respectively, and their average refractive index is about 3.237, when the duty ratio of the diffraction grating 21A is about 50%. In contrast, the refractive index of the third semiconductor layer 320 continuous with the diffraction grating 21A of the first diffraction grating layer 21 is about 3.237. In this manner, the first diffraction grating layer 21 has a substantially constant average refractive index across the cavity length. In this case, the first region (closer end regions) including the optical waveguide 1 and the diffraction grating 21A provided in the first diffraction grating layer 21, and the second region (center region) including the optical waveguide 1 and the third semiconductor layer 320 have substantially the same equivalent refractive index, and accordingly have substantially the same propagation constant. That is, a substantially constant equivalent refractive index is provided across the cavity length, and accordingly a substantially constant propagation constant is also provided. This can enable a stable single mode oscillation in a device having an increased cavity length, thereby improving the device characteristics.

The details of other elements are similar to the configuration and the specific exemplary configuration of the above-described first embodiment, and descriptions thereof will be omitted.

Now, a method for manufacturing the DFB laser according to the specific exemplary configuration of this embodiment will be described with reference to FIGS. 20A-24B.

Figure 20A:
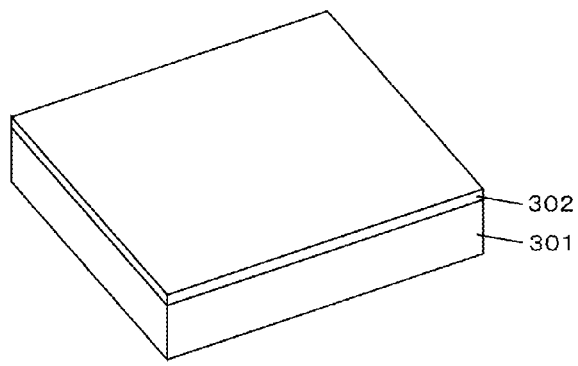
FIGS. 20A-20D are schematic perspective views illustrating a method for manufacturing one exemplary configuration of the optical device (DFB laser) according to the third embodiment.

Firstly, as depicted in FIG. 20A, an n-doped GaInAsP layer [e.g., with a composition wavelength of about 1.15 μm ($Ga_{0.182}In_{0.818}As_{0.397}P_{0.603}$) and a thickness of about 20 nm; a layer with a refractive index different from that of the substrate; first semiconductor layer] 302 is formed over an n-doped InP substrate 301, using metal-organic vapor phase epitaxy (MOVPE), for example. Note that an n-type InP cladding layer may be formed between the n-type InP substrate 301 and the n-type GaInAsP layer 302.

Figure 20B:
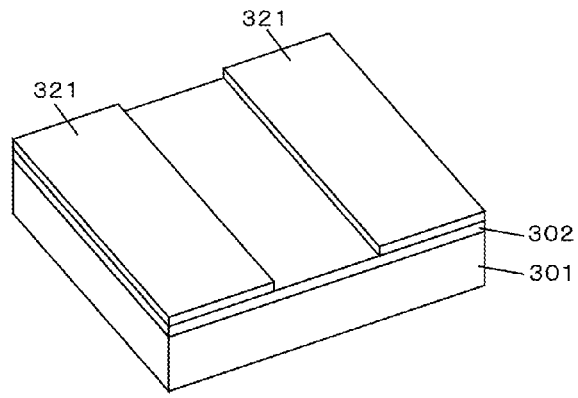

Subsequently, as depicted in FIG. 20B, an $SiO_2$ mask 321 is formed with chemical vapor deposition (CVD) and photolithography, for example.

Figure 20C:
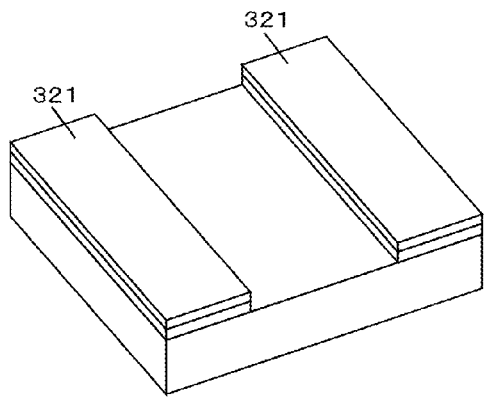

Subsequently, as depicted in FIG. 20C, using this $SiO_2$ mask 321, a portion of the n-doped GaInAsP layer 302 is etched by means of selective wet etching, for example.

Figure 20D:
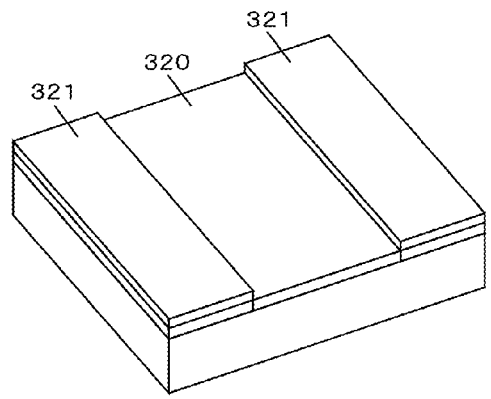

Thereafter, as depicted in FIG. 20D, with the $SiO_2$ mask 321 being remained, an n-doped GaInAsP layer [e.g., with a composition wavelength of about 1.03 μm ($Ga_{0.092}In_{0.908}As_{0.201}P_{0.799}$ layer) and a thickness of about 20 nm; third semiconductor layer] 320 that has a composition different from that of the n-doped GaInAsP layer 302 (i.e., made from a different material) is buried in the regions (openings) defined by removing the n-doped GaInAsP layer 302, by means of selective growth using MOVPE, for example, such that the n-doped GaInAsP layer 320 is continuous with the n-doped GaInAsP layer 302.

Figure 21A:
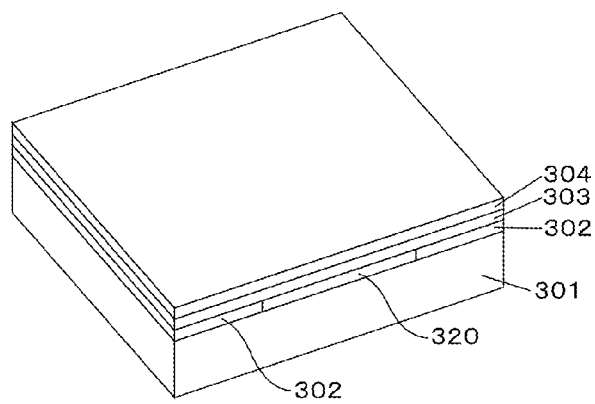
FIGS. 21A-21D are schematic perspective views illustrating a method for manufacturing one exemplary configuration of the optical device (DFB laser) according to the third embodiment.

Subsequently, as depicted in FIG. 21A, after removing the $SiO_2$ mask 321 with buffered hydrofluoric acid, an n-doped InP layer (e.g., layer having a thickness of about 20 nm and substantially the same refractive index as the substrate; second semiconductor layer) 303 and an n-doped GaInAsP layer [e.g., with a composition wavelength of about 1.15 μm ($Ga_{0.182}In_{0.818}As_{0.397}P_{0.693}$ layer) and a thickness of about 20 nm; a layer having a refractive index different from that of the substrate; first semiconductor layer] 304 are sequentially stacked over the entire surface, using metal-organic vapor phase epitaxy (MOVPE), for example.

Figure 21B:
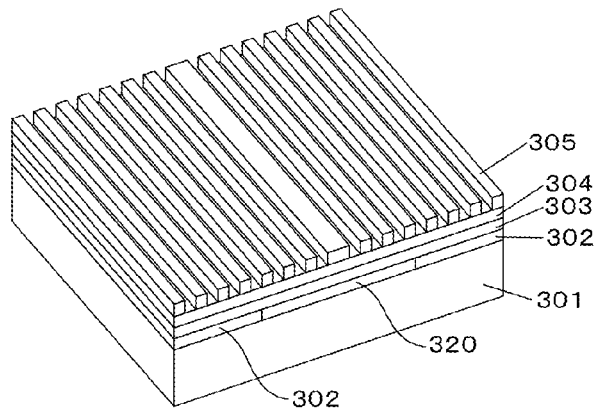

Next, as depicted in FIG. 21B, a mask 305 having a diffraction grating pattern and made from an electron beam resist (ZEP520 available from Zeon Corporation) is formed on the surface of the n-type GaInAsP layer 304 by electron beam exposure technique, for example. Note that the diffraction grating pattern formed in the mask 305 includes a pattern for generating a phase shift 31X having a phase of Π radian (λ/4 phase shift) at the center of the cavity for each device.

Figure 21C:
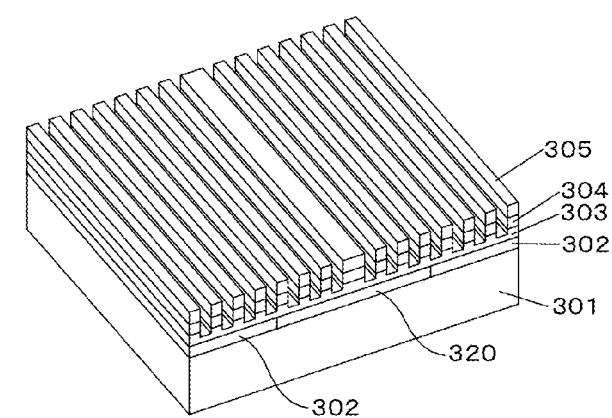

Subsequently, as depicted in FIG. 21C, the n-type GaInAsP layer 304 and a portion of n-type InP layer 303 are removed using the mask 305 by a reactive ion etching (RIE) using a mixed gas of ethane and hydrogen, for example.

In this example, the etching is stopped at some midpoint of the n-type InP layer 303 after the n-type GaInAsP layer 304 is divided. As a result, the diffraction grating pattern is transferred to the entire surface of the n-type GaInAsP layer 304, and the n-type GaInAsP layer 304 is divided.

Next, a positive photoresist (OFPR8600 available from Tokyo Ohka Kogyo., Ltd.; e.g., with a thickness of about 300 nm) is applied on the surface, for example. Note that no deformation of the mask 305 occurs since the electron beam resist forming the mask 305 and the positive photoresist are immiscible.

Figure 21D:
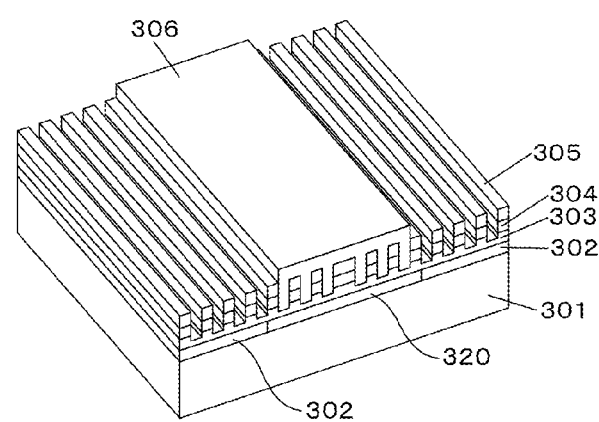

Next, as depicted in FIG. 21D, a portion of the positive photoresist (the end portions of the cavity; the end regions of the direction along the optical waveguide, in this example) is removed using a conventional photolithographic technique to form a positive photoresist mask 306, covering the center portion in the direction along the optical waveguide (covering the surface of a partial region of the mask 305; covering the surface of the region corresponding to the center region of the optical waveguide).

Figure 22A:
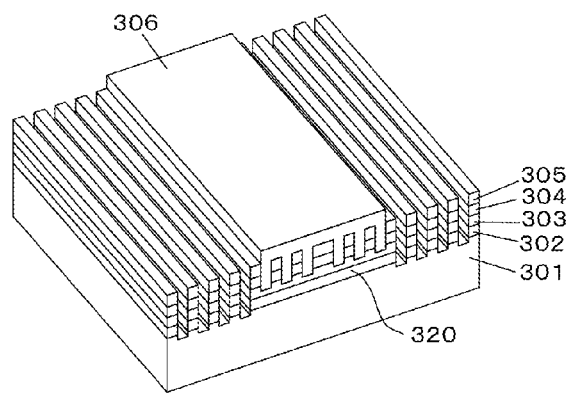
FIGS. 22A-22D are schematic perspective views illustrating a method for manufacturing one exemplary configuration of the optical device (DFB laser) according to the third embodiment.

Thereafter, as depicted in FIG. 22A, using the electron beam resist mask 305, which is exposed to the surface again, and the positive photoresist mask 306, the remained portion of the n-type InP layer 303, the n-type GaInAsP layer 302, and a portion of the n-type InP substrate 301 are removed by a reactive ion etching (RIE) using a mixed gas of ethane and hydrogen, for example.

In this example, the etching is stopped at some midpoint of the n-type InP substrate 301 (at an etch depth of about 10 nm, in this example) after the n-type InP layer 303 and the n-type GaInAsP layer 302 are divided.

As a result, the diffraction grating pattern is transferred to portions of the n-type GaInAsP layer 302 (the end portions of the cavity; the end regions of the direction along the optical waveguide, in this example), and the n-type GaInAsP layer 302 is divided.

In this case, since the diffraction grating pattern provided in the n-type GaInAsP layer 304 and the diffraction grating pattern provided in the n-type GaInAsP layer 302 are formed using the same mask 305, the diffraction gratings 21A and 31A in the overlap region of a first diffraction grating layer 21 and a second diffraction grating layer 31, which are to be formed as will be described later, will have the substantially same phase, period, and duty ratio.

Note that, in this example, the thickness and the refractive index of the n-type GaInAsP layer 302 (the thickness of and the refractive index difference in the first diffraction grating layer 21) are substantially the same as the thickness and the refractive index of the n-type GaInAsP layer 304 (the thickness of and the refractive index difference in the second diffraction grating layer 31). As a result, the coupling coefficient of the diffraction grating 21A provided in the first diffraction grating layer 21 is substantially the same as the coupling coefficient of the diffraction grating 31A provided in the second diffraction grating layer 31.

Each of the diffraction grating layers 21 and 31 has a constant duty ratio within the layer. In this case, since the width of the diffraction grating pattern of the etching mask (mask pattern) does not require any modification, the processing precision of the diffraction grating is stabilized. Since each of the diffraction grating layers 21 and 31 has a constant thickness and refractive index difference within the layer, the coupling coefficient of the diffraction grating within the layer is constant.

Figure 22B:
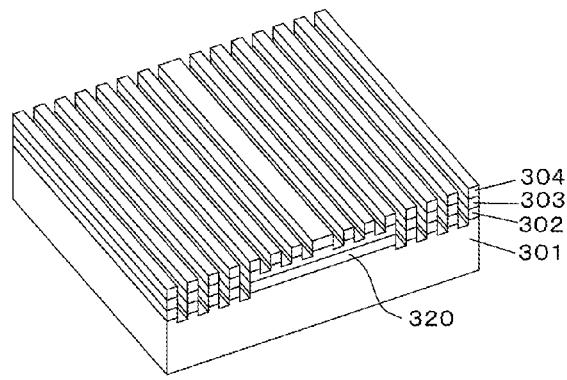

As depicted in FIG. 22B, the mask 305 and the mask 306 are removed from the surface using a conventional resist removal technique.

Figure 22C:
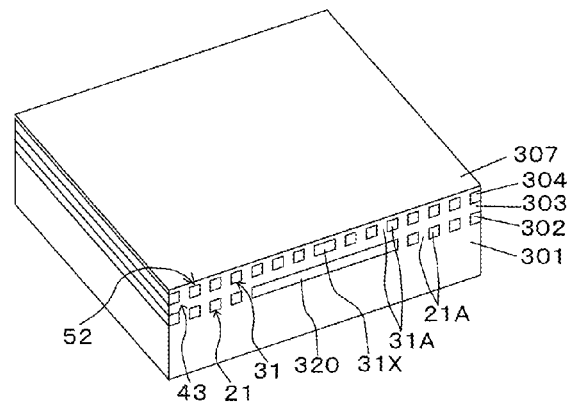

Subsequently, as depicted in FIG. 22C, an n-doped InP layer (a layer having substantially the same refractive index as that of the refractive index of the substrate 301; second semiconductor layer) 307 is grown over the entire surface, using MOVPE, for example. The grooves formed by stopping the etching at some midpoint of the n-type InP layer 303 and the grooves formed by stopping the etching at some midpoint of the n-type InP substrate 301 are buried with the n-type InP layer (burying layer) 307.

As a result, the discontinuous n-type GaInAsP layer 302 is buried with the n-type InP layer 307, thereby the first diffraction grating layer 21 is formed, portions (the end portions of the cavity; the end regions of the direction along the optical waveguide, in this example) of which are provided with the diffraction grating 21A. In addition, the discontinuous n-type GaInAsP layer 304 is buried with the n-type InP layer 307, thereby the second diffraction grating layer 31 is formed, the entirety (the entire length along the optical waveguide) of which is provided with the diffraction grating 31A (including the phase shift 31X).

Furthermore, the spacer layer 43 is formed between the first diffraction grating layer 21 and the second diffraction grating layer 31 by portions of the n-type InP layer 303 and the n-type InP layer 307. In addition, the spacer layer 52 is formed over the second diffraction grating layer 31 by a portion of the n-type InP layer 307.

Figure 22D:
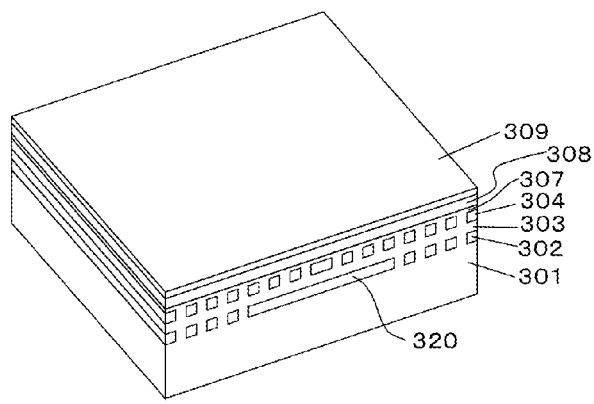

Next, as depicted in FIG. 22D, a quantum well active layer 308 and a p-type doped InP cladding layer (e.g., with a thickness of about 250 nm) 309 are staked sequentially by MOVPE, for example.

Here, the quantum well active layer 308 includes an undoped GaInAsP quantum well layer [e.g., with a thickness of about 5.1 nm, a compressive strain amount of about 1.0%, and a composition wavelength of about 1.56 µm ($Ga_{0.271}In_{0.729}As_{0.894}P_{0.106}$ layer)], and an undoped GaInAsP barrier layer (e.g., with a composition wavelength of about 1.2 µm ($Ga_{0.217}In_{0.783}As_{0.472}P_{0.528}$ layer) and a thickness of about 10 nm], the layer number of the quantum well layer being six, and the light emission wavelength thereof being about 1560 nm.

Note that undoped GaInAsP—SCH layers (e.g., with a wavelength of about 1.15 µm and a thickness of about 20 nm) may be provided over and under the quantum well active layer 308, sandwiching the quantum well active layer 308.

Figure 23A:
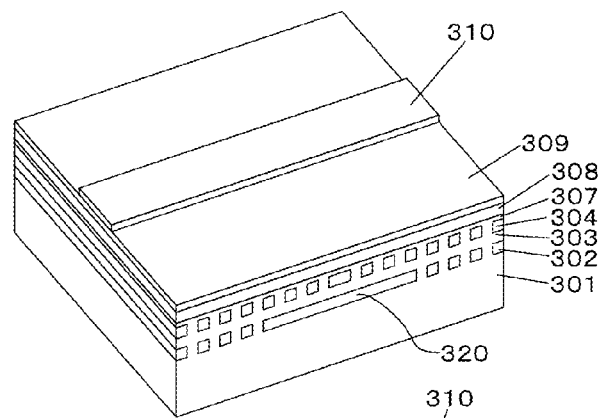
FIGS. 23A-23D are schematic perspective views illustrating a method for manufacturing one exemplary configuration of the optical device (DFB laser) according to the third embodiment.

Thereafter, as depicted in FIG. 23A, a mask (e.g., a stripe shape etching mask having a thickness of about 400 nm and a width of about 1.6 µm) 310 made from $SiO_2$ may be formed over the semiconductor surface using a conventional chemical vapor deposition (CVD) and photolithography.

Figure 23B:
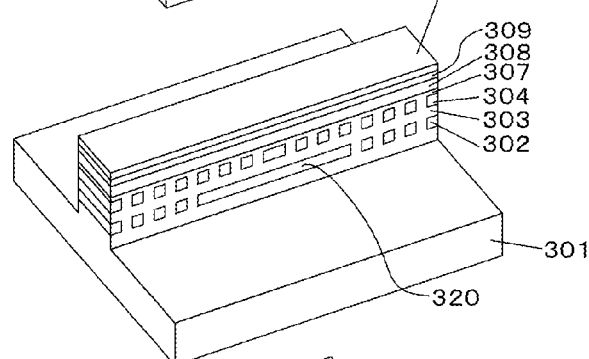

As depicted in FIG. 23B, the resultant semiconductor stack structure is etched such that the n-type InP substrate 301 is etched by about 0.7 µm, for example, using dry etching, for example, to form a stripe mesa shape structure (mesa stripes).

Figure 23C:
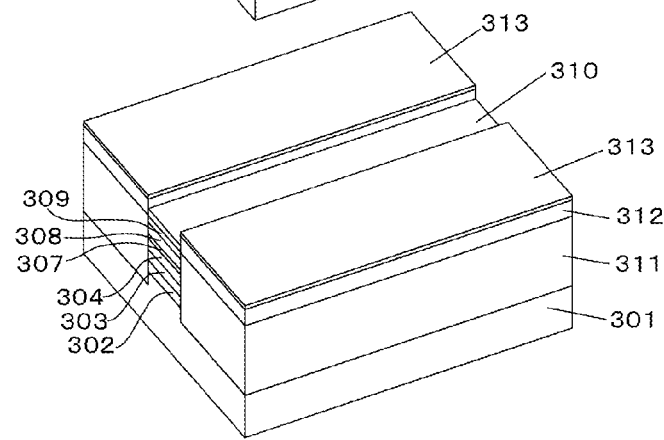
Figure 23D:
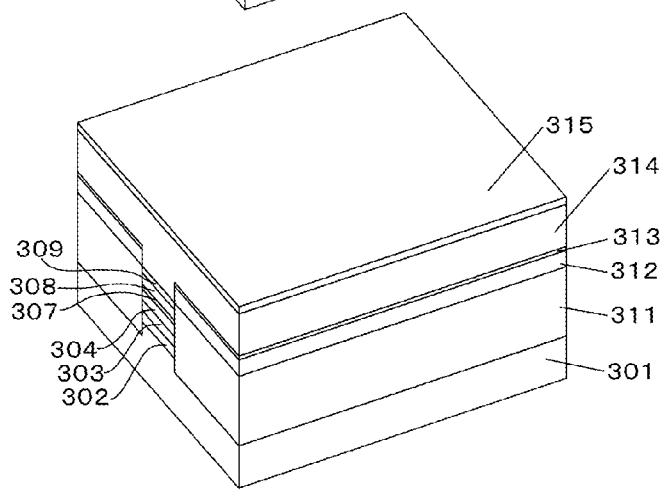

Next, as depicted in FIG. 23C, current blocking layers, made from a p-type InP layer 311, an n-type InP layer 312, and a p-type InP layer 313, are grown on opposite sides of the mesa structure using MOVPE, for example, and the etching mask 310 is removed with hydrofluoric acid, for example. Thereafter, as depicted in FIG. 23D, a p-type InP cladding layer (e.g., with a thickness of about 2.2 µm) 314 and a p-type GaInAs contact layer (e.g., with a thickness of about 300 nm) 315 are sequentially grown using MOVPE, for example.

Figure 24A:
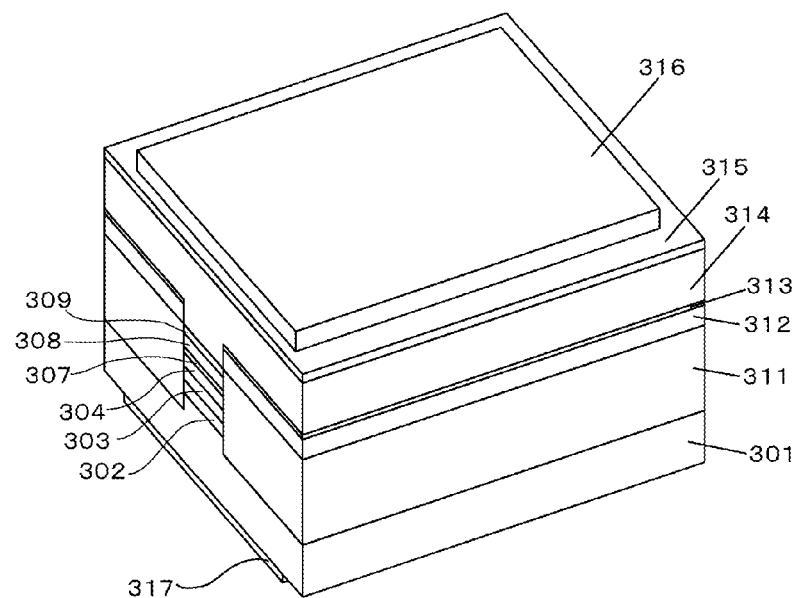
FIGS. 24A and 24B are schematic perspective views illustrating the method for manufacturing one exemplary configuration of the optical device (DFB laser) according to the third embodiment.
Figure 24B:
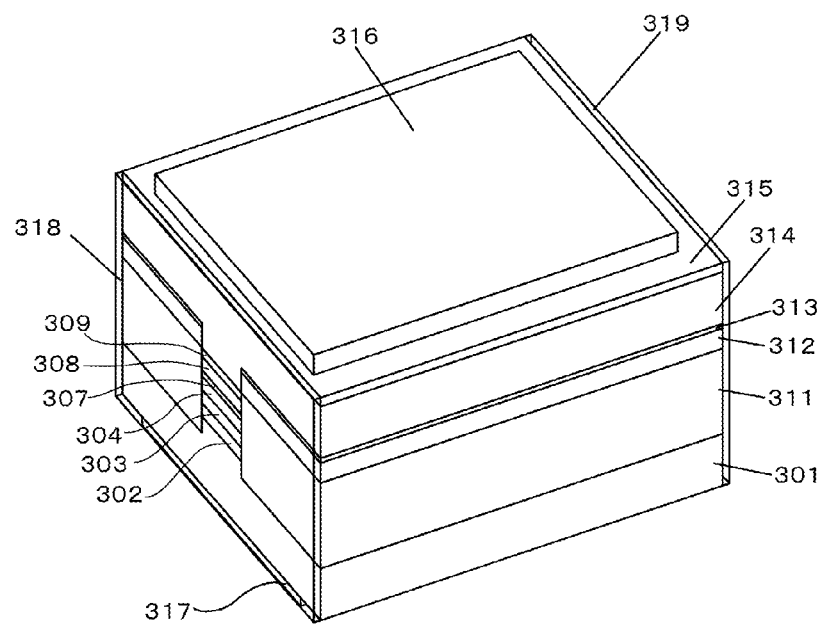

As depicted in FIG. 24A, after forming a p-side electrode 316 and an n-side electrode 317, as depicted in FIG. 24B, anti-reflective coatings 318 and 319 are formed on the both end face sides of the device, thereby obtaining a completed device.

In the above-described manufacturing method, in place of forming the mask 305 made from an electron beam resist (ZEP520 available from Zeon Corporation) by electron beam exposure technique, a positive photoresist (OFPR8600 available from Tokyo Ohka Kogyo., Ltd.) may be formed by two-beam interference exposure technique. Additionally, a negative photoresist (OMR85 available from Tokyo Ohka Kogyo., Ltd.; having a thickness of about 300 nm) may be formed, in place of the positive photoresist (OFPR8600 available from Tokyo Ohka Kogyo., Ltd.; e.g., with a thickness of about 300 nm).

Thus, according to the optical device (DFB laser) and the method for manufacturing the same of this embodiment, similar to the above-described first embodiment, in the optical device having a structure wherein the coupling coefficient of the diffraction grating is varied within the cavity, the diffraction grating can be precisely and stably fabricated, thereby improving the yield. In addition, the difference in the coupling coefficient can be increased between the increased and reduced coupling coefficient regions (the contrast of the coupling coefficient can be increased), thereby improving the device characteristics.

Furthermore, since the diffraction grating can be precisely and stably fabricated, any variation in the device characteristics can be minimized, thereby improving the device characteristics. The controllability of the coupling coefficient and flexibility in designing the coupling coefficient are also improved.

Especially, in the device of this embodiment, since the coupling coefficient is increased on device end face sides, the spatial hole burning along the cavity can be reduced even if the cavity is fabricated longer. As a result, a stable single longitudinal mode operation can be maintained with a higher optical output, and the oscillation linewidth of the laser can be further narrowed.

Therefore, for example, the device of this embodiment may be applied to a device having the structure as disclosed in G. Morthier et al., "A New DFB-Laser Diode with Reduced Spatial Hole Burning", IEEE Photonics Technology Letter, vol. 2, no. 6, June 1990, pp. 388-390, the entire content of which is incorporated herein by reference, namely, the structure wherein the coupling coefficient is reduced toward the center of the cavity, thereby preventing the spatial hole burning along the cavity, and improving the stability of the longitudinal mode upon a higher power optical output.

Such a device may be used as a laser light source for a coherent optical transmission system, or a system which requires a laser light source with a very narrow oscillation linewidth of about 100 to about 500 kHz, such as a multilevel modulation optical communication system, for example.

In order to narrow the oscillation linewidth of a laser, the laser should be able to operate in a single longitudinal mode, like a DFB laser, and the cavity length of the laser should be increased to further narrow the linewidth. For example, a linewidth of about 1 MHz or less can be achieved with a laser having a cavity length of about 1000 μm or more.

Furthermore, since the linewidth is proportional to the inverse of the optical output of the laser, a narrower linewidth can be achieved by operating the laser with a higher optical output. Accordingly, an even narrower linewidth can be achieved by further increasing the cavity length of the laser and operating the laser at an optical output as high as possible. However, increasing the cavity length excessively may reduce the gain difference between the main and side modes due to the influence of the spatial hole burning along the cavity in a DFB laser during a high optical output operation, which may deteriorate the single mode stability, leading to a sudden broadening of the linewidth. Accordingly, the structure that can reduce the influence of the spatial hole burning along the cavity during a high optical output operation, as set forth above, is effective in such cases.

in addition, similar to the above-described first embodiment, the average refractive index becomes substantially constant across the cavity length, and the first region (closer end regions) including the optical waveguide 1 and the diffraction grating 21A provided in the first diffraction grating layer 21, and the second region (center region) including the optical waveguide 1 and the third semiconductor layer 320 have substantially the same equivalent refractive index, and accordingly have substantially the same propagation constant. That is, a substantially constant equivalent refractive index is provided across the cavity length, and accordingly a substantially constant propagation constant is also provided. Thereby, a stable single longitudinal mode operation can be achieved in a device having an increased cavity length (e.g., a device having a cavity length of about 1200 μm or more), thereby improving the device characteristics.

[Fourth Embodiment]

Now, an optical device and a method for manufacturing the same according to a fourth embodiment will be described with reference to FIGS. 25A to 28B.

The optical device (DFB laser) and the method for manufacturing the same according to this embodiment has a different configuration from that of the above-described first embodiment (see FIG. 1), for the purpose of achieving the substantially constant equivalent refractive index, accordingly achieving a substantially constant propagation constant along the cavity direction, in order to achieve stable single mode oscillation in a device having an increased cavity length, thereby improving the device characteristics.

More specifically, in the above-described first embodiment, the regions (closer end regions) wherein the diffraction grating 2A of the first diffraction grating layer 2 is not formed are formed from a third semiconductor layer 120 made from a material different from the materials of the first and second semiconductor layers 102 and 103 defining the diffraction grating 2A, thereby obtaining the substantially constant equivalent refractive index, accordingly obtaining a substantially constant propagation constant.

Figure 27A:
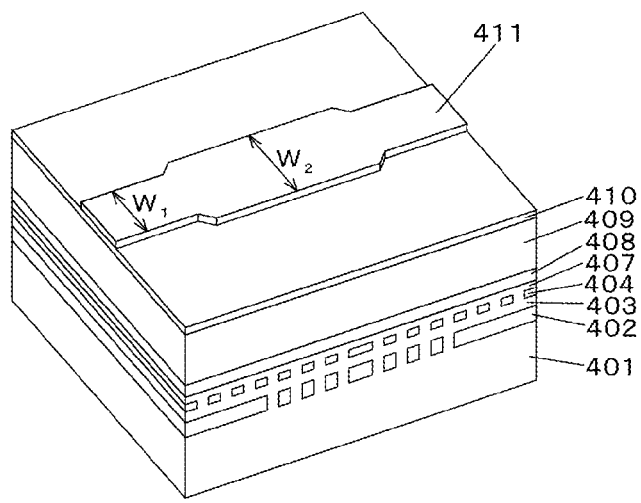
FIGS. 27A-27C are schematic perspective views illustrating a method for manufacturing one exemplary configuration of the optical device (DFB laser) according to the fourth embodiment.
Figure 27B:
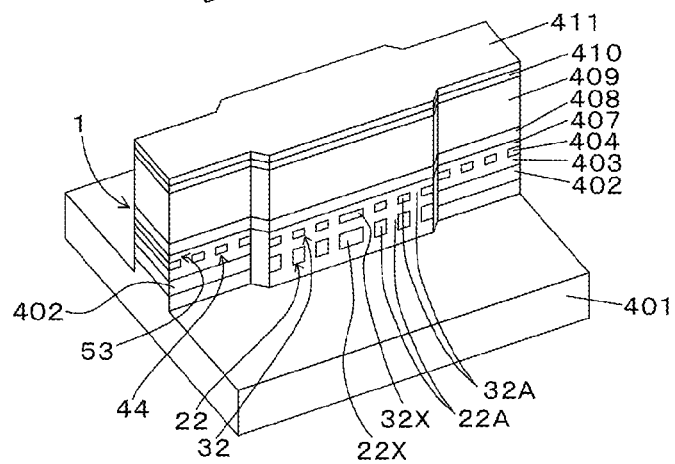

In contrast, in the present embodiment, as depicted in FIG. 27B, in a first diffraction grating layer 22, the width (optical waveguide width; width of the mesa structure) of a first region (center region) including a first semiconductor layer 102 extending so as to being continuous with diffraction grating 22A and including the optical waveguide 1 and a diffraction grating 22A provided in the first diffraction grating layer 22 is made different from the width of a second region (closer end regions) including the optical waveguide 1 and the first semiconductor layer 102 continuous with the diffraction grating 22A, thereby obtaining the substantially constant equivalent refractive index, accordingly obtaining a substantially constant propagation constant.

More specifically, in the present embodiment, the first semiconductor layer 102 extends in the region wherein the diffraction grating 22A of the first diffraction grating layer 22 is not formed, so as to being continuous with diffraction grating 22A. Furthermore, the width of the first region including the optical waveguide 1 and the diffraction grating 22A provided in the first diffraction grating layer 22 is made different from the width of the second region including the optical waveguide 1 and the first semiconductor layer 102 continuous with the diffraction grating 22A. In other words, the region having a greater number of the stacked layers of diffraction grating (first region; the center region with the discontinuous first semiconductor layer 102 in this example) has a optical waveguide width (width of the mesa structure) greater than the width of the region having a smaller number of the stacked layers of diffraction grating (second region; the closer end regions with the continuous first semiconductor layer 102 in this example). If there are three or more regions with different numbers of stacked layers of diffraction grating, the width of the optical waveguide (width of the mesa structure) may be increased as the number of stacked layers of diffraction grating increases.

The DFB laser (optical semiconductor device) in accordance with the specific exemplary configuration of this embodiment is a DFB laser oscillating at the 1.55 μm wavelength band. As depicted in FIG. 27B, this DFB laser includes, over an n-doped InP substrate 401, the first diffraction grating layer 22, the second diffraction grating layer 32, and the optical waveguide 1 including a quantum well active layer 408 as the waveguide core layer. The first diffraction grating layer 22 includes the buried diffraction grating 22A, which is formed by burying an n-doped GaInAsP layer [e.g., with a composition wavelength of about 1.25 μm ($Ga_{0.251}In_{0.749}As_{0.543}P_{0.457}$ layer) and a thickness of about 25 nm; first semiconductor layer] 402, which is discontinuous at the center region, with an n-doped InP layer (e.g., with a thickness of about 15 nm; burying layer; second semiconductor layer) 403, and an n-doped GaInAsP layer [e.g., with a composition wavelength of about 1.25 μm ($Ga_{0.251}In_{0.749}As_{0.543}P_{0.457}$ layer) and a thickness of about 25 nm; first semiconductor layer] 402 extending continuously with the buried diffraction grating 22A, wherein the n-doped GaInAsP layer 402 and the n-doped InP layer 403 have different refractive indices. The second diffraction grating layer 32 includes the buried diffraction grating 32A, which is formed by burying an n-doped GaInAsP layer (e.g., with a composition wavelength of about 1.15 μm ($Ga_{0.182}In_{0.818}As_{0.397}P_{0.603}$) and a thickness of about 20 nm; first semiconductor layer) 404, which is discontinuous at the entire region, with an n-doped InP layer 407, wherein the n-doped GaInAsP layer 404 and the n-doped InP layer 407 have different refractive indices.

In addition, in order to achieve stable single mode oscillation in a device having an increased cavity length, thereby improving the device characteristics, the width of the mesa structure (active layer width) of the first region including the optical waveguide 1 and the diffraction grating 22A provided in the first diffraction grating layer 22 is set to about 1.6 μm, whereas width of the mesa structure (active layer width) of the second region including the optical waveguide 1 and the first semiconductor layer 402 continuous with the diffraction grating 22A is set to about 1.5 μm. In such a case, the first region has an equivalent refractive index of about 3.1898, while the second region has an equivalent refractive index of about 3.1896, these regions having substantially the same equivalent refractive index, and accordingly having substantially the same propagation constant. That is, a substantially constant equivalent refractive index is provided across the cavity length, and accordingly a substantially constant propagation constant is also provided. This can enable a stable single mode oscillation in a device having an increased cavity length, thereby improving the device characteristics.

Now, a method for manufacturing the DFB laser according to the specific exemplary configuration of this embodiment will be described with reference to FIGS. 25A-28B.

Figure 25A:
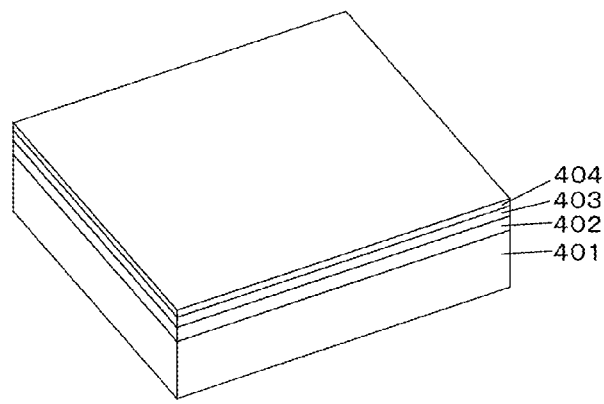
FIGS. 25A-25D are schematic perspective views illustrating a method for manufacturing one exemplary configuration of the optical device (DFB laser) according to a fourth embodiment.

Firstly, as depicted in FIG. 25A, over an n-doped InP substrate 401, an n-doped GaInAsP layer [e.g., with a composition wavelength of about 1.25 μm ($Ga_{0.251}In_{0.749}As_{0.543}P_{0.457}$ layer) and a thickness of about 25 nm; a layer having a refractive index different from that of the substrate 401; first semiconductor layer] 402, an n-doped InP layer (e.g., with a thickness of about 15 nm; a layer having substantially the same refractive index as that of the substrate 401; second semiconductor layer) 403, and an n-doped GaInAsP layer [e.g., with a composition wavelength of about 1.15 μm ($Ga_{0.182}In_{0.818}As_{0.397}P_{0.603}$ layer) and a thickness of about 20 nm; a layer having a refractive index different from that of the substrate 401; first semiconductor layer] 404 are sequentially stacked, using a metal organic vapor phase epitaxy (MOVPE), for example. Note that an n-doped InP cladding layer may be formed between the n-doped InP substrate 401 and the n-doped GaInAsP layer 402.

Figure 25B:
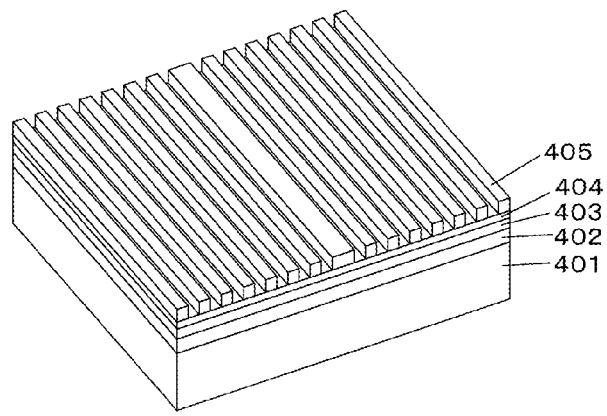

Next, as depicted in FIG. 25B, a mask 405 having a diffraction grating pattern and made from an electron beam resist (ZEP520 available from Zeon Corporation) is formed on the surface of the n-type GaInAsP layer 404 by electron beam exposure technique, for example.

Note that the diffraction grating pattern formed in the mask 405 includes a pattern for forming phase shifts 2X and 3X having a phase of π radian (λ/4 phase shift) at the center of the cavity for each device.

Figure 25C:
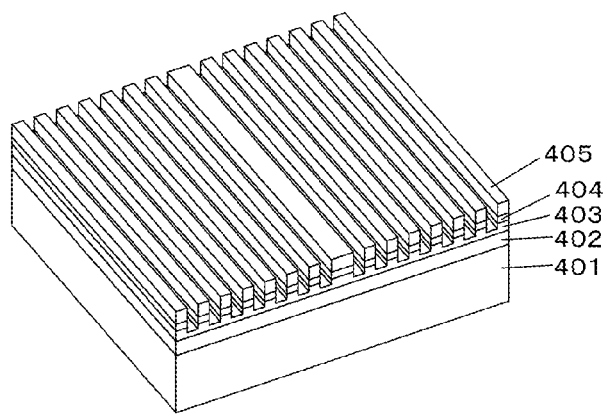

Subsequently, as depicted in FIG. 25C, the n-type GaInAsP layer 404 and a portion of n-type InP layer 403 are removed using the mask 405 by a reactive ion etching (RIE) using a mixed gas of ethane and hydrogen, for example.

in this example, the etching is stopped at some midpoint of the n-type InP layer 403 after the n-type GaInAsP layer 404 is divided. As a result, the diffraction grating pattern is transferred to the entire surface of the n-type GaInAsP layer 404, and the n-type GaInAsP layer 404 is divided.

Next, a positive photoresist (OFPR8600 available from Tokyo Ohka Kogyo., Ltd.; e.g., with a thickness of about 300 nm, for example) is applied on the surface, for example. Note that no deformation of the mask 405 occurs since the electron beam resist forming the mask 405 and the positive photoresist are immiscible.

Figure 25D:
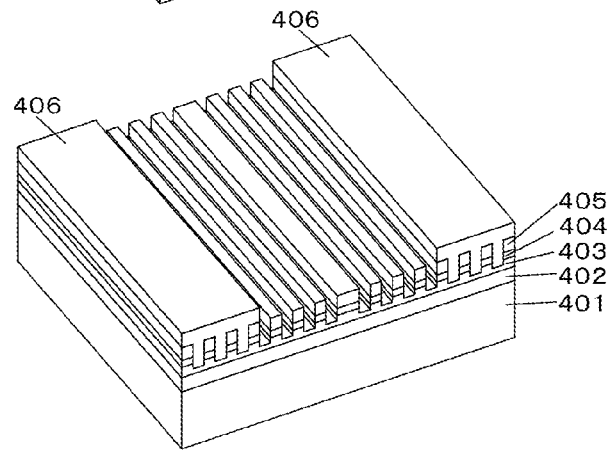

Next, as depicted in FIG. 25D, a portion of the positive photoresist (the center portion of the cavity; the center region in the direction along the optical waveguide, in this example) is removed using a conventional photolithographic technique to form a positive photoresist mask 406, covering the end portions in the direction along the optical waveguide (covering the surface of a partial region of the mask 405; covering the surface of the regions corresponding to the end regions of the optical waveguide).

Figure 26A:
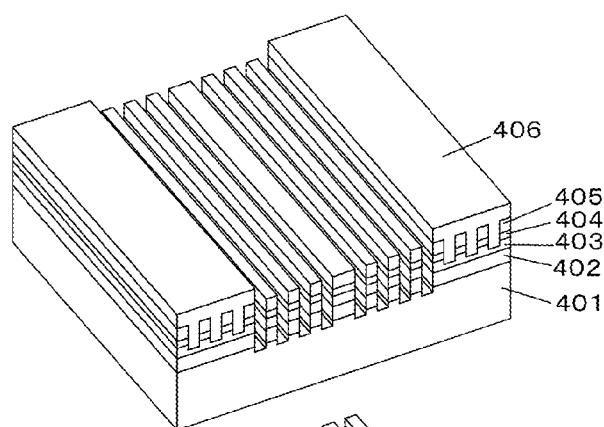
FIGS. 26A-26D are schematic perspective views illustrating a method for manufacturing one exemplary configuration of the optical device (DFB laser) according to the fourth embodiment.

Thereafter, as depicted in FIG. 26A, using the electron beam resist mask 405, which is exposed to the surface again, and the positive photoresist mask 406, the remained portion of the n-type InP layer 403, the n-type GaInAsP layer 402, and a portion of the n-type InP substrate 401 are removed by a reactive ion etching (RIE) using a mixed gas of ethane and hydrogen, for example.

In this example, the etching is stopped at some midpoint of the n-type InP substrate 401 (at an etch depth of about 10 nm, in this example) after the n-type InP layer 403 and the n-type GaInAsP layer 402 are divided.

As a result, the diffraction grating pattern is transferred to a portion of the n-type GaInAsP layer 402 (the center portion of the cavity; the center region in the direction along the optical waveguide, in this example), and the n-type GaInAsP layer 402 is divided.

in this case, since the diffraction grating pattern provided in the n-type GaInAsP layer 404 and the diffraction grating pattern provided in the n-type GaInAsP layer 402 are formed using the same mask 405, a first diffraction grating layer 22 and a second diffraction grating layer 32, which are to be formed as will be described later, will have substantially the same phase, period, and duty ratio of diffraction gratings 22A and 32A, which are to be provided in the overlap region.

Note that, in this example, the thickness and the refractive index of the n-type GaInAsP layer 402 (the thickness of and the refractive index difference in the first diffraction grating layer 22) are different from the thickness and the refractive index of the n-type GaInAsP layer 404 (the thickness of and the refractive index difference in the second diffraction grating layer 32). As a result, the coupling coefficient of the diffraction grating 22A provided in the first diffraction grating layer 22 is made different from the coupling coefficient of the diffraction grating 32A provided in the second diffraction grating layer 32.

Each of the diffraction grating layers 22 and 32 has a constant duty ratio within the layer. In this case, since the width of the diffraction grating pattern of the etching mask (mask pattern) does not require any modification, the processing precision of the diffraction grating is stabilized. Since each of the diffraction grating layers 22 and 32 has a constant thickness and refractive index difference within the layer, the coupling coefficient of the diffraction grating within the layer is constant.

Figure 26B:
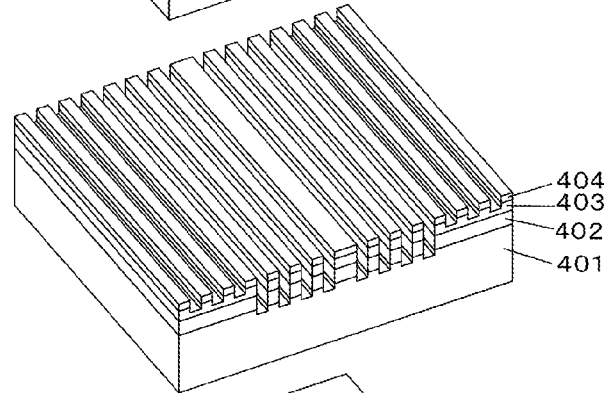

As depicted in FIG. 26B, the mask 405 and the mask 406 are removed from the surface using a conventional resist removal technique.

Figure 26C:
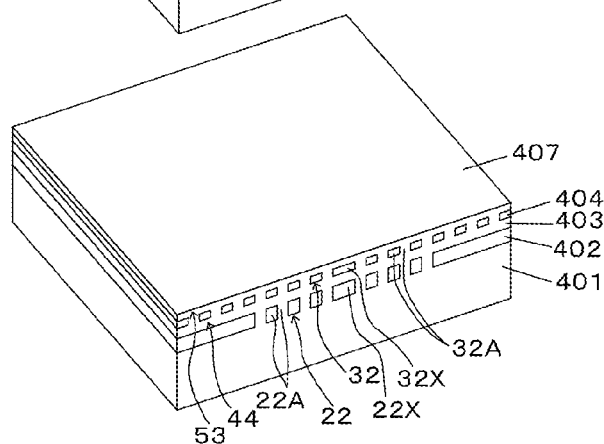

Subsequently, as depicted in FIG. 26C, an n-doped InP layer (a layer having substantially the same refractive index as that of the substrate 401; second semiconductor layer) 407 is grown over the entire surface, using MOVPE, for example. The grooves formed by stopping the etching at some midpoint of the n-type InP layer 403 and the grooves formed by stopping the etching at some midpoint of the n-type InP substrate 401 are buried with the n-type InP layer (burying layer) 407.

As a result, the discontinuous n-type GaInAsP layer 402 is buried with the n-type InP layer 407, thereby the first diffraction grating layer 22 is formed, a portion (the center portion of the cavity; the center region in the direction along the optical waveguide, in this example) of which is provided with the diffraction grating 22A. In addition, the discontinuous n-type GaInAsP layer 404 is buried with the n-type InP layer 407, thereby the second diffraction grating layer 32 is formed, the entirety (the entire length along the optical waveguide) of which is provided with the diffraction grating 32A.

Furthermore, the spacer layer (intermediate layer) 44 is formed between the first diffraction grating layer 22 and the second diffraction grating layer 32 by portions of the n-type InP layer 403 and the n-type InP layer 407. In addition, the spacer layer (cladding layer) 53 is formed over the second diffraction grating layer 32 by a portion of the n-type InP layer 407.

Figure 26D:
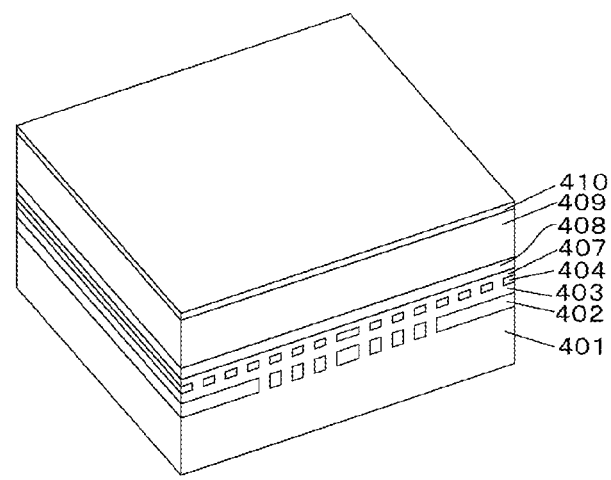

Next, as depicted in FIG. 26D, a quantum well active layer 408, a p-type doped InP cladding layer (e.g., with a thickness of about 2.5 μm) 409, and a p-type GaInAs contact layer (e.g., with a thickness of about 300 nm) 410 are staked sequentially by MOVPE, for example.

In this example, the quantum well active layer 408 is made using a GaInAsP-based compound semiconductor material. In other words, the quantum well active layer 408 includes an undoped GaInAsP quantum well layer [e.g., with a thickness of about 5.1 nm, a compressive strain amount of about 1.0%, and a composition wavelength of about 1.55 μm ($Ga_{0.266}In_{0.734}As_{0.882}P_{0.118}$ layer)], and an undoped GaInAsP barrier layer (e.g., with a composition wavelength of about 1.2 μm ($Ga_{0.217}In_{0.783}As_{0.472}P_{0.528}$ layer) and a thickness of about 10 nm], the layer number of the quantum well layer being six, and the light emission wavelength thereof being about 1550 nm.

Note that undoped GaInAsP-separate confinement heterostructure (SCH) layers (optical guide layers; e.g., with a wavelength of about 1.15 μm and a thickness of about 20 nm) may be provided over and under the quantum well active layer 408, sandwiching the quantum well active layer 408.

Thereafter, as depicted in FIG. 27A, a mask (e.g., a stripe shape etching mask having a thickness of about 400 nm) 411 made from $SiO_2$ may be formed over the semiconductor surface using a conventional chemical vapor deposition (CVD) and photolithography. Here, the stripe shape etching mask 411 has a width $W_1$ of about 1.5 μm in the closer end regions and a width $W_2$ of about 1.6 μm in the center region.

As depicted in FIG. 27B, the resultant semiconductor stack structure is etched such that the n-type InP substrate 401 is etched by about 0.7 μm, for example, using dry etching, for example, to form a stripe shape mesa structure (mesa stripes).

More specifically, the resultant semiconductor stack structure is etched into a mesa stripe shape, such that the region (center region) including a portion of the n-type GaInAsP layer 402 to which the diffraction grating pattern defining the first diffraction grating layer 22 is transferred, and the region (closer end regions) including a portion of the n-type GaInAsP layer 402 to which the diffraction grating pattern is not transferred have different widths.

As a result, a mesa structure is formed wherein the first region (center region) including the optical waveguide 1 and the diffraction grating 22A provided in the first diffraction grating layer 22 has a width $W_2$ of about 1.6 μm, whereas the second region (closer end regions) including the optical waveguide 1 and the first semiconductor layer 402 continuous with the diffraction grating 22A has a width $W_1$ of about 1.5 μm.

Figure 27C:
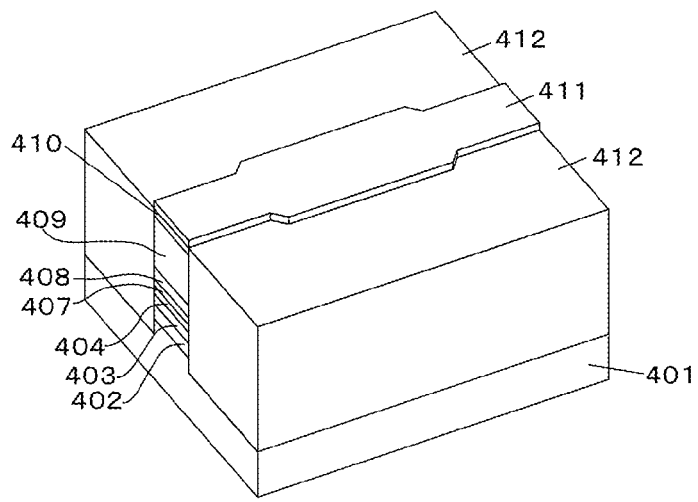

Next, as depicted in FIG. 27C, a current blocking layers 412 made from an Fe-doped InP are grown on opposite sides of the mesa structure using MOVPE, for example.

Figure 28A:
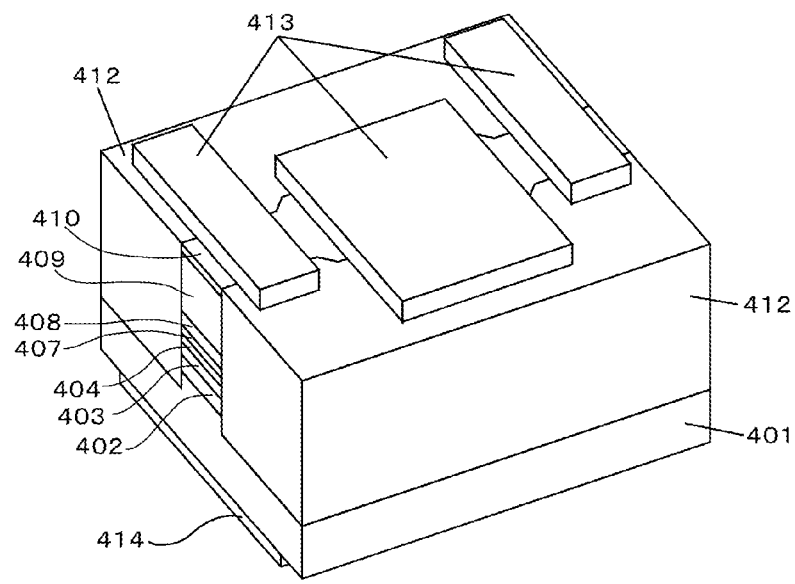
FIGS. 28A and 28B are schematic perspective views illustrating a method for manufacturing one exemplary configuration of the optical device (DFB laser) according to the fourth embodiment.
Figure 28B:
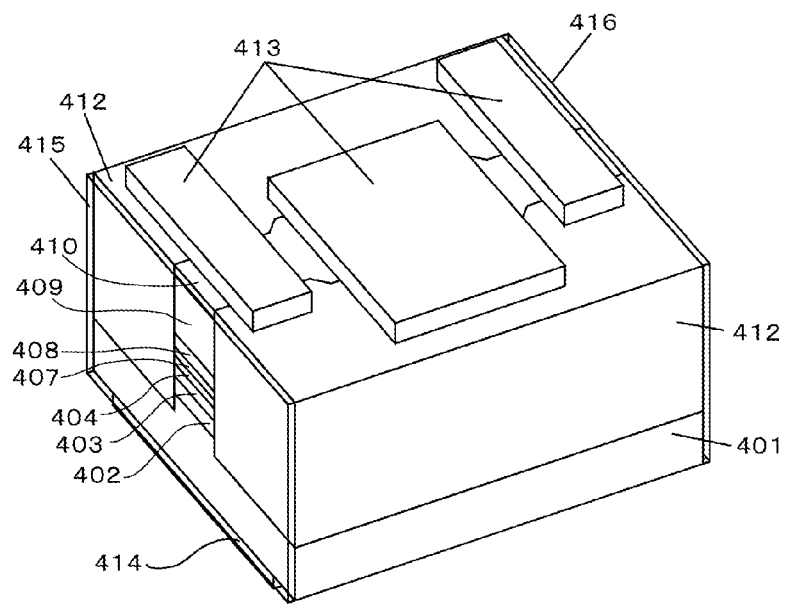

Then, after removing the etch mask 410 with hydrofluoric acid, for example, p-side electrodes 413 and n-side electrodes 414 are formed, as depicted in FIG. 28A. Thereafter, as depicted in FIG. 28B, anti-reflection coatings 415 and 416 are formed on the both end face sides of the device, thereby obtaining a completed device.

The details of other structures and steps in the fabrication method are similar to those in the above-described first embodiment, and descriptions thereof will be omitted.

Thus, according to the optical device (DFB laser) and the method for manufacturing the same of this embodiment, similar to the above-described first embodiment, in the optical device having a structure wherein the coupling coefficient of the diffraction grating is varied within the cavity, the diffraction grating can be precisely and stably fabricated, thereby improving the yield. In addition, the difference in the coupling coefficient can be increased between the increased and reduced coupling coefficient regions (the contrast of the coupling coefficient can be increased), thereby improving the device characteristics.

Furthermore, since diffraction gratings can be precisely and stably fabricated, any deviation in the device characteristics can be minimized, thereby improving the device characteristics. The controllability of the coupling coefficient and flexibility in designing the coupling coefficient are also improved.

Especially, according to the configuration of the above-described embodiment, since any of the refractive index difference between the first and second semiconductor layers defining each diffraction grating layer, the thickness of each diffraction grating layer, and each spacing between respective diffraction grating layers (thickness of the spacer layer) can be desirably set, a diffraction grating having coupling coefficient of a significantly wider range, ranging from several $cm^{-1}$ to several hundreds of $cm^{-1}$, for example, can be fabricated precisely. In this case, the range of coupling coefficient that can be designed is widened as the layer number of diffraction grating layers is increased.

in addition, in the manufacturing method of the above-described embodiment, portions of the lower diffraction grating layer of the plurality of diffraction grating layers are not provided with the diffraction grating. The range of coupling coefficient that can be designed is increased as more diffraction grating layers are disposed on the substrate side with respect to the optical waveguide.

Note that the DFB laser that are constructed as described above can also be used as an FM modulated light source, for example, by dividing the drive electrode into three parts along the direction of the cavity and modulating the injection current into the center electrode, as disclosed in S. Ogita et al., "FM Response of Narrow-Linewidth, Multielectrode $\lambda/4$ Shift DFB Laser", IEEE Photonics Technology Letters, vol. 2, no. 3, March 1990, pp. 165-166, the entire content of which is incorporated herein by reference, or Japanese Patent No. 2966485, the entire content of which is incorporated herein by reference.

Such a laser light source can be used, for example, for coherent optical transmission. Although improvement in the modulation efficiency requires increasing the range of the modulation current into the center electrode, excessive increase in the range of the modulation current may amplify the influence of the spatial hole burning along the cavity, impairing the stability of the single mode. Accordingly, for improving the efficiency in the FM modulation, the structure as described above, namely, the structure wherein the coupling coefficient is increased at the center of the cavity and the coupling coefficient is reduced at the ends as compared to the center can be used, as a structure to suppress any reduction in the gain difference between the main and side modes even when the spatial hole burning along the cavity is increased (see M. Ohashi et al., "Mode Analysis of DFB Laser Diode with Nonuniform Coupling Coefficients", Fall 1989, the Annual Meeting of the Japan Society of Applied Physics, 30p-ZG-13, the entire content of which is incorporated herein by reference).

According to this structure, the difference in the normalized threshold gain between the main and side modes in the longitudinal mode becomes about 1.7, which is about 2.4 times with respect to about 0.72 of a conventional $\lambda/4$ shifted DFB laser. Thus, unlike conventional laser, since the minimal normalized threshold gain difference of about 0.2, which is required for maintaining single mode operation, can be maintained even when the normalized threshold gain difference is reduced due to the influence of the spatial hole burning along the cavity during a high current injection (see H. Shoji et al., "Theoretical Analysis of $\lambda/4$ shifted DFB Lasers with Non-uniform-Depth Grating", Fall 1991, the Annual Meeting of the Japan Society of Applied Physics, 10p-ZM-17, the entire content of which is incorporated herein by reference), the efficiency in the FM modulation can be improved while maintaining a stable single longitudinal mode operation (see Y. Kotaki et al., "MQW-DFB Laser with Nonuniform-Depth Grating, Spring 1991, the Annual Meeting of the Japan Society of Applied Physics, 29p-D-7, the entire content of which is incorporated herein by reference).

in the DFB laser of the above-described embodiment, the difference in the normalized threshold gain between the main and side modes in the longitudinal mode of 1.7 is obtained, which is about 2.4 times with respect to about 0.72 of a conventional $\lambda/4$ shifted DFB laser, by designing such that the normalized coupling coefficient $\kappa L$ at the center region, where the diffraction grating is two layers, becomes about 5, the normalized coupling coefficient $\kappa L$ at the end regions, where the diffraction grating is a single layer, becomes about 2, the ratio of the length of the end regions, where the diffraction grating is a single layer, to the entire cavity length becomes about 0.18. Accordingly, a further stable single longitudinal mode operation can be achieved.

In addition, according to the structure of the above-described embodiment, the average refractive index becomes substantially constant across the cavity length, and the first region (center region) including the optical waveguide 1 and the diffraction grating 22A provided in the first diffraction grating layer 22, and the second region (closer end regions) including the optical waveguide 1 and the first semiconductor layer 102 continuous with the diffraction grating 22A have substantially the same equivalent refractive index, and accordingly have substantially the same propagation constant. That is, a substantially constant equivalent refractive index is provided across the cavity length, and accordingly a substantially constant propagation constant is also provided. Thereby, a stable single longitudinal mode operation can be achieved in a device having an increased cavity length (e.g., a device having a cavity length of about 1200 μm or more), thereby improving the device characteristics.

[Others]

In the first, second, and third embodiments and their variants described above, in order to clarify the structure, the crystalline border between the third semiconductor layer that is deposited so as to be buried and is continuous and the first semiconductor layer to be divided is aligned with the border between the region to be divided during the etching process for forming the diffraction grating (region wherein a diffraction grating is to be formed) and the region not to be divided (region wherein no diffraction grating is to be formed). However, this is not limiting. In actual device fabrication processes, photolithography patterning for perfectly aligning the phase to a very fine period of the diffraction grating is not necessarily required, and any misalignment between the relative positions of the borders, in the order of several micrometers, does not have any effect on the device characteristics.

In addition, although, in the above-described embodiments and variations thereof, each diffraction grating layer has a constant duty ratio of the diffraction grating within the layer, this is not limiting.

Figure 29:
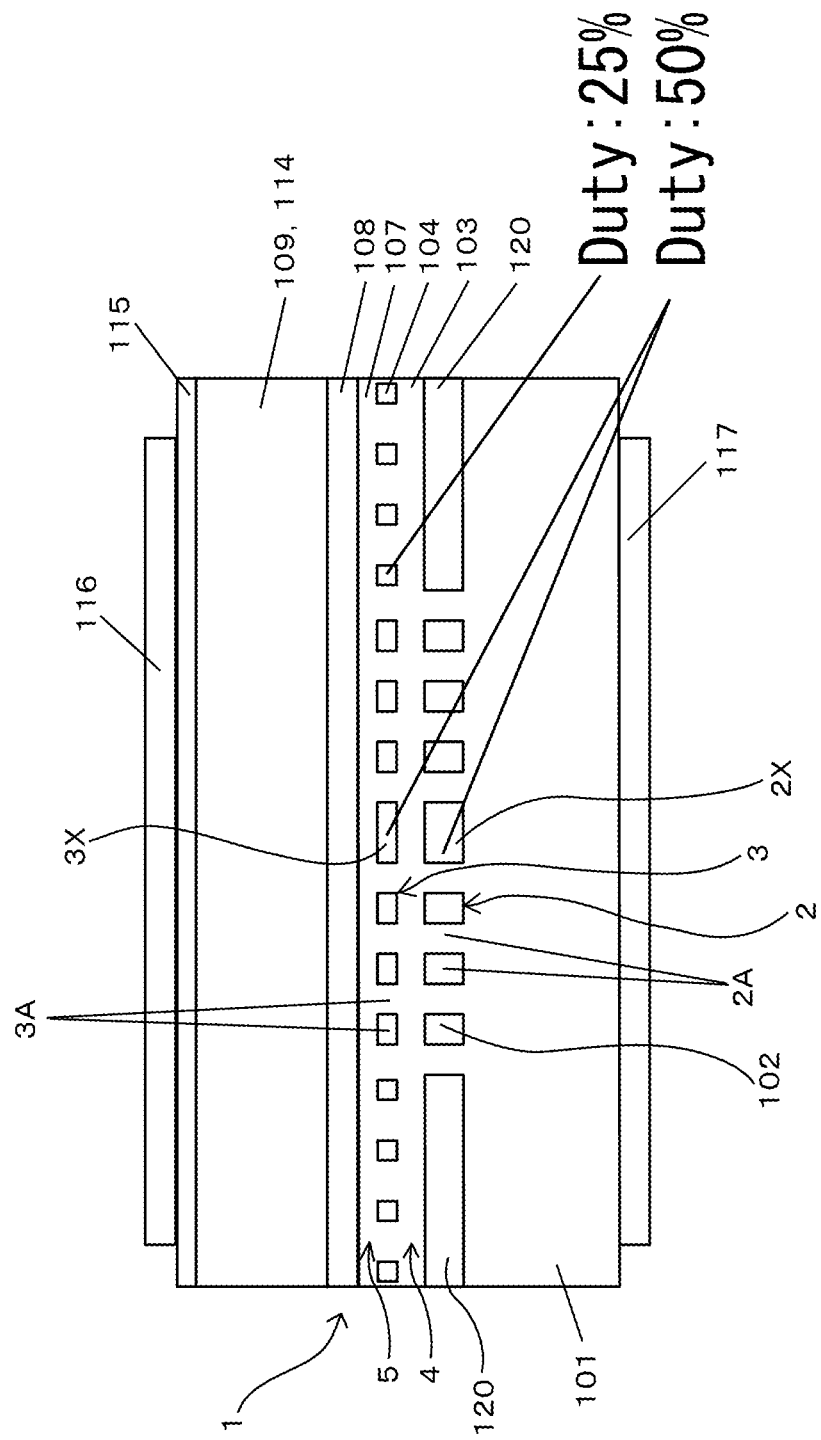
FIG. 29 is a diagram illustrating another exemplary structure of an optical device (DFB laser) according to the first embodiment.

For example, as depicted in FIG. 29, in the configuration of the above-described first embodiment, the second diffraction grating layer 3 may be configured such that the duty ratio (about 50%, in this example) of the diffraction grating 3A at the overlap region, which overlap with the region of the first diffraction grating layer 2 where the diffraction grating 2A is provided, may be different from the duty ratio (about 25%, in this example) of the diffraction grating 3A at the remaining regions (i.e., the end regions in the direction along the optical waveguide). In other words, one of a plurality of diffraction grating layers may be configured as a diffraction grating layer including a diffraction grating having portions with different duty ratios. Note that such a variation may also be applied to the above-described second and third embodiments.

In addition, for example, a plurality of diffraction grating layers have substantially the same duty ratio in the diffraction gratings provided in the overlap region, but the duty ratio of the diffraction grating in each diffraction grating layer may be varied within the layer, as long as the duty ratio is not too high or not too low.

As described above, a plurality of diffraction grating layers may have at least one diffraction grating layer including a diffraction grating having portions with different duty ratios.

In addition, in the above-described embodiments and variations thereof, the plurality of diffraction grating layers have substantially the same duty ratio in the diffraction gratings provided at the overlap region, this is not limiting. For example, the cross-section of a diffraction grating may be trapezoidal, rather than rectangular, when the diffraction grating is formed by etching, and the duty ratio of the diffraction grating provided in the overlap region may be varied accordingly. Even in such cases, the same advantageous effects as those of the above-described embodiments and variations thereof can be obtained, as long as the phase and period of the diffraction grating provided in the overlap region are substantially the same.

In addition, although the above-described embodiments and variations thereof have been described in the structures in which the coupling coefficient is increased toward the center of the cavity (first and second embodiments), or the coupling coefficient is decreased toward the center of the cavity (third embodiment), these are not limiting. Any structure wherein the coupling coefficient is varied (distributed) within the cavity may be used, and the structure can be flexibly provided according to the design of an optical device.

For example, the above-described embodiments and variations thereof have been described in the structure in which the coupling coefficient profile is symmetric with respect to the center of the cavity along the direction of the cavity. However, the coupling coefficient profile may be asymmetric with respect to the center of the cavity along the direction of the cavity. For example, a structure wherein the coupling coefficient is increased at the front end face side of the laser so as to enhance the returning light resistance, or a structure wherein the coupling coefficient is reduced at the front end face side of the laser so as to increase the optical output and so forth can be adopted.

In addition, the above-described embodiments and variations thereof have been described in the structure in which the plurality of diffraction grating layers are provided under the optical waveguide (the substrate side with respect to the optical waveguide), this is not limiting. For example, the diffraction grating layers are provided over the optical waveguide (the side opposite to the substrate with respect to the optical waveguide), and the same advantageous effects as those of the above-described embodiments can be obtained in this case.

In addition, the above-described embodiments and variations thereof have been described in the structure in which only a single phase shift with phase $\pi$ is present at the center of the cavity, this is not limiting. For example, a structure without phase shift, or a structure with a plurality of phase shifts may be possible, and the shift amount of one or more phase shifts may be arbitrary set.

Furthermore, the above-described embodiments and variations thereof have been described in the structure in which quantum well active layers using a GaInAsP-based compound semiconductor material (first and third embodiments) or an AlGaInAs-based compound semiconductor material (second embodiment) are formed over an n-type InP substrate to construct a DFB laser, these are not limiting. The present invention can be applied to a wide range of devices (optical devices) having a diffraction grating in the vicinity of an optical waveguide.

For example, quantum well active layers may be formed using an AlGaInAs-based compound semiconductor material in the configuration of the first or third embodiment, or quantum well active layers may be formed using a GaInAsP-based compound semiconductor material in the configuration of second embodiment. In addition, quantum well active layers may be formed using other compound semiconductor materials, such as a GaInNAs-based compound semiconductor material. In this case, the same advantageous effects as those of the above-described embodiments can be obtained.

In addition, any materials that can be used for optical devices (semiconductor lasers) may be used for devices, for example. For example, other compound semiconductor materials may be used. In addition to semiconductor materials, organic or inorganic materials may also be used. In this case, the same advantageous effects as those of the above-described embodiments can be obtained.

In addition, any substrates may be used, such as substrates having p-type conductivity or semi-insulating substrates. When such a substrate is used, the conductivity of every layer formed over the substrate is inversed. In this case, the same advantageous effects as those of the above-described embodiments can be obtained.

In addition, a GaAs substrate may be used, and each layer may be formed from any semiconductor material that can be crystal grown (e.g., epitaxially grown) on the GaAs substrate. In this case, the same advantageous effects as those of the above-described embodiments can be obtained.

Furthermore, the layers may be formed over a silicon substrate using the bonding technique. In this case, the same advantageous effects as those of the above-described embodiments can be obtained.

In addition, other active layer structures may be used, such as bulk active layers using a bulk semiconductor material or quantum dot active layers. In this case, the same advantageous effects as those of the above-described embodiments can be obtained.

In addition, a pn-buried structure or an SI-BH structure is adapted as a waveguide structure in the above-described embodiments and variations thereof, this is not limiting. For example, other buried structures may be used, and a ridge waveguide structure and the like may be used.

In addition, the present invention may be applied to other semiconductor lasers, such as a distributed Bragg reflector (DBR) laser or a distributed reflector (DR) laser. Furthermore, in addition to active optical devices, such as semiconductor lasers, the present invention may also be applied to passive optical devices, such as optical filters. In these cases, the same advantageous effects as those of the above-described embodiments can be obtained In addition, the above-described embodiments and variations thereof have been described in the structure in which anti-reflection coatings are provided on the end faces, this is not limiting. Any combination of end face structures, such as anti-reflection, cleaved facets, and/or high-reflection structures may be used.

In addition, although the structure having a single p-side current injecting electrode is illustrated in the first, second, third embodiments and their variants described above, this is not limiting. For example, a structure having divided electrodes may be possible, as in the fourth embodiment, for example, for allowing for wavelength tuning or FM modulation operations.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment has been described in detail, it should be understood that the various changes, substitutions, and alterations could be made hereto without departing from the spirit and scope of the invention.

What is claimed is:

1. An optical device comprising:
   an optical waveguide; and
   a plurality of diffraction grating layers, provided along the optical waveguide, each comprising a diffraction grating defined by a discontinuous first semiconductor layer and a second semiconductor layer having a refractive index different from a refractive index of the first semiconductor layer and burying the first semiconductor layer, one diffraction grating layer of the plurality of diffraction grating layers comprising a third semiconductor layer being continuous with the diffraction grating and made from a material different from materials of the first and the second semiconductor layers.

2. The optical device according to claim 1, wherein the third semiconductor layer has a refractive index lower than a refractive index of the first semiconductor layer and higher than a refractive index of the second semiconductor layer.

3. The optical device according to claim 1, wherein the third semiconductor layer is made from the material having a different composition from the material of the first semiconductor layer.

4. The optical device according to claim 1, further comprising:
a first region comprising the optical waveguide and the diffraction grating included in the one diffraction grating layer;
a second region comprising the optical waveguide and the third semiconductor layer,
wherein an equivalent refractive index of the first region and an equivalent refractive index of the second region are substantially matched.

5. An optical device comprising:
an optical waveguide;
a plurality of diffraction grating layers, provided along the optical waveguide, each comprising a diffraction grating defined by a discontinuous first semiconductor layer and a second semiconductor layer having a refractive index different from a refractive index of the first semiconductor layer and burying the first semiconductor layer, one diffraction grating layer of the plurality of diffraction grating layers comprising the first semiconductor layer extending being continuous with the diffraction grating;
a first region comprising the optical waveguide and the diffraction grating included in the one diffraction grating layer; and
a second region comprising the optical waveguide and the first semiconductor layer being continuous with the diffraction grating,
wherein the first region and the second region have different widths.

6. The optical device according to claim 1, wherein the plurality of diffraction grating layers comprise at least two diffraction grating layers being different from each other in terms of the length of a region where the diffraction grating is provided, and the diffraction gratings in an overlap region of the plurality of diffraction grating layers have substantially the same phase and period.

7. The optical device according to claim 6, wherein the diffraction gratings in the overlap region of the plurality of diffraction grating layers have substantially the same duty ratio.

8. The optical device according to claim 6, wherein the overlap region of the plurality of diffraction grating layers is located at a center region in the direction along the optical waveguide, or at end regions in the direction along the optical waveguide.

9. The optical device according to claim 1, wherein the plurality of diffraction grating layers comprise at least one diffraction grating layer comprising the diffraction grating having portions with different duty ratios.

10. The optical device according to claim 1, wherein the plurality of diffraction grating layers have substantially the same thickness.

11. The optical device according to claim 1, wherein the plurality of diffraction grating layers comprise diffraction grating layers having different thicknesses.

12. The optical device according to claim 1, wherein the plurality of diffraction grating layers have different thicknesses.

13. The optical device according to claim 1, wherein the plurality of diffraction grating layers have substantially the same refractive index difference between the first and second semiconductor layers.

14. The optical device according to claim 1, wherein the plurality of diffraction grating layers includes diffraction grating layers having different refractive index differences between the first and second semiconductor layers.

15. The optical device according to claim 1, wherein the plurality of diffraction grating layers have different refractive index differences between the first and second semiconductor layers.

16. The optical device according to claim 1, wherein the plurality of diffraction grating layers are spaced apart with substantially the same distance.

17. The optical device according to claim 1, wherein a part of the plurality of diffraction grating layers are spaced apart with different distances.

18. The optical device according to claim 1, wherein the plurality of diffraction grating layers are spaced apart with different distances.

19. A method for manufacturing an optical device, comprising:
stacking a first layer and a different layer, the different layer being continuous with the first layer and made from a material different from a material of the first layer, and a second layer, sequentially, over a substrate;
forming one mask having a diffraction grating pattern over a surface;
transferring the diffraction grating pattern to the second layer by etching using the one mask,
forming another mask so as to cover a surface of a partial region of the one mask;
transferring the diffraction grating pattern to the first layer by etching using the one and the other masks,
removing the one and the other masks; and
forming a plurality of diffraction grating layers by burying with a buried layer.

20. A method for manufacturing an optical device, comprising:
stacking a first layer and a second layer sequentially over a substrate;
forming one mask having a diffraction grating pattern over a surface;
transferring the diffraction grating pattern to the second layer by etching using the one mask,
forming another mask so as to cover a surface of a partial region of the one mask;
transferring the diffraction grating pattern to the first layer by etching using the one and the other masks,
removing the one and the other masks;
forming a plurality of diffraction grating layers by burying with a buried layer; and
etching to form a mesa stripe shape such that a region of the first layer including a portion to which the diffraction grating pattern is transferred and a remaining region of the first layer including a portion to which the diffraction grating pattern is not transferred has different widths.

* * * * *